US 8,370,791 B2
Feb. 5, 2013

(12) United States Patent
Ogami et al.

(10) Patent No.: US 8,370,791 B2
(45) Date of Patent: Feb. 5, 2013

(54) SYSTEM AND METHOD FOR PERFORMING NEXT PLACEMENTS AND PRUNING OF DISALLOWED PLACEMENTS FOR PROGRAMMING AN INTEGRATED CIRCUIT

(75) Inventors: Kenneth Y. Ogami, Bothell, WA (US); Frederick R. Hood, Aubrun, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 364 days.

(21) Appl. No.: 12/132,527

(22) Filed: Jun. 3, 2008

(65) Prior Publication Data

US 2008/0301619 A1    Dec. 4, 2008

Related U.S. Application Data

(63) Continuation of application No. 09/989,762, filed on Nov. 19, 2001.

(51) Int. Cl.
*G06F 17/50* (2006.01)
(52) U.S. Cl. ...................................................... 716/139
(58) Field of Classification Search .................... 716/17, 716/139
See application file for complete search history.

(56) References Cited

U.S. PATENT DOCUMENTS

| | | |
|---|---|---|
| 3,600,690 A | 8/1971 | Graham |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedom |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |

(Continued)

FOREIGN PATENT DOCUMENTS

| | | |
|---|---|---|
| DE | 19710829 A1 | 9/1998 |
| EP | 0308583 A2 | 3/1989 |

(Continued)

OTHER PUBLICATIONS

PSoc Designer: Integrated Development Environment, May 30, 2001: Cypress Microsystems, Inc.

(Continued)

*Primary Examiner* — Jack Chiang
*Assistant Examiner* — Brandon Bowers

(57) ABSTRACT

A system and method for graphically displaying modules and resources within a chip design software application. The system and method provide a data driven model for matching the hardware resource requirements for an associated user module and the available hardware resources on an underlying chip. Databases are utilized to describe the hardware resource requirements which are dictated by the particular user module and the available hardware resources of a particular chip. The user module descriptive database can be updated in response to additional user modules being added or changes to the hardware resource requirements of existing user modules. The hardware description database can be updated in response to additional chips being added. Further, the graphical interface relates both a user module and the possible hardware resource. This graphical interface utilizes highlights of both the module and the associated resource in patterns, grayscales, or colors to graphically illustrate the relationship between the module and the associated resource.

20 Claims, 11 Drawing Sheets

U.S. PATENT DOCUMENTS

| | | |
|---|---|---|
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,604,363 A | 8/1986 | Newhouse et al. |
| 4,608,502 A | 8/1986 | Dijkmans et al. |
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,807,183 A | 2/1989 | Kung et al. |
| 4,809,345 A | 2/1989 | Tabata et al. |
| 4,812,664 A | 3/1989 | Borden |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,896,272 A * | 1/1990 | Kurosawa .................... 716/8 |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,099,191 A | 3/1992 | Galler et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada, Jr. et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,184,061 A | 2/1993 | Lee et al. |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,212,653 A * | 5/1993 | Tanaka ........................ 716/8 |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerpheide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Del Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten et al. |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Herczeg et al. |
| 5,371,860 A | 12/1994 | Mura et al. |
| 5,371,878 A | 12/1994 | Coker |
| 5,371,883 A | 12/1994 | Gross et al. |
| 5,374,787 A | 12/1994 | Miller et al. |
| 5,377,333 A | 12/1994 | Nakagoshi et al. |
| 5,378,935 A | 1/1995 | Korhonen et al. |
| 5,381,515 A | 1/1995 | Platt et al. |
| 5,381,524 A | 1/1995 | Lewis et al. |
| 5,384,467 A | 1/1995 | Plimon et al. |
| 5,384,745 A | 1/1995 | Konishi et al. |
| 5,384,910 A | 1/1995 | Torres |
| 5,390,173 A | 2/1995 | Spinney et al. |
| 5,392,784 A | 2/1995 | Gudaitis |
| 5,394,522 A | 2/1995 | Sanchez-Frank et al. |
| 5,396,245 A | 3/1995 | Rempfer |

| | | | | | |
|---|---|---|---|---|---|
| 5,398,261 A | 3/1995 | Marbot | 5,594,734 A | 1/1997 | Worsley et al. |
| 5,399,922 A | 3/1995 | Kiani et al. | 5,594,876 A | 1/1997 | Getzlaff et al. |
| 5,408,194 A | 4/1995 | Steinbach et al. | 5,594,890 A | 1/1997 | Yamaura et al. |
| 5,414,308 A | 5/1995 | Lee et al. | 5,600,262 A | 2/1997 | Kolze |
| 5,414,380 A | 5/1995 | Floyd et al. | 5,604,466 A | 2/1997 | Dreps et al. |
| 5,416,895 A | 5/1995 | Anderson et al. | 5,608,892 A | 3/1997 | Wakerly |
| 5,422,823 A | 6/1995 | Agrawal et al. | 5,614,861 A | 3/1997 | Harada |
| 5,424,689 A | 6/1995 | Gillig et al. | 5,625,316 A | 4/1997 | Chambers et al. |
| 5,426,378 A | 6/1995 | Ong | 5,629,857 A | 5/1997 | Brennan |
| 5,426,384 A | 6/1995 | May | 5,629,891 A | 5/1997 | LeMoncheck et al. |
| 5,428,319 A | 6/1995 | Marvin et al. | 5,630,052 A | 5/1997 | Shah |
| 5,430,395 A | 7/1995 | Ichimaru | 5,630,057 A | 5/1997 | Hait |
| 5,430,687 A | 7/1995 | Hung et al. | 5,630,102 A | 5/1997 | Johnson et al. |
| 5,430,734 A | 7/1995 | Gilson | 5,631,577 A | 5/1997 | Freidin et al. |
| 5,432,476 A | 7/1995 | Tran | 5,633,766 A | 5/1997 | Hase et al. |
| 5,438,672 A | 8/1995 | Dey | 5,642,295 A | 6/1997 | Smayling |
| 5,440,305 A | 8/1995 | Signore et al. | 5,646,544 A | 7/1997 | Iadanza |
| 5,451,887 A | 9/1995 | El Ayat et al. | 5,646,901 A | 7/1997 | Sharpe-Geisler et al. |
| 5,453,904 A | 9/1995 | Higashiyama et al. | 5,648,642 A | 7/1997 | Miller et al. |
| 5,455,525 A | 10/1995 | Ho et al. | 5,651,035 A | 7/1997 | Tozun et al. |
| 5,455,731 A | 10/1995 | Parkinson | 5,663,900 A | 9/1997 | Bhandari et al. |
| 5,455,927 A | 10/1995 | Huang | 5,663,965 A | 9/1997 | Seymour |
| 5,457,410 A | 10/1995 | Ting | 5,664,199 A | 9/1997 | Kuwahara |
| 5,457,479 A | 10/1995 | Cheng | 5,666,289 A * | 9/1997 | Watkins ........................ 716/8 |
| 5,463,591 A | 10/1995 | Aimoto et al. | 5,666,480 A | 9/1997 | Leung et al. |
| 5,479,603 A | 12/1995 | Stone et al. | 5,670,915 A | 9/1997 | Cooper et al. |
| 5,479,643 A | 12/1995 | Bhaskar et al. | 5,673,198 A | 9/1997 | Lawman et al. |
| 5,479,652 A | 12/1995 | Dreyer et al. | 5,675,825 A | 10/1997 | Dreyer et al. |
| 5,481,471 A | 1/1996 | Naglestad et al. | 5,677,691 A | 10/1997 | Hosticka et al. |
| 5,488,204 A | 1/1996 | Mead et al. | 5,680,070 A | 10/1997 | Anderson et al. |
| 5,491,458 A | 2/1996 | McCune, Jr. et al. | 5,682,032 A | 10/1997 | Philipp |
| 5,493,246 A | 2/1996 | Anderson | 5,684,434 A | 11/1997 | Mann et al. |
| 5,493,723 A | 2/1996 | Beck et al. | 5,684,952 A | 11/1997 | Stein |
| 5,495,077 A | 2/1996 | Miller et al. | 5,686,844 A | 11/1997 | Hull et al. |
| 5,495,593 A | 2/1996 | Elmer et al. | 5,687,325 A | 11/1997 | Chang |
| 5,495,594 A | 2/1996 | MacKenna et al. | 5,689,195 A | 11/1997 | Cliff et al. |
| 5,497,119 A | 3/1996 | Tedrow et al. | 5,689,196 A | 11/1997 | Schutte |
| 5,499,192 A | 3/1996 | Knapp et al. | 5,691,664 A | 11/1997 | Anderson et al. |
| 5,500,823 A | 3/1996 | Martin et al. | 5,691,898 A | 11/1997 | Rosenberg et al. |
| 5,517,198 A | 5/1996 | McEwan | 5,694,063 A | 12/1997 | Burlison et al. |
| 5,519,854 A | 5/1996 | Watt | 5,696,952 A | 12/1997 | Pontarelli |
| 5,521,529 A | 5/1996 | Agrawal et al. | 5,699,024 A | 12/1997 | Manlove et al. |
| 5,530,444 A | 6/1996 | Tice et al. | 5,703,871 A | 12/1997 | Pope et al. |
| 5,530,673 A | 6/1996 | Tobita et al. | 5,706,453 A | 1/1998 | Cheng et al. |
| 5,530,813 A | 6/1996 | Paulsen et al. | 5,708,589 A | 1/1998 | Beauvais |
| 5,537,057 A | 7/1996 | Leong et al. | 5,708,798 A | 1/1998 | Lynch et al. |
| 5,541,878 A | 7/1996 | LeMoncheck et al. | 5,710,906 A | 1/1998 | Ghosh et al. |
| 5,542,055 A | 7/1996 | Amini et al. | 5,712,969 A | 1/1998 | Zimmermann et al. |
| 5,543,588 A | 8/1996 | Bisset et al. | 5,721,931 A | 2/1998 | Gephardt et al. |
| 5,543,590 A | 8/1996 | Gillespie et al. | 5,724,009 A | 3/1998 | Collins et al. |
| 5,543,591 A | 8/1996 | Gillespie et al. | 5,727,170 A | 3/1998 | Mitchell et al. |
| 5,544,067 A | 8/1996 | Rostoker et al. | 5,729,704 A | 3/1998 | Stone et al. |
| 5,544,311 A | 8/1996 | Harenberg et al. | 5,730,165 A | 3/1998 | Philipp |
| 5,546,433 A | 8/1996 | Tran et al. | 5,732,277 A | 3/1998 | Kodosky et al. |
| 5,546,562 A | 8/1996 | Patel | 5,734,272 A | 3/1998 | Belot et al. |
| 5,552,725 A | 9/1996 | Ray et al. | 5,734,334 A | 3/1998 | Hsieh et al. |
| 5,552,748 A | 9/1996 | O'Shaughnessy | 5,737,557 A | 4/1998 | Sullivan |
| 5,554,951 A | 9/1996 | Gough | 5,737,760 A | 4/1998 | Grimmer et al. |
| 5,555,452 A | 9/1996 | Callaway et al. | 5,745,011 A | 4/1998 | Scott |
| 5,555,907 A | 9/1996 | Philipp | 5,748,048 A | 5/1998 | Moyal |
| 5,557,762 A | 9/1996 | Okuaki et al. | 5,748,875 A | 5/1998 | Tzori |
| 5,559,502 A | 9/1996 | Schutte | 5,752,013 A | 5/1998 | Christensen et al. |
| 5,559,996 A | 9/1996 | Fujioka | 5,754,552 A | 5/1998 | Allmond et al. |
| 5,563,526 A | 10/1996 | Hastings et al. | 5,754,826 A | 5/1998 | Gamal et al. |
| 5,563,529 A | 10/1996 | Seltzer et al. | 5,757,368 A | 5/1998 | Gerpheide et al. |
| 5,564,010 A | 10/1996 | Henry et al. | 5,758,058 A | 5/1998 | Milburn |
| 5,564,108 A | 10/1996 | Hunsaker et al. | 5,761,128 A | 6/1998 | Watanabe |
| 5,565,658 A | 10/1996 | Gerpheide et al. | 5,763,909 A | 6/1998 | Mead et al. |
| 5,566,702 A | 10/1996 | Philipp | 5,764,714 A | 6/1998 | Stansell et al. |
| 5,572,665 A | 11/1996 | Nakabayashi | 5,767,457 A | 6/1998 | Gerpheide et al. |
| 5,572,719 A | 11/1996 | Biesterfeldt | 5,774,704 A | 6/1998 | Williams |
| 5,574,678 A | 11/1996 | Gorecki | 5,777,399 A | 7/1998 | Shibuya |
| 5,574,852 A | 11/1996 | Bakker et al. | 5,781,030 A | 7/1998 | Agrawal et al. |
| 5,574,892 A | 11/1996 | Christensen | 5,781,747 A | 7/1998 | Smith et al. |
| 5,579,353 A | 11/1996 | Parmenter et al. | 5,784,545 A | 7/1998 | Anderson et al. |
| 5,587,945 A | 12/1996 | Lin et al. | 5,790,957 A | 8/1998 | Heidari |
| 5,587,957 A | 12/1996 | Kowalczyk et al. | 5,796,183 A | 8/1998 | Hourmand et al. |
| 5,590,354 A | 12/1996 | Klapproth et al. | 5,799,176 A | 8/1998 | Kapusta et al. |
| 5,594,388 A | 1/1997 | O'Shaughnessy et al. | 5,802,073 A | 9/1998 | Platt |

| | | | | | | |
|---|---|---|---|---|---|---|
| 5,802,290 A | 9/1998 | Casselman | | 5,943,052 A | 8/1999 | Allen et al. |
| 5,805,792 A | 9/1998 | Swoboda et al. | | 5,945,878 A | 8/1999 | Westwick et al. |
| 5,805,897 A | 9/1998 | Glowny | | 5,949,632 A | 9/1999 | Barreras, Sr. et al. |
| 5,808,883 A | 9/1998 | Hawkes | | 5,952,888 A | 9/1999 | Scott |
| 5,811,987 A | 9/1998 | Ashmore, Jr. et al. | | 5,956,279 A | 9/1999 | Mo et al. |
| 5,812,698 A | 9/1998 | Platt et al. | | 5,959,871 A | 9/1999 | Pierzchala et al. |
| 5,818,254 A | 10/1998 | Agrawal et al. | | 5,963,075 A | 10/1999 | Hiiragizawa |
| 5,818,444 A | 10/1998 | Alimpich et al. | | 5,963,105 A | 10/1999 | Nguyen |
| 5,819,028 A | 10/1998 | Manghirmalani et al. | | 5,963,503 A | 10/1999 | Lee |
| 5,822,387 A | 10/1998 | Mar | | 5,964,893 A | 10/1999 | Circello et al. |
| 5,822,531 A | 10/1998 | Gorczyca et al. | | 5,966,027 A | 10/1999 | Kapusta et al. |
| 5,828,693 A | 10/1998 | Mays et al. | | 5,966,532 A | 10/1999 | McDonald et al. |
| 5,838,583 A | 11/1998 | Varadarajan et al. | | 5,968,135 A | 10/1999 | Teramoto et al. |
| 5,841,078 A | 11/1998 | Miller et al. | | 5,969,513 A | 10/1999 | Clark |
| 5,841,996 A | 11/1998 | Nolan et al. | | 5,969,632 A | 10/1999 | Diamant et al. |
| 5,844,256 A | 12/1998 | Mead et al. | | 5,973,368 A | 10/1999 | Pearce et al. |
| 5,844,404 A | 12/1998 | Caser et al. | | 5,974,235 A | 10/1999 | Nunally et al. |
| 5,848,285 A | 12/1998 | Kapusta et al. | | 5,977,791 A | 11/1999 | Veenstra |
| 5,850,156 A | 12/1998 | Wittman | | 5,978,584 A | 11/1999 | Nishibata et al. |
| 5,852,733 A | 12/1998 | Chien et al. | | 5,978,937 A | 11/1999 | Miyamori et al. |
| 5,854,625 A | 12/1998 | Frisch et al. | | 5,982,105 A | 11/1999 | Masters |
| 5,857,109 A | 1/1999 | Taylor | | 5,982,229 A | 11/1999 | Wong et al. |
| 5,861,583 A | 1/1999 | Schediwy et al. | | 5,982,241 A | 11/1999 | Nguyen et al. |
| 5,861,875 A | 1/1999 | Gerpheide | | 5,983,277 A | 11/1999 | Heile et al. |
| 5,864,242 A | 1/1999 | Allen et al. | | 5,986,479 A | 11/1999 | Mohan |
| 5,864,392 A | 1/1999 | Winklhofer et al. | | 5,987,246 A | 11/1999 | Thomsen et al. |
| 5,867,046 A | 2/1999 | Sugasawa | | 5,988,902 A | 11/1999 | Holehan |
| 5,867,399 A | 2/1999 | Rostoker et al. | | 5,994,939 A | 11/1999 | Johnson et al. |
| 5,869,979 A | 2/1999 | Bocchino | | 5,996,032 A | 11/1999 | Baker |
| 5,870,004 A | 2/1999 | Lu | | 5,999,725 A | 12/1999 | Barbier et al. |
| 5,870,309 A | 2/1999 | Lawman | | 6,002,268 A | 12/1999 | Sasaki et al. |
| 5,870,345 A | 2/1999 | Stecker | | 6,002,398 A | 12/1999 | Wilson |
| 5,872,464 A | 2/1999 | Gradinariu | | 6,003,054 A | 12/1999 | Oshima et al. |
| 5,874,958 A | 2/1999 | Ludolph | | 6,003,107 A | 12/1999 | Ranson et al. |
| 5,875,293 A | 2/1999 | Bell et al. | | 6,003,133 A | 12/1999 | Moughanni et al. |
| 5,877,656 A | 3/1999 | Mann et al. | | 6,005,814 A | 12/1999 | Mulholland et al. |
| 5,878,425 A | 3/1999 | Redpath | | 6,005,904 A | 12/1999 | Knapp et al. |
| 5,880,411 A | 3/1999 | Gillespie et al. | | 6,008,685 A | 12/1999 | Kunst |
| 5,880,598 A | 3/1999 | Duong | | 6,008,703 A | 12/1999 | Perrott et al. |
| 5,883,623 A | 3/1999 | Cseri | | 6,009,270 A | 12/1999 | Mann |
| 5,886,582 A | 3/1999 | Stansell | | 6,009,496 A | 12/1999 | Tsai |
| 5,887,189 A | 3/1999 | Birns et al. | | 6,011,407 A | 1/2000 | New |
| 5,889,236 A | 3/1999 | Gillespie et al. | | 6,012,835 A | 1/2000 | Thompson et al. |
| 5,889,723 A | 3/1999 | Pascucci | | 6,014,135 A | 1/2000 | Fernandes |
| 5,889,936 A | 3/1999 | Chan | | 6,014,509 A | 1/2000 | Furtek et al. |
| 5,889,988 A | 3/1999 | Held | | 6,014,723 A | 1/2000 | Tremblay et al. |
| 5,894,226 A | 4/1999 | Koyama | | 6,016,554 A | 1/2000 | Skrovan et al. |
| 5,894,243 A | 4/1999 | Hwang | | 6,016,563 A | 1/2000 | Fleisher |
| 5,894,565 A | 4/1999 | Furtek et al. | | 6,018,559 A | 1/2000 | Azegami et al. |
| 5,895,494 A | 4/1999 | Scalzi et al. | | 6,023,422 A | 2/2000 | Allen et al. |
| 5,896,068 A | 4/1999 | Moyal | | 6,023,565 A | 2/2000 | Lawman et al. |
| 5,896,330 A | 4/1999 | Gibson | | 6,026,134 A | 2/2000 | Duffy et al. |
| 5,898,345 A | 4/1999 | Namura et al. | | 6,026,501 A | 2/2000 | Hohl et al. |
| 5,900,780 A | 5/1999 | Hirose et al. | | 6,028,271 A | 2/2000 | Gillespie et al. |
| 5,901,062 A | 5/1999 | Burch et al. | | 6,028,959 A | 2/2000 | Wang et al. |
| 5,903,718 A | 5/1999 | Marik | | 6,031,365 A | 2/2000 | Sharpe-Geisler |
| 5,905,398 A | 5/1999 | Todsen et al. | | 6,032,268 A | 2/2000 | Swoboda et al. |
| 5,909,544 A | 6/1999 | Anderson et al. | | 6,034,538 A | 3/2000 | Abramovici |
| 5,911,059 A | 6/1999 | Profit, Jr. | | 6,037,807 A | 3/2000 | Wu et al. |
| 5,914,465 A | 6/1999 | Allen et al. | | 6,038,551 A | 3/2000 | Barlow et al. |
| 5,914,633 A | 6/1999 | Comino et al. | | 6,041,406 A | 3/2000 | Mann |
| 5,914,708 A | 6/1999 | LaGrange et al. | | 6,043,695 A | 3/2000 | O'Sullivan |
| 5,917,356 A | 6/1999 | Casal et al. | | 6,043,719 A | 3/2000 | Lin et al. |
| 5,920,310 A | 7/1999 | Faggin et al. | | 6,049,223 A | 4/2000 | Lytle et al. |
| 5,923,264 A | 7/1999 | Lavelle et al. | | 6,049,225 A | 4/2000 | Huang et al. |
| 5,926,566 A | 7/1999 | Wang et al. | | 6,051,772 A | 4/2000 | Cameron et al. |
| 5,929,710 A | 7/1999 | Bien | | 6,052,035 A | 4/2000 | Nolan et al. |
| 5,930,148 A | 7/1999 | Bjorksten et al. | | 6,052,524 A | 4/2000 | Pauna |
| 5,930,150 A | 7/1999 | Cohen et al. | | 6,055,584 A | 4/2000 | Bridges et al. |
| 5,931,959 A | 8/1999 | Kwiat | | 6,057,705 A | 5/2000 | Wojewoda et al. |
| 5,933,023 A | 8/1999 | Young | | 6,058,263 A | 5/2000 | Voth |
| 5,933,356 A * | 8/1999 | Rostoker et al. .............. 703/15 | | 6,058,452 A | 5/2000 | Rangasayee et al. |
| 5,933,816 A | 8/1999 | Zeanah et al. | | 6,061,511 A | 5/2000 | Marantz et al. |
| 5,935,233 A | 8/1999 | Jeddeloh | | 6,066,961 A | 5/2000 | Lee et al. |
| 5,935,266 A | 8/1999 | Thurnhofer et al. | | 6,070,003 A | 5/2000 | Gove et al. |
| 5,939,904 A | 8/1999 | Fetterman et al. | | 6,072,803 A | 6/2000 | Allmond et al. |
| 5,939,949 A | 8/1999 | Olgaard et al. | | 6,075,941 A | 6/2000 | Itoh et al. |
| 5,941,991 A | 8/1999 | Kageshima | | 6,079,985 A | 6/2000 | Wohl et al. |
| 5,942,733 A | 8/1999 | Allen et al. | | 6,081,140 A | 6/2000 | King |

| Patent | Type | Date | Inventor |
|---|---|---|---|
| 6,094,730 | A | 7/2000 | Lopez et al. |
| 6,097,211 | A | 8/2000 | Couts-Martin et al. |
| 6,097,432 | A | 8/2000 | Mead et al. |
| 6,101,457 | A | 8/2000 | Barch et al. |
| 6,101,617 | A | 8/2000 | Burckhartt et al. |
| 6,104,217 | A | 8/2000 | Magana |
| 6,104,325 | A | 8/2000 | Liaw et al. |
| 6,107,769 | A | 8/2000 | Saylor et al. |
| 6,107,826 | A | 8/2000 | Young et al. |
| 6,107,882 | A | 8/2000 | Gabara et al. |
| 6,110,223 | A | 8/2000 | Southgate et al. |
| 6,111,431 | A | 8/2000 | Estrada |
| 6,112,264 | A | 8/2000 | Beasley et al. |
| 6,121,791 | A | 9/2000 | Abbott |
| 6,121,805 | A | 9/2000 | Thamsirianunt et al. |
| 6,121,965 | A | 9/2000 | Kenney et al. |
| 6,125,416 | A | 9/2000 | Warren |
| 6,130,548 | A | 10/2000 | Koifman |
| 6,130,551 | A | 10/2000 | Agrawal et al. |
| 6,130,552 | A | 10/2000 | Jefferson et al. |
| 6,133,773 | A | 10/2000 | Garlepp et al. |
| 6,134,181 | A | 10/2000 | Landry |
| 6,134,516 | A | 10/2000 | Wang et al. |
| 6,137,308 | A | 10/2000 | Nayak |
| 6,140,853 | A | 10/2000 | Lo |
| 6,141,376 | A | 10/2000 | Shaw |
| 6,141,764 | A | 10/2000 | Ezell |
| 6,144,327 | A | 11/2000 | Distinti et al. |
| 6,148,104 | A | 11/2000 | Wang et al. |
| 6,148,441 | A | 11/2000 | Woodward |
| 6,149,299 | A | 11/2000 | Aslan et al. |
| 6,150,866 | A | 11/2000 | Eto et al. |
| 6,154,064 | A | 11/2000 | Proebsting |
| 6,157,024 | A | 12/2000 | Chapdelaine et al. |
| 6,157,270 | A | 12/2000 | Tso |
| 6,161,199 | A | 12/2000 | Szeto et al. |
| 6,166,367 | A | 12/2000 | Cho |
| 6,166,960 | A | 12/2000 | Marneweck et al. |
| 6,167,077 | A | 12/2000 | Ducaroir et al. |
| 6,167,559 | A | 12/2000 | Furtek et al. |
| 6,169,383 | B1 | 1/2001 | Sabin et al. |
| 6,172,571 | B1 | 1/2001 | Moyal et al. |
| 6,173,419 | B1 | 1/2001 | Barnett |
| 6,175,914 | B1 | 1/2001 | Mann |
| 6,175,949 | B1 | 1/2001 | Gristede et al. |
| 6,181,163 | B1 | 1/2001 | Agrawal et al. |
| 6,183,131 | B1 | 2/2001 | Holloway et al. |
| 6,185,127 | B1 | 2/2001 | Myers et al. |
| 6,185,450 | B1 | 2/2001 | Seguine et al. |
| 6,185,522 | B1 | 2/2001 | Bakker |
| 6,185,703 | B1 | 2/2001 | Guddat et al. |
| 6,185,732 | B1 | 2/2001 | Mann et al. |
| 6,188,228 | B1 | 2/2001 | Philipp |
| 6,188,241 | B1 | 2/2001 | Gauthier et al. |
| 6,188,381 | B1 | 2/2001 | van der Wal et al. |
| 6,188,391 | B1 | 2/2001 | Seely et al. |
| 6,188,975 | B1 | 2/2001 | Gay |
| 6,191,603 | B1 | 2/2001 | Muradali et al. |
| 6,191,660 | B1 | 2/2001 | Mar et al. |
| 6,191,998 | B1 | 2/2001 | Reddy et al. |
| 6,192,431 | B1 | 2/2001 | Dabral et al. |
| 6,198,303 | B1 | 3/2001 | Rangasayee |
| 6,201,407 | B1 | 3/2001 | Kapusta et al. |
| 6,201,829 | B1 | 3/2001 | Schneider |
| 6,202,044 | B1 | 3/2001 | Tzori |
| 6,204,687 | B1 | 3/2001 | Schultz et al. |
| 6,205,574 | B1 | 3/2001 | Dellinger et al. |
| 6,208,572 | B1 | 3/2001 | Adams et al. |
| 6,211,708 | B1 | 4/2001 | Klemmer |
| 6,211,715 | B1 | 4/2001 | Terauchi |
| 6,211,741 | B1 | 4/2001 | Dalmia |
| 6,215,352 | B1 | 4/2001 | Sudo |
| 6,219,729 | B1 | 4/2001 | Keats et al. |
| 6,222,528 | B1 | 4/2001 | Gerpheide et al. |
| 6,223,144 | B1 | 4/2001 | Barnett et al. |
| 6,223,147 | B1 | 4/2001 | Bowers |
| 6,223,272 | B1 | 4/2001 | Coehlo et al. |
| RE37,195 | E | 5/2001 | Kean |
| 6,225,866 | B1 | 5/2001 | Kubota et al. |
| 6,236,242 | B1 | 5/2001 | Hedberg |
| 6,236,275 | B1 | 5/2001 | Dent |
| 6,236,278 | B1 | 5/2001 | Olgaard |
| 6,236,593 | B1 | 5/2001 | Hong et al. |
| 6,239,389 | B1 | 5/2001 | Allen et al. |
| 6,239,798 | B1 | 5/2001 | Ludolph et al. |
| 6,240,375 | B1 | 5/2001 | Sonoda |
| 6,246,258 | B1 | 6/2001 | Lesea |
| 6,246,410 | B1 | 6/2001 | Bergeron et al. |
| 6,249,167 | B1 | 6/2001 | Oguchi et al. |
| 6,249,447 | B1 | 6/2001 | Boylan et al. |
| 6,253,250 | B1 | 6/2001 | Evans et al. |
| 6,253,754 | B1 | 7/2001 | Roohparvar |
| 6,262,717 | B1 | 7/2001 | Donohue et al. |
| 6,263,302 | B1 | 7/2001 | Hellestrand et al. |
| 6,263,339 | B1 | 7/2001 | Hirsch |
| 6,263,484 | B1 | 7/2001 | Yang |
| 6,271,679 | B1 | 8/2001 | McClintock et al. |
| 6,272,646 | B1 | 8/2001 | Rangasayee et al. |
| 6,275,117 | B1 | 8/2001 | Abugharbieh et al. |
| 6,278,568 | B1 | 8/2001 | Cloke et al. |
| 6,280,391 | B1 | 8/2001 | Olson et al. |
| 6,281,753 | B1 | 8/2001 | Corsi et al. |
| 6,282,547 | B1 | 8/2001 | Hirsch |
| 6,282,551 | B1 | 8/2001 | Anderson et al. |
| 6,286,127 | B1 | 9/2001 | King et al. |
| 6,288,707 | B1 | 9/2001 | Philipp |
| 6,289,300 | B1 | 9/2001 | Brannick et al. |
| 6,289,478 | B1 | 9/2001 | Kitagaki |
| 6,289,489 | B1 | 9/2001 | Bold et al. |
| 6,292,028 | B1 | 9/2001 | Tomita |
| 6,294,932 | B1 | 9/2001 | Watarai |
| 6,294,962 | B1 | 9/2001 | Mar |
| 6,298,320 | B1 | 10/2001 | Buckmaster et al. |
| 6,304,014 | B1 | 10/2001 | England et al. |
| 6,304,101 | B1 | 10/2001 | Nishihara |
| 6,304,790 | B1 | 10/2001 | Nakamura et al. |
| 6,307,413 | B1 | 10/2001 | Dalmia et al. |
| 6,310,521 | B1 | 10/2001 | Dalmia |
| 6,310,611 | B1 | 10/2001 | Caldwell |
| 6,311,149 | B1 | 10/2001 | Ryan et al. |
| 6,314,530 | B1 | 11/2001 | Mann |
| 6,320,184 | B1 | 11/2001 | Winklhofer et al. |
| 6,320,282 | B1 | 11/2001 | Caldwell |
| 6,321,369 | B1 | 11/2001 | Heile et al. |
| 6,323,846 | B1 | 11/2001 | Westerman et al. |
| 6,324,628 | B1 | 11/2001 | Chan |
| 6,326,859 | B1 | 12/2001 | Goldman et al. |
| 6,332,137 | B1 | 12/2001 | Hori et al. |
| 6,332,201 | B1 | 12/2001 | Chin et al. |
| 6,337,579 | B1 | 1/2002 | Mochida |
| 6,338,109 | B1 | 1/2002 | Snyder et al. |
| 6,339,815 | B1 | 1/2002 | Feng et al. |
| 6,342,907 | B1 | 1/2002 | Petty et al. |
| 6,345,383 | B1 | 2/2002 | Ueki |
| 6,347,395 | B1 | 2/2002 | Payne et al. |
| 6,351,789 | B1 | 2/2002 | Green |
| 6,353,452 | B1 | 3/2002 | Hamada et al. |
| 6,355,980 | B1 | 3/2002 | Callahan |
| 6,356,862 | B2 | 3/2002 | Bailey |
| 6,356,958 | B1 | 3/2002 | Lin |
| 6,356,960 | B1 | 3/2002 | Jones et al. |
| 6,359,950 | B2 | 3/2002 | Gossmann et al. |
| 6,362,697 | B1 | 3/2002 | Pulvirenti |
| 6,366,174 | B1 | 4/2002 | Berry et al. |
| 6,366,300 | B1 | 4/2002 | Ohara et al. |
| 6,366,874 | B1 | 4/2002 | Lee et al. |
| 6,366,878 | B1 | 4/2002 | Grunert |
| 6,369,660 | B1 | 4/2002 | Wei et al. |
| 6,371,878 | B1 | 4/2002 | Bowen |
| 6,373,954 | B1 | 4/2002 | Malcolm, Jr. et al. |
| 6,374,370 | B1 | 4/2002 | Bockhaus et al. |
| 6,377,009 | B1 | 4/2002 | Philipp |
| 6,377,575 | B1 | 4/2002 | Mullaney et al. |
| 6,377,646 | B1 | 4/2002 | Sha |
| 6,380,811 | B1 | 4/2002 | Zarubinsky et al. |
| 6,380,929 | B1 | 4/2002 | Platt |
| 6,380,931 | B1 | 4/2002 | Gillespie et al. |
| 6,384,947 | B1 | 5/2002 | Ackerman et al. |

| | | |
|---|---|---|
| 6,385,742 B1 | 5/2002 | Kirsch et al. |
| 6,388,109 B1 | 5/2002 | Schwarz et al. |
| 6,388,464 B1 | 5/2002 | Lacey et al. |
| 6,396,302 B2 | 5/2002 | New et al. |
| 6,396,657 B1 | 5/2002 | Sun et al. |
| 6,397,232 B1 | 5/2002 | Cheng-Hung et al. |
| 6,404,204 B1 | 6/2002 | Farruggia et al. |
| 6,404,445 B1 | 6/2002 | Galea et al. |
| 6,407,953 B1 | 6/2002 | Cleeves |
| 6,408,432 B1 | 6/2002 | Herrmann et al. |
| 6,411,665 B1 | 6/2002 | Chan et al. |
| 6,411,974 B1 | 6/2002 | Graham et al. |
| 6,414,671 B1 | 7/2002 | Gillespie et al. |
| 6,417,872 B2 | 7/2002 | Zimmerman et al. |
| 6,421,698 B1 | 7/2002 | Hong |
| 6,425,109 B1 | 7/2002 | Choukalos et al. |
| 6,429,882 B1 | 8/2002 | Abdelnur et al. |
| 6,430,305 B1 | 8/2002 | Decker |
| 6,433,645 B1 | 8/2002 | Mann et al. |
| 6,434,187 B1 | 8/2002 | Beard et al. |
| 6,437,805 B1 | 8/2002 | Sojoodi et al. |
| 6,438,565 B1 | 8/2002 | Ammirato et al. |
| 6,438,735 B1 | 8/2002 | McElvain et al. |
| 6,438,738 B1 | 8/2002 | Elayda |
| 6,441,073 B1 | 8/2002 | Tanaka et al. |
| 6,445,211 B1 | 9/2002 | Saripella |
| 6,449,628 B1 | 9/2002 | Wasson |
| 6,449,755 B1 | 9/2002 | Beausang et al. |
| 6,449,761 B1 | 9/2002 | Greidinger et al. |
| 6,452,437 B1 | 9/2002 | Takeuchi et al. |
| 6,452,514 B1 | 9/2002 | Philipp |
| 6,453,175 B2 | 9/2002 | Mizell et al. |
| 6,453,461 B1 | 9/2002 | Chaiken |
| 6,456,304 B1 | 9/2002 | Angiulo et al. |
| 6,457,355 B1 | 10/2002 | Philipp |
| 6,457,479 B1 | 10/2002 | Zhuang et al. |
| 6,460,172 B1 | 10/2002 | Farre et al. |
| 6,463,488 B1 | 10/2002 | San Juan |
| 6,466,036 B1 | 10/2002 | Philipp |
| 6,466,078 B1 | 10/2002 | Stiff |
| 6,466,898 B1 | 10/2002 | Chan |
| 6,473,069 B1 | 10/2002 | Gerpheide |
| 6,473,825 B1 | 10/2002 | Worley et al. |
| 6,477,691 B1 | 11/2002 | Bergamaschi et al. |
| 6,480,921 B1 | 11/2002 | Mansoorian et al. |
| 6,483,343 B1 | 11/2002 | Faith et al. |
| 6,487,700 B1 | 11/2002 | Fukushima |
| 6,489,899 B1 | 12/2002 | Ely et al. |
| 6,490,213 B1 | 12/2002 | Mu et al. |
| 6,492,834 B1 | 12/2002 | Lytle et al. |
| 6,496,971 B1 | 12/2002 | Lesea et al. |
| 6,498,720 B2 | 12/2002 | Glad |
| 6,499,134 B1 | 12/2002 | Buffet et al. |
| 6,499,359 B1 | 12/2002 | Washeleski et al. |
| 6,504,403 B2 | 1/2003 | Bangs et al. |
| 6,507,214 B1 | 1/2003 | Snyder |
| 6,507,215 B1 | 1/2003 | Piasecki et al. |
| 6,507,857 B1 | 1/2003 | Yalcinalp |
| 6,509,758 B2 | 1/2003 | Piasecki et al. |
| 6,512,395 B1 | 1/2003 | Lacey et al. |
| 6,516,428 B2 | 2/2003 | Wenzel et al. |
| 6,516,452 B2 | 2/2003 | Meding |
| 6,522,128 B1 | 2/2003 | Ely et al. |
| 6,523,416 B2 | 2/2003 | Takagi et al. |
| 6,525,593 B1 | 2/2003 | Mar |
| 6,526,556 B1 | 2/2003 | Stoica et al. |
| 6,529,791 B1 | 3/2003 | Takagi |
| 6,530,065 B1 | 3/2003 | McDonald et al. |
| 6,534,970 B1 | 3/2003 | Ely et al. |
| 6,535,061 B2 | 3/2003 | Darmawaskita et al. |
| 6,535,200 B2 | 3/2003 | Philipp |
| 6,535,946 B1 | 3/2003 | Bryant et al. |
| 6,536,028 B1 | 3/2003 | Katsioulas et al. |
| 6,539,534 B1 | 3/2003 | Bennett |
| 6,542,025 B1 | 4/2003 | Kutz et al. |
| 6,542,844 B1 | 4/2003 | Hanna |
| 6,542,845 B1 | 4/2003 | Grucci et al. |
| 6,552,933 B2 | 4/2003 | Roohparvar |
| 6,553,057 B1 | 4/2003 | Sha et al. |
| 6,554,469 B1 | 4/2003 | Thomson et al. |
| 6,557,149 B2 | 4/2003 | Morrise et al. |
| 6,557,164 B1 | 4/2003 | Faustini |
| 6,559,685 B2 | 5/2003 | Green |
| 6,560,306 B1 | 5/2003 | Duffy et al. |
| 6,560,699 B1 | 5/2003 | Konkle |
| 6,563,391 B1 | 5/2003 | Mar |
| 6,564,179 B1 | 5/2003 | Belhaj |
| 6,566,961 B2 | 5/2003 | Dasgupta et al. |
| 6,567,426 B1 | 5/2003 | van Hook et al. |
| 6,567,932 B2 | 5/2003 | Edwards et al. |
| 6,570,557 B1 | 5/2003 | Westerman et al. |
| 6,571,331 B2 | 5/2003 | Henry et al. |
| 6,571,373 B1 | 5/2003 | Devins et al. |
| 6,574,590 B1 | 6/2003 | Kershaw et al. |
| 6,574,739 B1 | 6/2003 | Kung et al. |
| 6,575,373 B1 | 6/2003 | Nakano |
| 6,577,258 B2 | 6/2003 | Ruha et al. |
| 6,580,329 B2 | 6/2003 | Sander |
| 6,581,191 B1 | 6/2003 | Schubert et al. |
| 6,587,093 B1 | 7/2003 | Shaw et al. |
| 6,587,995 B1 | 7/2003 | Duboc et al. |
| 6,588,004 B1 | 7/2003 | Southgate et al. |
| 6,590,422 B1 | 7/2003 | Dillon |
| 6,590,517 B1 | 7/2003 | Swanson |
| 6,591,369 B1 | 7/2003 | Edwards et al. |
| 6,592,626 B1 | 7/2003 | Bauchot et al. |
| 6,594,799 B1 | 7/2003 | Robertson et al. |
| 6,597,212 B1 | 7/2003 | Wang et al. |
| 6,597,824 B2 | 7/2003 | Newberg et al. |
| 6,598,178 B1 | 7/2003 | Yee et al. |
| 6,600,346 B1 | 7/2003 | Macaluso |
| 6,600,351 B2 | 7/2003 | Bisanti et al. |
| 6,600,575 B1 | 7/2003 | Kohara |
| 6,601,189 B1 | 7/2003 | Edwards et al. |
| 6,601,236 B1 | 7/2003 | Curtis |
| 6,603,330 B1 | 8/2003 | Snyder |
| 6,603,348 B1 | 8/2003 | Preuss et al. |
| 6,604,179 B2 | 8/2003 | Volk et al. |
| 6,606,731 B1 | 8/2003 | Baum et al. |
| 6,608,472 B1 | 8/2003 | Kutz et al. |
| 6,610,936 B2 | 8/2003 | Gillespie et al. |
| 6,611,220 B1 | 8/2003 | Snyder |
| 6,611,276 B1 | 8/2003 | Muratori et al. |
| 6,611,856 B1 | 8/2003 | Liao et al. |
| 6,611,952 B1 | 8/2003 | Prakash et al. |
| 6,613,098 B1 | 9/2003 | Sorge et al. |
| 6,614,260 B1 | 9/2003 | Welch et al. |
| 6,614,320 B1 | 9/2003 | Sullam et al. |
| 6,614,374 B1 | 9/2003 | Gustavsson et al. |
| 6,614,458 B1 | 9/2003 | Lambert et al. |
| 6,615,167 B1 | 9/2003 | Devins et al. |
| 6,617,888 B2 | 9/2003 | Volk |
| 6,618,854 B1 | 9/2003 | Mann |
| 6,621,356 B2 | 9/2003 | Gotz et al. |
| 6,624,640 B2 | 9/2003 | Lund et al. |
| 6,625,765 B1 | 9/2003 | Krishnan |
| 6,628,163 B2 | 9/2003 | Dathe et al. |
| 6,628,311 B1 | 9/2003 | Fang |
| 6,631,508 B1 | 10/2003 | Williams |
| 6,634,008 B1 | 10/2003 | Dole |
| 6,636,096 B2 | 10/2003 | Schaffer et al. |
| 6,637,015 B1 | 10/2003 | Ogami et al. |
| 6,639,586 B2 | 10/2003 | Gerpheide |
| 6,642,857 B1 | 11/2003 | Schediwy et al. |
| 6,643,151 B1 | 11/2003 | Nebrigic et al. |
| 6,643,810 B1 | 11/2003 | Whetsel |
| 6,649,924 B1 | 11/2003 | Philipp et al. |
| 6,650,581 B2 | 11/2003 | Hong et al. |
| 6,658,498 B1 | 12/2003 | Carney et al. |
| 6,658,633 B2 | 12/2003 | Devins et al. |
| 6,661,288 B2 | 12/2003 | Morgan et al. |
| 6,661,410 B2 | 12/2003 | Casebolt et al. |
| 6,661,724 B1 | 12/2003 | Snyder et al. |
| 6,664,978 B1 | 12/2003 | Kekic et al. |
| 6,664,991 B1 | 12/2003 | Chew et al. |
| 6,667,642 B1 | 12/2003 | Moyal |
| 6,667,740 B2 | 12/2003 | Ely et al. |
| 6,670,852 B1 | 12/2003 | Hauck |

| | | |
|---|---|---|
| 6,673,308 B2 | 1/2004 | Hino et al. |
| 6,677,814 B2 | 1/2004 | Low et al. |
| 6,677,932 B1 | 1/2004 | Westerman |
| 6,678,645 B1 | 1/2004 | Rajsuman et al. |
| 6,678,877 B1 | 1/2004 | Perry et al. |
| 6,680,632 B1 | 1/2004 | Meyers et al. |
| 6,680,731 B2 | 1/2004 | Gerpheide et al. |
| 6,681,280 B1 | 1/2004 | Miyake et al. |
| 6,681,359 B1 | 1/2004 | Au et al. |
| 6,683,462 B2 | 1/2004 | Shimizu |
| 6,683,930 B1 | 1/2004 | Dalmia |
| 6,686,787 B2 | 2/2004 | Ling |
| 6,686,860 B2 | 2/2004 | Gulati et al. |
| 6,690,224 B1 | 2/2004 | Moore |
| 6,691,193 B1 | 2/2004 | Wang et al. |
| 6,691,301 B2 | 2/2004 | Bowen |
| 6,697,754 B1 | 2/2004 | Alexander |
| 6,701,340 B1 | 3/2004 | Gorecki et al. |
| 6,701,487 B1 | 3/2004 | Ogami et al. |
| 6,701,508 B1 | 3/2004 | Bartz et al. |
| 6,704,381 B1 | 3/2004 | Moyal et al. |
| 6,704,879 B1 | 3/2004 | Parrish |
| 6,704,889 B2 | 3/2004 | Veenstra et al. |
| 6,704,893 B1 | 3/2004 | Bauwens et al. |
| 6,705,511 B1 | 3/2004 | Dames et al. |
| 6,711,226 B1 | 3/2004 | Williams et al. |
| 6,711,731 B2 | 3/2004 | Weiss |
| 6,713,897 B2 | 3/2004 | Caldwell |
| 6,714,066 B2 | 3/2004 | Gorecki et al. |
| 6,714,817 B2 | 3/2004 | Daynes et al. |
| 6,715,132 B1 | 3/2004 | Bartz et al. |
| 6,717,474 B2 | 4/2004 | Chen et al. |
| 6,718,294 B1 | 4/2004 | Bortfeld |
| 6,718,520 B1 | 4/2004 | Merryman et al. |
| 6,718,533 B1 | 4/2004 | Schneider et al. |
| 6,724,220 B1 | 4/2004 | Snyder et al. |
| 6,728,900 B1 | 4/2004 | Meli |
| 6,728,902 B2 | 4/2004 | Kaiser et al. |
| 6,730,863 B1 | 5/2004 | Gerpheide et al. |
| 6,731,552 B2 | 5/2004 | Perner |
| 6,732,068 B2 | 5/2004 | Sample et al. |
| 6,732,347 B1 | 5/2004 | Camilleri et al. |
| 6,738,858 B1 | 5/2004 | Fernald et al. |
| 6,744,323 B1 | 6/2004 | Moyal et al. |
| 6,748,569 B1 | 6/2004 | Brooke et al. |
| 6,750,852 B2 | 6/2004 | Gillespie et al. |
| 6,750,889 B1 | 6/2004 | Livingston et al. |
| 6,754,101 B2 | 6/2004 | Terzioglu et al. |
| 6,754,723 B2 | 6/2004 | Kato |
| 6,754,765 B1 | 6/2004 | Chang et al. |
| 6,754,849 B2 | 6/2004 | Tamura |
| 6,757,882 B2 | 6/2004 | Chen et al. |
| 6,765,407 B1 | 7/2004 | Snyder |
| 6,768,337 B2 | 7/2004 | Kohno et al. |
| 6,768,352 B1 | 7/2004 | Maher et al. |
| 6,769,622 B1 | 8/2004 | Tournemille et al. |
| 6,771,552 B2 | 8/2004 | Fujisawa |
| 6,774,644 B2 | 8/2004 | Eberlein |
| 6,781,456 B2 | 8/2004 | Pradhan |
| 6,782,068 B1 | 8/2004 | Wilson et al. |
| 6,784,821 B1 | 8/2004 | Lee |
| 6,785,881 B1 | 8/2004 | Bartz et al. |
| 6,788,116 B1 | 9/2004 | Cook et al. |
| 6,788,221 B1 | 9/2004 | Ely et al. |
| 6,788,521 B2 | 9/2004 | Nishi |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |
| 6,806,771 B1 | 10/2004 | Hildebrant et al. |
| 6,806,782 B2 | 10/2004 | Motoyoshi et al. |
| 6,809,275 B1 | 10/2004 | Cheng et al. |
| 6,809,566 B1 | 10/2004 | Xin-LeBlanc |
| 6,810,442 B1 | 10/2004 | Lin et al. |
| 6,815,979 B2 | 11/2004 | Ooshita |
| 6,816,544 B1 | 11/2004 | Bailey et al. |
| 6,817,005 B2 | 11/2004 | Mason et al. |
| 6,819,142 B2 | 11/2004 | Viehmann et al. |
| 6,823,282 B1 | 11/2004 | Snyder |
| 6,823,497 B2 | 11/2004 | Schubert et al. |
| 6,825,689 B1 | 11/2004 | Snyder |
| 6,825,869 B2 | 11/2004 | Bang |
| 6,828,824 B2 | 12/2004 | Betz et al. |
| 6,829,727 B1 | 12/2004 | Pawloski |
| 6,834,384 B2 | 12/2004 | Fiorella, III et al. |
| 6,836,169 B2 | 12/2004 | Richmond et al. |
| 6,839,774 B1 | 1/2005 | Ahn et al. |
| 6,842,710 B1 | 1/2005 | Gehring et al. |
| 6,847,203 B1 | 1/2005 | Conti et al. |
| 6,850,117 B2 | 2/2005 | Weber et al. |
| 6,850,554 B1 | 2/2005 | Sha et al. |
| 6,853,598 B2 | 2/2005 | Chevallier |
| 6,854,067 B1 | 2/2005 | Kutz et al. |
| 6,856,433 B2 | 2/2005 | Hatano et al. |
| 6,859,884 B1 | 2/2005 | Sullam |
| 6,862,240 B2 | 3/2005 | Burgan |
| 6,864,710 B1 | 3/2005 | Lacey et al. |
| 6,865,429 B1 | 3/2005 | Schneider et al. |
| 6,865,504 B2 | 3/2005 | Larson et al. |
| 6,868,500 B1 | 3/2005 | Kutz et al. |
| 6,871,253 B2 | 3/2005 | Greeff et al. |
| 6,871,331 B1 | 3/2005 | Bloom et al. |
| 6,873,203 B1 | 3/2005 | Latham et al. |
| 6,873,210 B2 | 3/2005 | Mulder et al. |
| 6,876,941 B2 | 4/2005 | Nightingale |
| 6,880,086 B2 | 4/2005 | Kidder et al. |
| 6,888,453 B2 | 5/2005 | Lutz et al. |
| 6,888,538 B2 | 5/2005 | Ely et al. |
| 6,892,310 B1 | 5/2005 | Kutz et al. |
| 6,892,322 B1 | 5/2005 | Snyder |
| 6,893,724 B2 | 5/2005 | Lin et al. |
| 6,894,928 B2 | 5/2005 | Owen |
| 6,895,373 B2 | 5/2005 | Garcia et al. |
| 6,897,390 B2 | 5/2005 | Caldwell et al. |
| 6,898,703 B1 | 5/2005 | Ogami et al. |
| 6,900,663 B1 | 5/2005 | Roper et al. |
| 6,901,563 B1 | 5/2005 | Ogami et al. |
| 6,903,402 B2 | 6/2005 | Miyazawa |
| 6,903,613 B1 | 6/2005 | Mitchell et al. |
| 6,904,570 B2 | 6/2005 | Foote et al. |
| 6,910,126 B1 | 6/2005 | Mar et al. |
| 6,911,857 B1 | 6/2005 | Stiff |
| 6,917,661 B1 | 7/2005 | Scott et al. |
| 6,922,821 B1 | 7/2005 | Nemecek |
| 6,924,668 B2 | 8/2005 | Mueller et al. |
| 6,934,674 B2 | 8/2005 | Douezy et al. |
| 6,937,075 B2 | 8/2005 | Lim et al. |
| 6,940,356 B2 | 9/2005 | McDonald et al. |
| 6,941,336 B1 | 9/2005 | Mar |
| 6,941,538 B2 | 9/2005 | Hwang et al. |
| 6,944,018 B2 | 9/2005 | Caldwell |
| 6,949,811 B2 | 9/2005 | Miyazawa |
| 6,949,984 B2 | 9/2005 | Siniscalchi |
| 6,950,954 B1 | 9/2005 | Sullam et al. |
| 6,950,990 B2 | 9/2005 | Rajarajan et al. |
| 6,952,778 B1 | 10/2005 | Snyder |
| 6,954,511 B2 | 10/2005 | Tachimori |
| 6,954,904 B2 | 10/2005 | White |
| 6,956,419 B1 | 10/2005 | Mann et al. |
| 6,957,180 B1 | 10/2005 | Nemecek |
| 6,957,242 B1 | 10/2005 | Snyder |
| 6,963,233 B2 | 11/2005 | Puccio et al. |
| 6,963,908 B1 | 11/2005 | Lynch et al. |
| 6,966,039 B1 | 11/2005 | Bartz et al. |
| 6,967,511 B1 | 11/2005 | Sullam |
| 6,967,960 B1 | 11/2005 | Bross et al. |
| 6,968,514 B2 | 11/2005 | Cooke et al. |
| 6,969,978 B2 | 11/2005 | Dening |
| 6,970,844 B1 | 11/2005 | Bierenbaum |
| 6,971,004 B1 | 11/2005 | Pleis et al. |
| 6,973,400 B2 | 12/2005 | Cahill-O'Brien et al. |
| 6,975,123 B1 | 12/2005 | Malang et al. |
| 6,980,060 B2 | 12/2005 | Boerstler et al. |
| 6,981,090 B1 | 12/2005 | Kutz et al. |
| 6,988,192 B2 | 1/2006 | Snider |
| 6,996,799 B1 | 2/2006 | Cismas et al. |
| 7,005,933 B1 | 2/2006 | Shutt |

| Patent | Date | Inventor |
|---|---|---|
| 7,009,444 B1 | 3/2006 | Scott |
| 7,010,773 B1 | 3/2006 | Bartz et al. |
| 7,015,735 B2 | 3/2006 | Kimura et al. |
| 7,017,145 B2 | 3/2006 | Taylor |
| 7,017,409 B2 | 3/2006 | Zielinski et al. |
| 7,020,854 B2 | 3/2006 | Killian et al. |
| 7,023,215 B2 | 4/2006 | Steenwyk |
| 7,023,257 B1 | 4/2006 | Sullam |
| 7,024,636 B2 | 4/2006 | Weed |
| 7,024,654 B2 | 4/2006 | Bersch et al. |
| 7,026,861 B2 | 4/2006 | Steenwyk |
| 7,030,513 B2 | 4/2006 | Caldwell |
| 7,030,656 B2 | 4/2006 | Lo et al. |
| 7,030,688 B2 | 4/2006 | Dosho et al. |
| 7,030,782 B2 | 4/2006 | Ely et al. |
| 7,034,603 B2 | 4/2006 | Brady et al. |
| 7,042,301 B2 | 5/2006 | Sutardja |
| 7,047,166 B2 | 5/2006 | Dancea |
| 7,055,035 B2 | 5/2006 | Allison et al. |
| 7,058,921 B1 | 6/2006 | Hwang et al. |
| 7,073,158 B2 | 7/2006 | McCubbrey |
| 7,076,420 B1 | 7/2006 | Snyder et al. |
| 7,079,166 B1 | 7/2006 | Hong |
| 7,086,014 B1 | 8/2006 | Bartz et al. |
| 7,088,166 B1 | 8/2006 | Reinschmidt et al. |
| 7,089,175 B1 | 8/2006 | Nemecek et al. |
| 7,091,713 B2 | 8/2006 | Erdelyi et al. |
| 7,092,980 B1 | 8/2006 | Mar et al. |
| 7,098,414 B2 | 8/2006 | Caldwell |
| 7,099,818 B1 | 8/2006 | Nemecek et al. |
| 7,103,108 B1 | 9/2006 | Beard |
| 7,109,978 B2 | 9/2006 | Gillespie et al. |
| 7,117,485 B2 | 10/2006 | Wilkinson et al. |
| 7,119,550 B2 | 10/2006 | Kitano et al. |
| 7,119,602 B2 | 10/2006 | Davis |
| 7,124,376 B2 | 10/2006 | Zaidi et al. |
| 7,127,630 B1 | 10/2006 | Snyder |
| 7,129,793 B2 | 10/2006 | Gramegna |
| 7,129,873 B2 | 10/2006 | Kawamura |
| 7,132,835 B1 | 11/2006 | Arcus |
| 7,133,140 B2 | 11/2006 | Lukacs et al. |
| 7,133,793 B2 | 11/2006 | Ely et al. |
| 7,138,841 B1 | 11/2006 | Li et al. |
| 7,138,868 B2 | 11/2006 | Sanchez et al. |
| 7,139,530 B2 | 11/2006 | Kusbel |
| 7,141,968 B2 | 11/2006 | Hibbs et al. |
| 7,141,987 B2 | 11/2006 | Hibbs et al. |
| 7,149,316 B1 | 12/2006 | Kutz et al. |
| 7,150,002 B1 | 12/2006 | Anderson et al. |
| 7,151,528 B2 | 12/2006 | Taylor et al. |
| 7,152,027 B2 | 12/2006 | Adreade et al. |
| 7,154,294 B2 | 12/2006 | Liu et al. |
| 7,161,936 B1 | 1/2007 | Barrass et al. |
| 7,162,410 B1 | 1/2007 | Nemecek et al. |
| 7,171,455 B1 | 1/2007 | Gupta et al. |
| 7,176,701 B2 | 2/2007 | Wachi et al. |
| 7,178,096 B2 | 2/2007 | Rangan et al. |
| 7,180,342 B1 | 2/2007 | Shutt et al. |
| 7,185,162 B1 | 2/2007 | Snyder |
| 7,185,321 B1 | 2/2007 | Roe et al. |
| 7,188,063 B1 | 3/2007 | Snyder |
| 7,193,901 B2 | 3/2007 | Ruby et al. |
| 7,200,507 B2 | 4/2007 | Chen et al. |
| 7,206,733 B1 | 4/2007 | Nemecek |
| 7,212,189 B2 | 5/2007 | Shaw et al |
| 7,221,187 B1 | 5/2007 | Snyder et al. |
| 7,227,389 B2 | 6/2007 | Gong et al. |
| 7,236,921 B1 | 6/2007 | Nemecek et al. |
| 7,250,825 B2 | 7/2007 | Wilson et al. |
| 7,256,588 B2 | 8/2007 | Howard et al. |
| 7,265,633 B1 | 9/2007 | Stiff |
| 7,281,846 B2 | 10/2007 | McLeod |
| 7,282,905 B2 | 10/2007 | Chen et al. |
| 7,283,151 B2 | 10/2007 | Nihei et al. |
| 7,287,112 B1 | 10/2007 | Pleis et al. |
| 7,288,977 B2 | 10/2007 | Stanley |
| 7,290,244 B2 | 10/2007 | Peck et al. |
| 7,295,049 B1 | 11/2007 | Moyal et al. |
| 7,298,124 B2 | 11/2007 | Kan et al. |
| 7,301,835 B2 | 11/2007 | Joshi et al. |
| 7,305,510 B2 | 12/2007 | Miller |
| 7,307,485 B1 | 12/2007 | Snyder et al. |
| 7,308,608 B1 | 12/2007 | Pleis et al. |
| 7,312,616 B2 | 12/2007 | Snyder |
| 7,323,879 B2 | 1/2008 | Kuo et al. |
| 7,342,405 B2 | 3/2008 | Eldridge et al. |
| 7,358,714 B2 | 4/2008 | Watanabe et al. |
| 7,367,017 B2 | 4/2008 | Maddocks et al. |
| 7,373,437 B2 | 5/2008 | Seigneret et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,400,183 B1 | 7/2008 | Sivadasan et al. |
| 7,406,674 B1 | 7/2008 | Ogami et al. |
| 7,421,251 B2 | 9/2008 | Westwick et al. |
| 7,466,307 B2 | 12/2008 | Trent, Jr. et al. |
| 7,542,533 B2 | 6/2009 | Jasa et al. |
| 7,554,847 B2 | 6/2009 | Lee |
| 7,616,509 B2 | 11/2009 | Qureshi et al. |
| 2001/0002129 A1 | 5/2001 | Zimmerman et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Karniewicz |
| 2001/0045861 A1 | 11/2001 | Bloodworth et al. |
| 2002/0010716 A1 | 1/2002 | McCartney et al. |
| 2002/0016706 A1 | 2/2002 | Cooke et al. |
| 2002/0023110 A1 | 2/2002 | Fortin et al. |
| 2002/0052729 A1 | 5/2002 | Kyung et al. |
| 2002/0059543 A1 | 5/2002 | Cheng et al. |
| 2002/0063688 A1 | 5/2002 | Shaw et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0080186 A1 | 6/2002 | Frederiksen |
| 2002/0085020 A1 | 7/2002 | Carroll, Jr. |
| 2002/0091739 A1 | 7/2002 | Ferlitsch et al. |
| 2002/0099863 A1 | 7/2002 | Comeau et al. |
| 2002/0109722 A1 | 8/2002 | Rogers et al. |
| 2002/0116168 A1 | 8/2002 | Kim |
| 2002/0121679 A1 | 9/2002 | Bazarjani et al. |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0144099 A1 | 10/2002 | Muro et al. |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156919 A1 | 10/2002 | Hekmatpour |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |
| 2002/0174411 A1 | 11/2002 | Feng et al. |
| 2002/0188910 A1 | 12/2002 | Zizzo |
| 2002/0191029 A1 | 12/2002 | Gillespie et al. |
| 2003/0011639 A1 | 1/2003 | Webb |
| 2003/0014447 A1 | 1/2003 | White |
| 2003/0025734 A1 | 2/2003 | Boose et al. |
| 2003/0041235 A1 | 2/2003 | Meyer |
| 2003/0056071 A1 | 3/2003 | Triece et al. |
| 2003/0058469 A1 | 3/2003 | Buis et al. |
| 2003/0061572 A1 | 3/2003 | McClannahan et al. |
| 2003/0062889 A1 | 4/2003 | Ely et al. |
| 2003/0080755 A1 | 5/2003 | Kobayashi |
| 2003/0097640 A1 | 5/2003 | Abrams et al. |
| 2003/0105620 A1 | 6/2003 | Bowen |
| 2003/0126947 A1 | 7/2003 | Margaria |
| 2003/0135842 A1 | 7/2003 | Frey et al. |
| 2003/0149961 A1 | 8/2003 | Kawai et al. |
| 2003/0229482 A1 | 12/2003 | Cook et al. |
| 2004/0018711 A1 | 1/2004 | Madurawe |
| 2004/0054821 A1 | 3/2004 | Warren et al. |
| 2004/0153802 A1 | 8/2004 | Kudo et al. |
| 2004/0205553 A1 | 10/2004 | Hall et al. |

| | | | |
|---|---|---|---|
| 2004/0205617 A1 | 10/2004 | Light | |
| 2004/0205695 A1 | 10/2004 | Fletcher | |
| 2005/0024341 A1 | 2/2005 | Gillespie et al. | |
| 2005/0066152 A1 | 3/2005 | Garey | |
| 2005/0143968 A9 | 6/2005 | Odom et al. | |
| 2005/0240917 A1 | 10/2005 | Wu | |
| 2005/0248534 A1 | 11/2005 | Kehlstadt | |
| 2005/0280453 A1 | 12/2005 | Hsieh | |
| 2006/0015862 A1 | 1/2006 | Odom et al. | |
| 2006/0031768 A1 | 2/2006 | Shah et al. | |
| 2006/0032680 A1 | 2/2006 | Elias et al. | |
| 2006/0097991 A1 | 5/2006 | Hotelling et al. | |
| 2006/0273804 A1 | 12/2006 | Delorme et al. | |
| 2007/0139074 A1 | 6/2007 | Reblewski | |
| 2007/0258458 A1 | 11/2007 | Kapoor | |
| 2008/0095213 A1 | 4/2008 | Lin et al. | |
| 2008/0186052 A1 | 8/2008 | Needham et al. | |
| 2008/0259998 A1 | 10/2008 | Venkataraman et al. | |
| 2008/0294806 A1 | 11/2008 | Swindle et al. | |
| 2009/0322305 A1 | 12/2009 | De Cremoux | |

FOREIGN PATENT DOCUMENTS

| | | | |
|---|---|---|---|
| EP | 368398 A1 | 5/1990 | |
| EP | 0450863 A2 | 10/1991 | |
| EP | 0499383 A2 | 8/1992 | |
| EP | 0639816A2 A1 | 2/1995 | |
| EP | 1170671 A1 | 1/2002 | |
| EP | 1191423 A | 3/2002 | |
| EP | 1205848 A1 | 5/2002 | |
| JP | 4083405 A | 3/1992 | |
| JP | 4095408 A | 3/1992 | |
| JP | 5055842 A | 3/1993 | |
| JP | 6021732 A | 1/1994 | |
| WO | 9532478 | 11/1995 | |
| WO | 9617305 A | 6/1996 | |
| WO | 9617305 A1 | 6/1996 | |
| WO | 9834376 A1 | 8/1998 | |
| WO | 9834376 A2 | 8/1998 | |
| WO | 9909712 A | 2/1999 | |
| WO | 9909712 A1 | 2/1999 | |

OTHER PUBLICATIONS

Kory Hopkins; "Definition"; Jan. 16, 1997; http: // www.cs.sfu.ca/cs/people/GradStuden...sonal/papers/graph_isomorphism/node2.html.

C. Ebeling et al.; Validating VLSI Circuit Layout by Wirelist Comparison; Sep. 1983; In proceedings of the IEEE International Conference on Computer Aided Design (ICCAD-83), pp. 172-173.

"The Gemini Netlist Comparison Project"; http://www.cs.washington.edu/research/projects/lis/www/gemini/gemini.html, larry@cs.washington.edu.

Ohlrich et al.; "Sub-Gemini: Identifying Subcircuits Using a Fast Subgraph Isomorphism Algorithm"; Jun. 1993; In proceedings of the 30th IEEE/ACM Design Automation Conference.

Ebeling; "Gemini II: A Second Generation Layout Validation Program"; 1988; In proceedings of the IEEE International Conference on Computer Aided Design (ICCAD-88), pp. 322-325.

"Programmable Microcontoller Architecture (Mixedanalog/Digital)"; Aug. 7, 2001; U.S. Appl. No. 09/924,734; Snyder et al.

"Digital Configurable Macro Architecture"; Jul. 18, 2001; U.S. Appl. No. 09/909,045; W. Snyder.

"Configuring Digital Functions in a Digital Configurable Macro Architecture"; Jul. 18, 2001; U.S. Appl. No. 09/909,109; W. Snyder.

"A Programmable Analog System Architecture (As Amended)"; Jul. 18, 2001; U.S. Appl. No. 09/909,047; M. Mar.

"Programming Methodology and Architecture for a Programmable Analog System (As Amended)"; Aug. 14, 2001; U.S. Appl. No. 09/930,021; Mar et al.

"Method for Synchronizing and Resetting Clock Signals Supplied to Multiple Programmable Analog Blocks (As Amended)"; Oct. 1, 2001; U.S. Appl. No. 09/969,311; B. Sullam.

"Method and Apparatus for Programming a Flash Memory"; Jun. 5, 2001; U.S. Appl. No. 09/875,599; W. Snyder.

"In-System Chip Emulator Architecture"; Oct. 10, 2001; U.S. Appl. No. 09/975,115; Snyder et al.

"A Configurable Input/Output Interface for a Microcontroller"; Sep. 14, 2001; U.S. Appl. No. 09/953,423; Kutz et al.

"Multiple Use of Microcontroller Pad"; Jun. 26, 2001; U.S. Appl. No. 09/893,050; Kutz et al.

"Programming Architecture for a Programmable Analog System"; Aug. 14, 2001; U.S. Appl. No. 09/929,891; Mar et al.

"Architecture for Synchronizing and Resetting Clock Signals Supplied to Multiple Analog Programmable Analog Blocks"; Oct. 1, 2001; U.S. Appl. No. 09/969,313; B. Sullam.

Goodenough, F., "Analog Counterparts of FPGAS Ease System Design" Electronic Design, Penton Publishing Cleveland, OH, US vol. 42, No. 21, Oct. 14, 1994, pp. 63-66, 68, 7 XP000477345 ISSN: 0013-4872 the whole document.

Harbaum, T. et al.: "Design of a Flexible Coprocessor Unit" Proceedings of the Euromicro Conference, XX XX, Sep. 1999, pp. 335-342, XP000879556, p. 3 right-hand column, line 13-p. 338, left hand column, line 4; figure 1.

Xerox, "Mesa Debugger Documentation," Apr. 1979; Xerox Systems Development Department; Version 5.0, pp. 1-30; 33 pages.

Xilinx, Virtex-II Pro Platform FPGA Developer's Kit, "How Data2BRAM Fits in with Hardware and Software Flows," Chapter 2: Using Data2BRAM; Jan. 2003 Release; 2 pages.

Yoo et al., "Fast Hardware-Software Coverification by Optimistic Execution of Real Processor, Proceedings of Design, Automation and Test in Europe Conference and Exhibition," Mar. 2000, pp. 663-668; 6 pages.

USPTO Notice of Allowance for U.S. Appl. No. 10/001,477 dated Dec. 4, 2009; 7 pages.

USPTO Notice of Allowance for U.S. Appl. No. 10/001,477 dated May 8, 2009; 6 pages.

USPTO Notice of Allowance for U.S. Appl. No. 10/001,478 dated Jun. 2, 2010; 11 pages.

USPTO Notice of Allowance for U.S. Appl. No. 10/001,568 dated Mar. 17, 2006; 9 pages.

USPTO Notice of Allowance for U.S. Appl. No. 10/002,217 dated Jan. 11, 2010; 7 pages.

USPTO Notice of Allowance for U.S. Appl. No. 10/002,217 dated Jun. 8, 2009; 8 pages.

USPTO Notice of Allowance for U.S. Appl. No. 10/002,217 dated Sep. 17, 2009; 6 pages.

USPTO Notice of Allowance for U.S. Appl. No. 10/002,726 dated Feb. 6, 2007; 7 pages.

USPTO Notice of Allowance for U.S. Appl. No. 10/004,039 dated Aug. 15, 2006; 7 pages.

USPTO Notice of Allowance for U.S. Appl. No. 10/004,197 dated Feb. 9, 2007; 7 pages.

USPTO Notice of Allowance for U.S. Appl. No. 10/004,197 dated Oct. 6, 2006; 7 pages.

USPTO Notice of Allowance for U.S. Appl. No. 10/008,096 dated Feb. 1, 2010; 6 pages.

USPTO Notice of Allowance for U.S. Appl. No. 10/008,096 dated Jun. 5, 2009; 12 pages.

USPTO Notice of Allowance for U.S. Appl. No. 10/008,096 dated Oct. 21, 2009; 6 pages.

USPTO Notice of Allowance for U.S. Appl. No. 10/011,214 dated Apr. 11, 2005; 4 pages.

USPTO Notice of Allowance for U.S. Appl. No. 10/024,093 dated Sep. 10, 2002; 3 pages.

USPTO Notice of Allowance for U.S. Appl. No. 10/033,027 dated Feb. 18, 2010; 4 pages.

USPTO Notice of Allowance for U.S. Appl. No. 10/033,027 dated Sep. 2, 2009; 4 pages.

USPTO Notice of Allowance for U.S. Appl. No. 10/109,979 dated Mar. 14, 2006, 6 pages.

USPTO Notice of Allowance for U.S. Appl. No. 10/113,064 dated Sep. 21, 2006; 7 pages.

USPTO Notice of Allowance for U.S. Appl. No. 10/113,581 dated Mar. 5, 2010; 9 pages.

USPTO Notice of Allowance for U.S. Appl. No. 10/113,581 dated Sep. 3, 2010; 11 pages.

USPTO Notice of Allowance for U.S. Appl. No. 10/133,581 dated Mar. 5, 2010; 9 pages.

USPTO Notice of Allowance for U.S. Appl. No. 10/137,497 dated Jan. 24, 2007; 12 pages.
USPTO Notice of Allowance for U.S. Appl. No. 10/137,497 dated Jul. 20, 2007; 4 pages.
USPTO Notice of Allowance for U.S. Appl. No. 10/226,911 dated Aug. 20, 2004; 4 pages.
USPTO Notice of Allowance for U.S. Appl. No. 10/238,966 dated Feb. 1, 2010; 4 pages.
USPTO Notice of Allowance for U.S. Appl. No. 10/238,966 dated Aug. 5, 2009; 5 pages.
USPTO Notice of Allowance for U.S. Appl. No. 10/256,829 dated May 10, 2010; 4 pages.
USPTO Notice of Allowance for U.S. Appl. No. 10/256,829 dated Oct. 29, 2007; 6 pages.
USPTO Notice of Allowance for U.S. Appl. No. 10/272,231 dated Mar. 8, 2004; 6 pages.
USPTO Notice of Allowance for U.S. Appl. No. 10/288,003 dated Jan. 14, 2005; 6 pages.
USPTO Notice of Allowance for U.S. Appl. No. 10/293,392 dated Mar. 10, 2004; 6 pages.
USPTO Notice of Allowance for U.S. Appl. No. 10/305,589 dated Feb. 4, 2005; 5 pages.
USPTO Notice of Allowance for U.S. Appl. No. 10/324,455 dated Feb. 12, 2004; 4 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Notice of Allowance for U.S. Appl. No. 10/327,217 dated Aug. 12, 2004; 6 pages.
USPTO Notice of Allowance for U.S. Appl. No. 10/653,050 dated Jul. 29, 2004; 3 pages.
USPTO Notice of Allowance for U.S. Appl. No. 10/803,030 dated Jan. 8, 2007; 6 pages.
USPTO Notice of Allowance for U.S. Appl. No. 10/871,582 dated Mar. 30, 2006; 6 pages.
USPTO Notice of Allowance for U.S. Appl. No. 11/088,028 dated Jan. 26, 2007; 6 pages.
USPTO Notice of Allowance for U.S. Appl. No. 11/088,028 dated Jul. 2, 2007; 6 pages.
USPTO Notice of Allowance for U.S. Appl. No. 11/125,554 dated Feb. 7, 2008; 4 pages.
USPTO Notice of Allowance for U.S. Appl. No. 11/125,554 dated Apr. 24, 2007; 7 pages.
USPTO Notice of Allowance for U.S. Appl. No. 11/132,894 dated Apr. 26, 2007, 4 pages.
USPTO Notice of Allowance for U.S. Appl. No. 11/201,922 dated Apr. 9, 2009; 4 pages.
USPTO Notice of Allowance for U.S. Appl. No. 11/273,708 dated Aug. 9, 2007; 4 pages.
USPTO Notice of Allowance for U.S. Appl. No. 11/337,272 dated Aug. 15, 2007; 9 pages.
USPTO Notice of Allowance for U.S. Appl. No. 11/415,588 dated Mar. 11, 2008; 6 pages.
USPTO Final Rejection for U.S. Appl. No. 09/989,782 dated Nov. 3, 2005; 11 pages.
USPTO Final Rejection for U.S. Appl. No. 09/992,076 dated Jan. 30, 2007; 32 pages.
USPTO Final Rejection for U.S. Appl. No. 09/992,076 dated Mar. 17, 2006; 16 pages.
USPTO Final Rejection for U.S. Appl. No. 09/994,600 dated Feb. 13, 2006; 13 pages.
USPTO Final Rejection for U.S. Appl. No. 09/994,600 dated May 4, 2005; 16 pages.
USPTO Final Rejection for U.S. Appl. No. 09/994,600 dated Oct. 17, 2007; 13 pages.
USPTO Final Rejection for U.S. Appl. No. 09/994,600 dated Dec. 8, 2006; 14 pages.
USPTO Final Rejection for U.S. Appl. No. 09/994,601 dated Apr. 17, 2008; 24 pages.
USPTO Final Rejection for U.S. Appl. No. 09/994,601 dated May 18, 2007; 17 pages.
USPTO Final Rejection for U.S. Appl. No. 09/994,601 dated Mar. 8, 2006; 11 pages.
USPTO Final Rejection for U.S. Appl. No. 09/994,601 dated Mar. 24, 2005; 10 pages.
USPTO Final Rejection for U.S. Appl. No. 09/998,848 dated Jun. 14, 2005; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.
USPTO Final Rejection for U.S. Appl. No. 09/998,848 dated Nov. 24, 2008; 15 pages.
USPTO Final Rejection for U.S. Appl. No. 09/998,859 dated Nov. 19, 2003; 5 pages.
USPTO Final Rejection for U.S. Appl. No. 10/001,477 dated Jun. 30, 2008; 15 pages.
USPTO Final Rejection for U.S. Appl. No. 10/001,477 dated Jul. 23, 2007; 16 pages.
USPTO Final Rejection for U.S. Appl. No. 10/001,477 dated Aug. 24, 2006; 13 pages.
USPTO Final Rejection for U.S. Appl. No. 10/001,477 dated Oct. 24, 2005; 13 pages.
USPTO Final Rejection for U.S. Appl. No. 10/002,217 dated Feb. 6, 2008; 10 pages.
USPTO Final Rejection for U.S. Appl. No. 10/002,217 dated Mar. 7, 2007; 12 pages.
USPTO Final Rejection for U.S. Appl. No. 10/002,217 dated Nov. 17, 2005; 17 pages.
USPTO Final Rejection for U.S. Appl. No. 10/008,096 dated Feb. 10, 2005; 15 pages.
USPTO Final Rejection for U.S. Appl. No. 10/008,096 dated Jun. 16, 2008; 23 pages.
USPTO Final Rejection for U.S. Appl. No. 10/008,096 dated Sep. 4, 2007; 19 pages.
USPTO Final Rejection for U.S. Appl. No. 10/008,096 dated Oct. 13, 2006; 17 pages.
USPTO Final Rejection for U.S. Appl. No. 10/008,096 dated Nov. 25, 2005; 17 pages.
USPTO Final Rejection for U.S. Appl. No. 10/033,027 dated Jun. 8, 2007; 8 pages.
USPTO Final Rejection for U.S. Appl. No. 10/033,027 dated Aug. 9, 2006; 6 pages.
USPTO Final Rejection for U.S. Appl. No. 10/033,027 dated Oct. 31, 2005; 24 pages.
USPTO Final Rejection for U.S. Appl. No. 10/113,065 dated Oct. 26, 2005; 17 pages.
USPTO Final Rejection for U.S. Appl. No. 10/238,966 dated Sep. 27, 2007; 9 pages.
USPTO Final Rejection for U.S. Appl. No. 09/404,891 dated Dec. 8, 2004; 7 pages.
USPTO Final Rejection for U.S. Appl. No. 09/475,879 dated Oct. 11, 2001; 10 pages.
USPTO Final Rejection for U.S. Appl. No. 09/875,599 dated Feb. 15, 2006; 18 pages.
USPTO Final Rejection for U.S. Appl. No. 09/875,599 dated Mar. 29, 2005; 20 pages.
USPTO Final Rejection for U.S. Appl. No. 09/875,599 dated Apr. 26, 2004; 15 pages.
USPTO Final Rejection for U.S. Appl. No. 09/875,599 dated Aug. 25, 2004; 17 pages.
USPTO Final Rejection for U.S. Appl. No. 09/875,599 dated Nov. 21, 2005; 16 pages.
USPTO Final Rejection for U.S. Appl. No. 09/893,050 dated Aug. 30, 2004; 13 pages.
USPTO Final Rejection for U.S. Appl. No. 09/912,768 dated Nov. 17, 2004; 13 pages.
USPTO Final Rejection for U.S. Appl. No. 09/930,021 dated Aug. 31, 2004; 8 pages.
USPTO Final Rejection for U.S. Appl. No. 09/943,062 dated Jan. 18, 2008; 8 pages.
USPTO Final Rejection for U.S. Appl. No. 09/943,062 dated Apr. 30, 2004; 9 pages.

USPTO Final Rejection for U.S. Appl. No. 09/943,062 dated Jun. 27, 2003; 8 pages.
USPTO Final Rejection for U.S. Appl. No. 09/943,149 dated May 7, 2003; 10 pages.
USPTO Final Rejection for U.S. Appl. No. 09/957,084 dated Jan. 29, 2004; 8 pages.
USPTO Final Rejection for U.S. Appl. No. 09/957,084 dated Apr. 23, 2003; 8 pages.
USPTO Final Rejection for U.S. Appl. No. 09/969,311 dated Apr. 7, 2003; 7 pages.
Final Rejection for U.S. Appl. No. 11/201,627 dated Apr. 29, 2008; 21 pages.
USPTO Final Rejection for U.S. Appl. No. 11/201,627 dated May 24, 2010; 26 pages.
USPTO Final Rejection for U.S. Appl. No. 11/201,627 dated Jul. 7, 2009; 19 pages.
USPTO Final Rejection for U.S. Appl. No. 11/201,922 dated Apr. 30, 2008; 10 pages.
USPTO Final Rejection for U.S. Appl. No. 11/273,708 dated Jul. 5, 2007; 8 pages.
USPTO Final Rejection for U.S. Appl. No. 11/322,044 dated Sep. 21, 2007; 14 pages.
USPTO Final Rejection for U.S. Appl. No. 11/322,044 dated Oct. 19, 2009; 10 pages.
USPTO Final Rejection for U.S. Appl. No. 11/337,272 dated Feb. 2, 2007; 11 pages.
USPTO Final Rejection for U.S. Appl. No. 11/415,588 dated Oct. 19, 2007; 8 pages.
USPTO Final Rejection for U.S. Appl. No. 11/644,100 dated May 19, 2010; 13 pages.
USPTO Final Rejection for U.S. Appl. No. 11/644,100 dated Aug. 19, 2009; 12 pages.
Final Rejection for U.S. Appl. No. 11/644,100 dated Nov. 18, 2008; 12 pages.
USPTO Final Rejection for U.S. Appl. No. 11/698,660 dated Feb. 16, 2010; 14 pages.
USPTO Final Rejection for U.S. Appl. No. 11/698,660 dated May 28, 2009; 12 pages.
USPTO Final Rejection for U.S. Appl. No. 11/698,660 dated Sep. 3, 2010; 19 pages.
USPTO Final Rejection for U.S. Appl. No. 11/799,439 dated Dec. 18, 2008; 6 pages.
USPTO Final Rejection for U.S. Appl. No. 11/850,260 dated Aug. 21, 2009; 9 pages.
USPTO Final Rejection for U.S. Appl. No. 11/857,947 dated Oct. 14, 2009; 22 pages.
USPTO Final Rejection for U.S. Appl. No. 11/665,672 dated Dec. 30, 2009; 6 pages.
USPTO Final Rejection for U.S. Appl. No. 11/968,145 dated Aug. 2, 2010; 6 pages.
USPTO Final Rejection for U.S. Appl. No. 11/983,291 dated Aug. 12, 2009; 10 pages.
USPTO Final Rejection for U.S. Appl. No. 12/060,176 dated Oct. 12, 2010; 22 pages.
USPTO Final Rejection for U.S. Appl. No. 12/132,527 dated Oct. 14, 2010; 8 pages.
USPTO Final Rejection for U.S. Appl. No. 091989,771 dated Nov. 25, 2009; 12 pages.
USPTO Final Rejection for U.S. Appl. No. 10/137,497 dated May 5, 2005; 13 pages.
USPTO Miscellaneous Action for U.S. Appl. No. 09/943,062 dated Jan. 30, 2006; 2 pages.
USPTO Miscellaneous Action for U.S. Appl. No. 09/989,819 dated Dec. 14, 2001; 1 page.
USPTO Miscellaneous Action for U.S. Appl. No. 10/001,478 dated Feb. 23, 2010; 5 pages.
USPTO Miscellaneous Action for U.S. Appl. No. 10/113,581 dated Jun. 23, 2010; 6 pages.
USPTO Miscellaneous Action for U.S. Appl. No. 10/327,207 dated May 13, 2003; 1 page.
USPTO Miscellaneous Action for U.S. Appl. No. 10/327,217 dated Feb. 10, 2004; 1 page.
USPTO Miscellaneous Action for U.S. Appl. No. 11/201,922 dated Oct. 1, 2009; 2 pages.
USPTO Miscellaneous Action with SSP for U.S. Appl. No. 09/930,021 dated Oct. 1, 2001; 1 page.
USPTO Non-Final Office Action Dated Nov. 17, 2005 for U.S. Appl. No. 10/002,217.
USPTO Non-Final Office Rejection for U.S. Appl. No. 10/002,217 dated Oct. 2, 2006; 21 pages.
USPTO Non-Final Office Rejection for U.S. Appl. No. 10/002,217 dated May 19, 2005; 15 pages.
USPTO Non-Final Rejection, Dated Nov. 14, 2006 for U.S. Appl. No. 09/946,801.
USPTO Non-Final Rejection Dated Oct. 4, 2007 for U.S. Appl. No. 09/946,601.
USPTO Non-Final Rejection Dated Sep. 21, 2005 for U.S. Appl. No. 09/948,601.
USPTO Non-Final Rejection for 09/975,105 dated Jan. 19, 2006; 5 pages.
USPTO Non-Final Rejection for 09/975,105 dated Apr. 19, 2005; 9 pages.
USPTO Non-Final Rejection for 09/975,115 dated Jan. 7, 2008; 30 pages.
USPTO Non-Final Rejection for U.S. Appl. No. 10/001,477 dated May 11, 2005; 31 pages.
USPTO Non-Final Rejection for U.S. Appl. No. 10/002,217 dated Aug. 3, 2007; 10 pages.
USPTO Notice of Allowance for U.S. Appl. No. 09/994,600 dated Nov. 12, 2008; 35 pages.
USPTO Notice of Allowance for U.S. Appl. No. 10/001,477 dated Nov. 10, 2008; 13 pages.
USPTO Notice of Allowance for U.S. Appl. No. 11/709,866 dated Feb. 16, 2010; 7 pages.
USPTO Notice of Allowance for U.S. Appl. No. 11/709,866 dated Apr. 7, 2009; 8 pages.
USPTO Notice of Allowance for U.S. Appl. No. 11/709,866 dated Aug. 4, 2009; 7 pages.
USPTO Notice of Allowance for U.S. Appl. No. 11/799,439 dated Feb. 5, 2010; 4 pages.
USPTO Notice of Ailowance for U.S. Appl. No. 11/799,439 dated Jun. 25, 2009; 6 pages.
USPTO Notice of Allowance for U.S. Appl. No. 11/850,260 dated Jul. 2, 2010; 8 pages.
USPTO Notice of Allowance for U.S. Appl. No. 11/965,291 dated Jan. 13, 2010; 4 pages.
USPTO Notice of Allowance for U.S. Appl. No. 11/965,291 dated May 5, 2009; 7 pages.
USPTO Notice of Allowance for U.S. Appl. No. 11/965,677 dated Feb. 12, 2010; 4 pages.
USPTO Notice of Allowance for U.S. Appl. No. 11/965,677 dated Sep. 10, 2009; 6 pages.
USPTO Notice of Allowance for U.S. Appl. No. 11/983,291 dated Oct. 22, 2009; 7 pages.
USPTO Notice of Allowance for U.S. Appl. No. 11/985,340 dated Feb. 19, 2010; 8 pages.
USPTO Notice of Allowcance for U.S. Appl. No. 11/985,340 dated Jun. 2, 2009, 7 pages.
USPTO Notice of Allowance for U.S. Appl. No. 11/985,340 dated Jun. 9, 2010; 8 pages.
USPTO Notice of Allowance for U.S. Appl. No. 11/985,340 dated Nov. 9, 2009; 7 pages.
USPTO Notice of Allowance for U.S. Appl. No. 11/986,336 dated Feb. 16, 2010; 4 pages.
USPTO Notice of Allowance for U.S. Appl. No. 11/986,338 dated Oct. 19, 2009; 4 pages.
USPTO Notice of Allowance for U.S. Appl. No. 11/986,338 dated May 7, 2009; 1 page.
USPTO Notice of Allowance for U.S. Appl. No. 12/057,149 dated Nov. 30, 2010; 7 page.
USPTO Notice of Allowance for U.S. Appl. No. 12/060,128 dated Oct. 19, 2009; 8 pages.
USPTO Notice of Allowance for U.S. Appl. No. 12/104,672 dated Jan. 11, 2010; 7 page.

USPTO Notice of Allowance for U.S. Appl. No. 12/218,404 dated Feb. 16, 2010; 7 pages.
USPTO Notice of Allowance for U.S. Appl. No. 12/218,404 dated Mar. 19, 2009; 7 pages.
USPTO Notice of Allowance for U.S. Appl. No. 12/218,404 dated Jul. 10, 2009; 7 pages.
USPTO Notice of Allowance for U.S. Appl. No. 12/218,404 dated Nov. 3, 2009; 8 pages.
USPTO Requirement for Restriction for U.S. Appl. No. 11/985,340 dated Mar. 16, 2009; 7 pages.
USPTO Requirement for Restriction/Election for U.S. Appl. No. 09/969,313 dated Mar. 16, 2005; 6 pages.
USPTO Requirement for Restriction/Election for U.S. Appl. No. 09/972,003 dated May 6, 2004; 4 pages.
USPTO Requirement for Restriction/Election for U.S. Appl. No. 11/337,272 dated Sep. 11, 2006; 5 pages.
USPTO Requirement for Restriction/Election for U.S. Appl. No. 11/818,005 dated Jul. 14, 2009; 5 pages.
Van Ess, David; "Simulating a 555 Timer with PSoC," Cypress Semiconductor Corporation, Application Note AN2286, May 19, 2005; 10 pages.
Varma et al, "A Structured Test Re-Use Methodology for Core-Based System Chips," IEEE, 1998; 9 pages.
Vixel, "InSpeed SOC 320 Embedded Storage Switch," 2003, Vixel, pp. 1-5; 5 pages.
Wang, et al, "Synthesizing Operating System Based Device Drivers in Embedded Systems," Oct. 1-3, 2003; ACM, pp. 37-44; 8 pages.
Wikipedia—Main Page, retrieved on Mar. 8, 2006 from http://en.wikipedia,org/wiki/Main_Page and http://en.wikipedia.org/wiki/Wikipedia:Introduction; 5 pages.
Wikipedia—Processor register, retrieved on Mar. 7, 2006 from http://en.wikipedia.org/wiki/Processor_register; 4 pages.
Wikipedia "XML" retrieved on Jan. 29, 2007 from http://en.wikipedia.org/wiki/XML; 16 pages.
Wikipedia.org; "Von Neumann architecture"; retrieved from http://en.wikipedia.org/wiki/Von_Neumann_architecture on Jan. 22, 2007; 4 pages.
Written Opinion of the International Searching Authority for International Application No. PCT/US08/60681 dated Sep. 12, 2008; 4 pages.
Written Opinion of the International Searching Authority for International Application No. PCT/US08/60695 dated Jul. 22, 2009; 6 pages.
Written Opinion of the International Searching Authority for International Application No. PCT/US08/60696 dated Sep. 22, 2008; 4 pages.
Xerox, "Mesa Debugger Documentation," Apr. 1979; Xerox Systems Development Department; Version 5.0, pp. 1-30, 33 pages.
Xilinx, Virtex-II Pro Platform FPGA Developer's Kit, "How Data2BRAM Fits in with Hardware and Software Flows," Chapter 2: Using Data2BRAm Jan. 2003 Release; 2 pages.
Yoo et al., "FastHardware-Software Coverification by Optimistic Execution of Real Processor, Proceedings of Design, Automation and Test in Europe Conference and Exhibition," Mar. 2000, pp. 663-668; 6 pages.
York et al., "On-chip Support Needed for SOC Debug," Electronic Engineering Times, Jun. 1999, pp. 104, 110; 2 pages.
Zorian et al., "Testing Embedded-Core Based System Chips," IEEE, 1998; 14 pages.
Zorian, "Test Requirements for Embedded Core-based Systems and IEEE P1500," IEEE, 1997; 9 pages.
USPTO U.S. Appl. No. 10/803,030, "Programmable Microcontrollable Architecture (Mixed Analog/Digital)," Snyder et al., filed Mar. 16, 2004; 40 pages.
USPTO U.S. Appl. No. 10/871,582, "LVDS Input Circuit with Extended Common Mode Range," Reinschmidt et al., filed Jun. 17, 2004; 25 pages.
USPTO U.S. Appl. No. 11/125,554, "A Method for a Efficient Supply to a Microcontroler," Kutz et al., filed May 9, 2005; 41 pages.
USPTO U.S. Appl. No. 11/132,894, "Open Loop Bandwidth Test Architecture and Method for Phase Locked Loop (PLL)," Jonathon Stiff, filed May 19, 2005; 38 pages.
USPTO U.S. Appl. No. 11/201,922, "Design model for a hardware device-independent method of defining embedded firmware for programmable systems," McDonald et al., filed Aug. 10, 2005; 31 pages.
USPTO U.S. Appl. No. 11/273,708, "Capacitance Sensor Using Relaxation Oscillators," Snyder et al., filed Nov. 14, 2005, 33 pages.
USPTO U.S. Appl. No. 11/322,044, "Split charge pump PLL architecture," Jonathon Stiff, filed Dec. 28, 2005; 19 pages.
USPTO U.S. Appl. No. 11/337,272, "Successive Approximate Capacitance Measurement Circuit;" Warren Snyder, filed Jan. 20, 2006, 29 pages.
USPTO U.S. Appl. No. 11/415,588, "Voltage Controlled Oscillator Delay Cell and Method," Sivadasani et al., filed May 1, 2006; 24 pages.
USPTO U.S. Appl. No. 11/844,100, "Differential-to-single ended signal converter circuit and method," Jonathon Stiff, filed Dec. 21, 2006; 33 pages.
USPTO U.S. Appl. No. 11/898,66, "Configurable Bus," Kutz et al., filed Jan. 25, 2007; 35 pages.
USPTO U.S. Appl. No. 11/709,866, "input/Output Multiplexer Bus," Dennis Sequine, filed Feb. 21, 2007; 33 pages.
USPTO U.S. Appl. No. 11/850,260, "Circuit and Method for Improving the Accuracy of a Crystal-less Oscillator Having Dual-Frequency Modes," Wright et al., filed Sep. 5, 2007; 33 pages.
USPTO U.S. Appl. No. 11/983,291, "Successive Approximate Capacitance Measurement Circuit," Warren Snyder, filed Nov. 7, 2007; 26 pages.
USPTO U.S. Appl. No. 12/218,404, "Voltage Controlled Oscillator Delay Cell and Method," Sivadasan et al., filed Jul. 14, 2008; 23 pages.
USPTO Ex Parte Qualyle Action for U.S. Appl. No. 09/992,076 dated Jun. 18, 2007; 6 pages.
USPTO Ex Parte Quayle Action for U.S. Appl. No. 09/975,115 dated Aug. 20, 2009; 7 pages.
USPTO Final Rejection for U.S. Appl. No. 09/975,105 dated Jul. 13, 2006; 7 pages.
USPTO Final Rejection for U.S. Appl. No. 09/975,115 dated Feb. 21, 2007; 25 pages.
USPTO Final Rejection for U.S. Appl. No. 09/975,115 dated May 12, 2008; 33 pages.
USPTO Final Rejection for U.S. Appl. No. 09/975,115 dated Jun. 23, 2006; 20 pages.
USPTO Final Rejection for U.S. Appl. No. 09/989,765 dated Mar. 31, 2009; 18 pages.
USPTO Final Rejection for U.S. Appl. No. 09/989,765 dated Apr. 3, 2007; 12 pages.
USPTO Final Rejection for U.S. Appl. No. 09/989,765 dated Apr. 4, 2008; 16 pages.
USPTO Final Rejection for U.S. Appl. No. 09/989,765 dated Apr. 17, 2006; 12 pages.
USPTO Final Rejection for U.S. Appl. No. 09/969,767 dated Jan. 11, 2007; 12 pages.
USPTO Final Rejection for U.S. Appl. No. 09/969,767 dated Jan. 15, 2009; 21 pages.
USPTO Final Rejection for U.S. Appl. No. 09/989,767 dated Mar. 6, 2006; 15 pages.
USPTO Final Rejection for U.S. Appl. No. 09/989,767 dated Apr. 6, 2005; 13 pages.
USPTO Final Rejection for U.S. Appl. No. 09/989,787 dated Dec. 27, 2007; 21 pages.
USPTO Final Rejection for U.S. Appl. No. 09/989,771 dated Feb. 27, 2007; 8 pages.
USPTO Final Rejection for U.S. Appl. No. 09/989,771 dated Mar. 28, 2006; 9 pages.
USPTO Final Rejection for U.S. Appl. No. 09/989,771 dated Apr. 6, 2005; 7 pages.
USPTO Final Rejection for U.S. Appl. No. 09/989,771 dated Dec. 10, 2008; 12 pages.
USPTO Final Rejection for U.S. Appl. No. 09/989,771 dated Dec. 27, 2007; 15 pages.
USPTO Final Rejection for U.S. Appl. No. 09/989,777 dated Jan. 30, 2008; 14 pages.
USPTO Final Rejection for U.S. Appl. No. 09/969,777 dated Mar. 13, 2007; 24 pages.

USPTO Final Rejection for U.S. Appl. No. 09/969,777 dated Dec. 21, 2005; 29 pages.
USPTO Final Rejection for U.S. Appl. No. 09/989,778 dated Mar. 16, 2009; 26 pages.
USPTO Final Rejection for U.S. Appl. No. 09/989,778 dated Jan. 8, 2009; 25 pages.
USPTO Final Rejection for U.S. Appl. No. 09/989,778 dated Feb. 5, 2007; 17 pages.
USPTO Final Rejection for U.S. Appl. No. 09/989,778 dated Feb. 15, 2006; 9 pages.
USPTO Final Rejection for U.S. Appl. No. 09/989,778 dated Dec. 20, 2007; 14 pages.
USPTO Final Rejection for U.S. Appl. No. 09/989,782 dated Jul. 9, 2008; 10 pages.
USPTO Final Rejection for U.S. Appl. No. 09/989,782 dated Jul. 24, 2007; 9 pages.
USPTO Final Rejection for U.S. Appl. No. 09/989,782 dated Sep. 21, 2006; 10 pages.
USPTO Non-Final Rejection for U.S. Appl. No. 09/922,579 dated Aug. 18, 2004; 6 pages.
USPTO Non-Final Rejection for U.S. Appl. No. 09/923,461 dated Jul. 16, 2004; 6 pages.
USPTO Non-Final Rejection for U.S. Appl. No. 09/929,891 dated Sep. 13, 2004; 6 pages.
USPTO Non-Final Rejection for U.S. Appl. No. 09/930,021 dated Apr. 26, 2004; 6 pages.
USPTO Non-Final Rejection for U.S. Appl. No. 09/943,062 dated Jan. 27, 2003; 7 pages.
USPTO Non-Final Rejection for U.S. Appl. No. 09/943,062 dated Jun. 22, 2007; 12 pages.
USPTO Non-Final Rejection for U.S. Appl. No. 09/943,062 dated Sep. 11, 2002; 9 pages.
USPTO Non-Final Rejection for U.S. Appl. No. 09/943,062 dated Dec. 8, 2003; 9 pages.
USPTO Non-Final Rejection for U.S. Appl. No. 09/943,149 dated Aug. 28, 2003; 9 pages.
USPTO Non-Final Rejection for U.S. Appl. No. 09/943,149 dated Nov. 20, 2012; 7 pages.
USPTO Non-Final Rejection for U.S. Appl. No. 09/953,423 dated Feb. 6, 2004; 5 pages.
USPTO Non-Final Rejection for U.S. Appl. No. 09/957,084 dated Aug. 23, 2002; 6 pages.
USPTO Non-Final Rejection for U.S. Appl. No. 09/957,084 dated Aug. 27, 2003; 8 pages.
USPTO Non-Final Rejection for U.S. Appl. No. 09/969,311 dated Sep. 21, 2004; 4 pages.
USPTO Non-Final Rejection for U.S. Appl. No. 09/969,311 dated Nov. 6, 2002; 8 pages.
USPTO Non-Final Rejection for U.S. Appl. No. 09/969,313 dated May 6, 2005; 9 pages.
USPTO Non-Final Rejection for U.S. Appl. No. 09/972,003 dated Feb. 2, 2004; 10 pages.
USPTO Non-Final Rejection for U.S. Appl. No. 09/972,003 dated Aug. 19, 2003; 11 pages.
USPTO Non-Final Rejection for U.S. Appl. No. 09/972,133 dated Mar. 8, 2005; 9 pages.
USPTO Non-Final Rejection for U.S. Appl. No. 09/972,133 dated Nov. 25, 2005; 9 pages.
USPTO Non-Final Rejection for U.S. Appl. No. 09/972,319 dated Sep. 16, 2004; 9 pages.
USPTO Non-Final Rejection for U.S. Appl. No. 09/975,030 dated Mar. 29, 2005; 13 pages.
USPTO Non-Final Rejection for U.S. Appl. No. 09/975,030 dated Oct. 20, 2005; 7 pages.
USPTO Non-Final Rejection for U.S. Appl. No. 09/975,104 dated Mar. 21, 2005; 7 pages.
USPTO Non-Final Rejection for U.S. Appl. No. 09/975,104 dated Jun. 16, 2006; 8 pages.
USPTO Non-Final Rejection for U.S. Appl. No. 09/975,104 dated Aug. 16, 2005; 6 pages.
USPTO Non-Final Rejection for U.S. Appl. No. 09/975,338 dated Apr. 30, 2010; 2 pages.
USPTO Non-Final Rejection for U.S. Appl. No. 09/975,338 dated Aug. 14, 2007; 19 pages.
USPTO Non-Final Rejection for U.S. Appl. No. 09/975,338 dated Sep. 6, 2006; 11 pages.
USPTO Non-Final Rejection for U.S. Appl. No. 09/969,570 dated Jan. 2, 2003; 7 pages.
USPTO Non-Final Rejection for U.S. Appl. No. 09/989,570 dated Jan. 26, 2005; 9 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Non-Final Rejection for U.S. Appl. No. 09/989,571 dated May 23, 2005; 8 pages.
USPTO Non-Final Rejection for U.S. Appl. No. 09/989,571 dated Jul. 12, 2004; 9 pages.
USPTO Non-Final Rejection for U.S. Appl. No. 09/989,761 dated Mar. 10, 2004; 6 pages.
USPTO Non-Final Rejection for U.S. Appl. No. 09/989,761 dated Apr. 18, 2003; 5 pages.
USPTO Non-Final Rejection for U.S. Appl. No. 09/989,762 dated Jul. 23, 2007; 15 pages.
USPTO Non-Final Rejection for U.S. Appl. No. 09/989,762 dated Jul. 27, 2005; 15 pages.
USPTO Non-Final Rejection for U.S. Appl. No. 09/989,762 dated Aug. 10, 2006; 18 pages.
USPTO Non-Final Rejection for U.S. Appl. No. 09/989,767 dated May 12, 2009; 21 pages.
USPTO Non-Final Rejection for U.S. Appl. No. 09/989,767 dated Jul. 9, 2010; 22 pages.
USPTO Non-Final Rejection for U.S. Appl. No. 09/989,767 dated Oct. 6, 2004; 15 pages.
USPTO Non-Final Rejection for U.S. Appl. No. 09/989,771 dated Apr. 30, 2009; 11 pages.
USPTO Non-Final Rejection for U.S. Appl. No. 09/989,771 dated Jul. 20, 2010; 12 pages.
USPTO Non-Final Rejection for U.S. Appl. No. 09/989,782 dated Oct. 27, 2009; 9 pages.
USPTO Non-Final Rejection for U.S. Appl. No. 09/989,808 dated Apr. 14, 2005; 8 pages.
USPTO Non-Final Rejection for U.S. Appl. No. 09/989,808 dated Oct. 19, 2005; 8 pages.
USPTO Non-Final Rejection for U.S. Appl. No. 09/989,817 dated Jan. 12, 2005; 5 pages.
USPTO Non-Final Rejection for U.S. Appl. No. 09/989,817 dated Jun. 8, 2004; 7 pages.
USPTO Non-Final Rejection for U.S. Appl. No. 09/989,819 dated Jul. 13, 2004; 4 pages.
USPTO Non-Final Rejection for U.S. Appl. No. 09/994,601 dated Jul. 9, 2009; 11 pages.
USPTO Non-Final Rejectioln for U.S. Appl. No. 09/998,848 dated Jun. 21, 2010; 15 pages.
USPTO Non-Final Rejection for U.S. Appl. No. 09/998,848 dated May 12, 2009; 16 pages.
USPTO Non-Final Rejection for U.S. Appl. No. 10/001,478 dated Jan. 30, 2008; 19 pages.
USPTO Non-Final Rejection for U.S. Appl. No. 10/001,478 dated Mar. 15, 2006; 19 pages.
USPTO Non-Final Rejection for U.S. Appl. No. 10/001,478 dated Apr. 2, 2007; 17 pages.
USPTO Non-Final Rejection for U.S. Appl. No. 10/001,478 dated May 16, 2005; 13 pages.
USPTO Non-Final Rejection for U.S. Appl. No. 10/001,478 dated Aug. 4, 2009; 17 pages.
USPTO Non-Final Rejection for U.S. Appl. No. 10/001,478 dated Oct. 20, 2008; 18 pages.
USPTO Non-Final Rejection for U.S. Appl. No. 10/001,568 dated May 19, 2005; 16 pages.
USPTO Non-Final Rejection for U.S. Appl. No. 10/002,726 dated Jun. 10, 2005; 10 pages.
USPTO Non-Final Rejection for U.S. Appl. No. 10/002,726 dated Aug. 28, 2006; 10 pages.

USPTO Non-Final Rejection for U.S. Appl. No. 10/002,726 dated Dec. 13, 2004; 7 pages.
USPTO Non-Final Rejection for U.S. Appl. No. 10/004,039 dated Apr. 11, 2006; 14 pages.
USPTO Non-Final Rejection for U.S. Appl. No. 10/004,039 dated Jun. 6, 2005; 17 pages.
USPTO Non-Final Rejection for U.S. Appl. No. 10/004,197 dated Apr. 3, 2006; 13 pages.
USPTO Non-Final Rejection for U.S. Appl. No. 10/004,197 dated Jun. 6, 2005; 21 pages.
USPTO Non-Final Rejection for U.S. Appl. No. 10/011,214 dated Aug. 13, 2004; 10 pages.
USPTO Non-Final Rejection for U.S. Appl. No. 10/109,979 dated Jun. 30, 2005; 6 pages.
USPTO Non-Final Rejection for U.S. Appl. No. 10/113,064 dated Apr. 6, 2006; 19 pages.
USPTO Non-Final Rejection for U.S. Appl. No. 10/113,064 dated Apr. 25, 2005; 15 pages.
USPTO Non-Final Rejection for U.S. Appl. No. 10/113,581 dated Jan. 10, 2007; 14 pages.
USPTO Non-Final Rejection for U.S. Appl. No. 10/113,581 dated Feb. 24, 2006; 11 pages.
USPTO Non-Final Rejection for U.S. Appl. No. 10/113,581 dated Aug. 12, 2005; 12 pages.
USPTO Non-Final Rejection for U.S. Appl. No. 10/113,581 dated Sep. 1, 2009; 18 pages.
USPTO Non-Final Rejection for U.S. Appl. No. 10/113,581 dated Nov. 26, 2008; 20 pages.
USPTO Non-Final Rejection for U.S. Appl. No. 10/113,581 dated Nov. 27, 2007; 15 pages.
USPTO Non-Final Rejection for U.S. Appl. No. 10/137,497 dated Aug. 2, 2008; 21 pages.
USPTO Non-Final Rejection for U.S. Appl. No. 10/137,497 dated Sep. 22, 2005; 21 pages.
USPTO Non-Final Rejection for U.S. Appl. No. 10/137,497 dated Nov. 5, 2004; 17 pages.
USPTO Non-Final Rejection for U.S. Appl. No. 10/226,911 dated Mar. 19, 2004; 6 pages.
USPTO Non-Final Rejection for U.S. Appl. No. 10/256,829 dated Jan. 7, 2009; 7 pages.
USPTO Non-Final Rejection for U.S. Appl. No. 10/256,829 dated May 3, 2006; 16 pages.
USPTO Non-Final Rejection for U.S. Appl. No. 10/256,829 dated Jun. 28, 2008; 11 pages.
USPTO Non-Final Rejection for U.S. Appl. No. 10/256,829 dated Jul. 28, 2005; 14 pages.
USPTO Non-Final Rejection for U.S. Appl. No. 10/256,829 dated Oct. 26, 2009; 8 pages.
USPTO Non-Final Rejection for U.S. Appl. No. 10/256,829 dated Nov. 2, 2006; 13 pages.
USPTO Non-Final Rejection for U.S. Appl. No. 10/272,231 dated Jul. 14, 2003; 6 pages.
USPTO Non-Final Rejection for U.S. Appl. No. 10/293,392 dated Oct. 16, 2003; 6 pages.
USPTO Non-Final Rejection for U.S. Appl. No. 10/305,589 dated Oct. 7, 2003; 6 pages.
USPTO Non-Final Rejection for U.S. Appl. No. 10/324,455 dated Aug. 21, 2003; 4 pages.
USPTO Non-Final Rejection for U.S. Appl. No. 10/324,455 dated Nov. 6, 2003; 4 pages.
USPTO Non-Final Rejection for U.S. Appl. No. 10/327,207 dated Jul. 21, 2006; 12 pages.
USPTO Notice of Allowance for U.S. Appl. No. 09/912,768 dated Sep. 13, 2005; 5 pages.
USPTO Notice of Allowance for U.S. Appl. No. 09/922,579 dated Dec. 28, 2004; 6 pages.
USPTO Notice of Allowance for U.S. Appl. No. 09/923,461 dated May 12, 2005; 6 pages.
USPTO Notice of Allowance for U.S. Appl. No. 09/929,891 dated Jun. 15, 2005; 6 pages.
USPTO Notice of Allowance for U.S. Appl. No. 09/929,891 dated Dec. 23, 2005; 4 pages.
USPTO Notice of Allowance for U.S. Appl. No. 09/930,021 dated Nov. 26, 2004; 4 pages.
USPTO Notice of Allowance for U.S. Appl. No. 09/943,062 dated Jun. 29, 2010; 4 pages.
USPTO Notice of Allowance for U.S. Appl. No. 09/943,149 dated Jan. 12, 2004; 7 pages.
USPTO Notice of Allowance for U.S. Appl. No. 09/953,423 dated Jul. 12, 2004, 6 pages.
USPTO Notice of Allowance for U.S. Appl. No. 09/957,084 dated May 18, 2004; 5 pages.
USPTO Notice of Allowance for U.S. Appl. No. 09/969,311 dated Mar. 1, 2005; 4 pages.
USPTO Notice of Allowance for U.S. Appl. No. 09/969,313 dated Oct. 4, 2005; 6 pages.
USPTO Notice of Allowance for U.S. Appl. No. 09/972,003 dated Jul. 14, 2004; 4 pages.
USPTO Notice of Allowance for U.S. Appl. No. 09/972,133 dated Jun. 9, 2006; 6 pages.
USPTO Notice of Allowance for U.S. Appl. No. 09/972,319 dated Dec. 30, 2004; 4 pages.
USPTO Notice of Allowance for U.S. Appl. No. 09/975,030 dated Feb. 6, 2006; 7 pages.
USPTO Notice of Allowance for U.S. Appl. No. 09/975,104 dated Oct. 19, 2006; 6 pages.
USPTO Notice of Allowance for U.S. Appl. No. 09/975,115 dated Jan. 29, 2010; 9 pages.
USPTO Notice of Allowance for U.S. Appl. No. 09/977,111 dated Sep. 28, 2006; 6 pages.
USPTO Notice of Allowance for U.S. Appl. No. 09/989,570 dated May 19, 2005; 4 pages.
USPTO Notice of Allowance for U.S. Appl. No. 09/989,570 dated Sep. 10, 2004; 8 pages.
USPTO Notice of Allowance for U.S. Appl. No. 09/989,571 dated Sep. 13, 2005; 6 pages.
USPTO Notice of Allowance for U.S. Appl. No. 09/989,761 dated Jan. 14, 2005; 6 pages.
USPTO Notice of Allowance for U.S. Appl. No. 09/989,762 dated May 27, 2010; 6 pages.
USPTO Notice of Allowance for U.S. Appl. No. 09/989,762 dated Jul. 16, 2009; 6 pages.
USPTO Notice of Allowance for U.S. Appl. No. 09/989,762 dated Sep. 16, 2010; 6 pages.
USPTO Notice of Allowance for U.S. Appl. No. 09/989,762 dated Oct. 30, 2009; 6 pages.
USPTO Notice of Allowance for U.S. Appl. No. 09/989,762 dated Jan. 2, 2008; 6 pages.
USPTO Notice of Allowance for U.S. Appl. No. 09/989,762 dated Feb. 22, 2010; 7 pages.
USPTO Notice of Allowance for U.S. Appl. No. 09/989,762 dated Mar. 25, 2009; 7 pages.
USPTO Notice of Allowance for U.S. Appl. No. 09/989,762 dated Jun. 2, 2008; 6 pages.
USPTO Notice of Allowance for U.S. Appl. No. 09/989,762 dated Oct. 24, 2008; 7 pages.
USPTO Notice of Allowance for U.S. Appl. No. 09/989,765 dated Mar. 31, 2010; 8 pages.
USPTO Notice of Allowance for U.S. Appl. No. 09/989,765 dated Sep. 3, 2009; 7 pages.
USPTO Notice of Allowance for U.S. Appl. No. 09/989,765 dated Dec. 22, 2009; 8 pages.
USPTO Notice of Allowance for U.S. Appl. No. 09/989,777 dated Jan. 15, 2010; 8 pages.
USPTO Notice of Allowance for U.S. Appl. No. 09/989,777 dated Aug. 6, 2009; 8 pages.
USPTO Notice of Allowance for U.S. Appl. No. 09/989,777 dated Mar. 9, 2009; 7 pages.
USPTO Notice of Allowance for U.S. Appl. No. 09/989,808 dated Feb. 13, 2006; 4 pages.
USPTO Notice of Allowance for U.S. Appl. No. 09/989,817 dated May 9, 2005; 6 pages.
USPTO Notice of Allowance for U.S. Appl. No. 09/989,819 dated Jan. 11, 2005; 7 pages.

USPTO Notice of Allowance for U.S. Appl. No. 09/992,076 dated Dec. 27, 2009; 6 pages.
USPTO Notice of Allowance for U.S. Appl. No. 09/994,600 dated Jan. 4, 2010; 4 pages.
USPTO Notice of Allowance for U.S. Appl. No. 09/994,600 dated Apr. 3, 2009; 5 pages.
USPTO Notice of Allowance for U.S. Appl. No. 09/994,600 dated Aug. 25, 2009; 4 pages.
USPTO Notice of Allowance for U.S. Appl. No. 09/998,848 dated Oct. 13, 2010; 4 pages.
USPTO Notice of Allowance for U.S. Appl. No. 10/001,477 dated Mar. 23, 2010; 6 pages.
USPTO Notice of Allowance for U.S. Appl. No. 10/001,477 dated Aug. 26, 2009; 6 pages.
USPTO Non-Final Rejection for U.S. Appl. No. 10/001,477 dated May 11, 2005; 10 pages.
USPTO Non-Final Rejection for U.S. Appl. No. 09/998,859 dated May 28, 2003; 6 pages.
USPTO Non-Final Rejection for U.S. Appl. No. 09/998,859 dated Nov. 4, 2004; 6 pages.
USPTO Non-Final Rejection for U.S. Appl. No. 10/001,477 dated Jan. 22, 2007; 15 pages.
USPTO Non-Final Rejection for U.S. Appl. No. 10/001,477 dated Mar. 2, 2006; 14 pages.
USPTO Non-Final Rejection for U.S. Appl. No. 10/001,477 dated Dec. 6, 2007; 13 pages.
USPTO Non-Final Rejection for U.S. Appl. No. 10/002,217 dated Apr. 3, 2006; 12 pages.
USPTO Non-Final Rejection for U.S. Appl. No. 10/002,217 dated May 19, 2005; 15 pages.
USPTO Non-Final Rejection for U.S. Appl. No. 10/002,217 dated Oct. 2, 2006; 21 pages.
USPTO Non-Final Rejection for U.S. Appl. No. 10/008,096 dated Mar. 7, 2007; 19 pages.
USPTO Non-Final Rejection for U.S. Appl. No. 10/008,096 dated Apr. 17, 2006; 18 pages.
USPTO Non-Final Rejection for U.S. Appl. No. 10/008,096 dated Jun. 14, 2004; 24 pages.
USPTO Non-Final Rejection for U.S. Appl. No. 10/008,096 dated Jun. 24, 2005; 15 pages.
USPTO Non-Final Rejection for U.S. Appl. No. 10/008,096 dated Dec. 12, 2007; 14 pages.
USPTO Non-Final Rejection for U.S. Appl. No. 10/033,027 dated Apr. 20, 2005; 20 pages.
USPTO Non-Final Rejection for U.S. Appl. No. 10/033,027 dated Apr. 26, 2006; 26 pages.
USPTO Non-Final Rejection for U.S. Appl. No. 10/033,027 dated Oct. 18, 2004; 17 pages.
USPTO Non-Final Rejection for U.S. Appl. No. 10/033,027 dated Dec. 18, 2008; 5 pages.
USPTO Non-Final Rejection for U.S. Appl. No. 10/033,027 dated Dec. 21, 2006; 31 pages.
USPTO Non-Final Rejection for U.S. Appl. No. 10/113,065 dated May 20, 2005; 14 pages.
USPTO Non-Final Rejection for U.S. Appl. No. 10/238,966 date Apr. 6, 2006; 8 pages.
USPTO Non-Final Rejection for U.S. Appl. No. 10/238,966 dated Apr. 19, 2007; 7 pages.
USPTO Non-Final Rejection for U.S. Appl. No. 10/238,966 dated Jun. 30, 2008; 12 pages.
USPTO Non-Final Rejection for U.S. Appl. No. 10/238,966 dated Oct. 20, 2006; 8 pages.
USPTO Non-Final Rejection for U.S. Appl. No. 10/238,966 dated Dec. 26, 2007; 12 pages.
USPTO Non-Final Rejection for U.S. Appl. No. 09/404,891 dated Jan. 5, 2004; 5 pages.
USPTO Non-Final Rejection for U.S. Appl. No. 09/404,891 dated Mar. 5, 2003; 6 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Oct. 11, 2002; 5 pages.
USPTO Non-Final Rejection for U.S. Appl. No. 09/475,808 dated Jun. 6, 2001; 6 pages.
USPTO Non-Final Rejection for U.S. Appl. No. 09/475,879 dated Mar. 8, 2001; 6 pages.
USPTO Non-Final Rejection for U.S. Appl. No. 09/826,397 dated Apr. 21, 2004; 6 pages.
USPTO Non-Final Rejection for U.S. Appl. No. 09/855,868 dated Aug. 26, 2004; 7 pages.
USPTO Non-Final Rejection for U.S. Appl. No. 09/875,599 dated Mar. 31, 2006; 18 pages.
USPTO Non-Final Rejection for U.S. Appl. No. 09/875,599 dated Oct. 27, 2003; 13 pages.
USPTO Non-Final Rejection for U.S. Appl. No. 09/875,599 dated Dec. 3, 2004; 16 pages.
USPTO Non-Final Rejection for U.S. Appl. No. 09/887,923 dated May 25, 2004; 7 pages.
USPTO Non-Final Rejection for U.S. Appl. No. 09/887,955 dated May 26, 2004; 5 pages.
USPTO Non-Final Rejection for U.S. Appl. No. 09/893,048 dated Jan. 12, 2006, 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Non-Final Rejection for U.S. Appl. No. 09/893,050 dated Jan. 5, 2005; 13 pages.
USPTO Non-Final Rejection for U.S. Appl. No. 09/893,050 dated Jan. 15, 2004; 9 pages.
USPTO Non-Final Rejection for U.S. Appl. No. 09/909,047 dated Jul. 6, 2004; 9 pages.
USPTO Non-Final Rejection for U.S. Appl. No. 09/912,768 dated Apr. 11, 2005; 14 pages.
USPTO Non-Final Rejection for U.S. Appl. No. 09/912,768 dated Jun. 22, 2004; 11 pages.
USPTO U.S. Appl. No. 09/855,868: "Protecting Access to Microcontroller Memory Blocks," Warren Snyder, filed May 14, 2001; 28 pages.
USPTO U.S. Appl. No. 09/887,923: "Novel Method and System for Interacting between a Processor and a Power on Reset to Dynamically Control Power States in a Microcontroller," Kutz et al., filed Jun. 22, 2001; 44 pages.
USPTO U.S. Appl. No. 09/887,955: "Novel Power on Reset Circuit for Microcontroller," Kutz et al., filed Jun. 22, 2001; 42 pages.
USPTO U.S. Appl. No. 09/893,048: "A Microcontroller having an On-Chip High Gain Amplifier," Kutz et al., filed Jun. 26, 2001; 22 pages.
USPTO U.S. Appl. No. 09/893,161: "Architecture of a PLL with Dynamic Frequency Control on a PLD," Michael T. Moore, filed Jun. 27, 2001; 32 pages.
USPTO U.S. Appl. No. 09/912,768: "A Microcontroller having a Dual Mode Relax Oscillator that is Trimmable," James Shutt; filed Jul. 24, 2001; 33 pages.
USPTO U.S. Appl. No. 09/922,419: "A Power Supply Pump Circuit for a Microcontroller," Kutz et al., filed Aug. 3, 2001; 38 pages.
USPTO U.S. Appl. No. 09/922,579: "A Method for a Efficient Supply to a Microcontroller," Kutz et al., filed Aug. 3, 2001; 37 pages.
USPTO U.S. Appl. No. 09/923,461: "Non-Interfering Multiply-Mac (Multiply Accumulate) Circuit," Warren Snyder, filed Aug. 6, 2001; 25 pages.
USPTO U.S. Appl. No. 09/935,454: "Method and Apparatus for Local and Global Power Management in a Programmable Analog Circuit," Monte Mar, filed Aug. 22, 2001; 56 pages.
USPTO U.S. Appl. No. 09/943,149: "Method for Phase Locking in a Phase Lock Loop," Moyal et al., filed Aug. 30, 2001; 25 pages.
USPTO U.S. Appl. No. 09/972,003: "Test Architecture for Microcontroller Providing for a Serial Communication Interface," Warren Snyder, filed Oct. 5, 2001; 32 pages.
USPTO U.S. Appl. No. 09/972,133: "Method for Entering Circuit Test Mode," Warren Snyder, filed Oct. 5, 2001; 30 pages.

USPTO U.S. Appl. No. 09/972,319: "Method for Applying Instructions to Microprocessor in Test Mode," Warren Snyder, filed Oct. 5, 2001; 31 pages.
USPTO U.S. Appl. No. 09/973,535: "Architecture for Decimation Algorithm," Warren Snyder, filed Oct. 9, 2001; 26 pages.
USPTO U.S. Appl. No. 09/975,030: "Emulator Chip-Board Architecture for Interface," Snyder et al., filed Oct. 10, 2001; 37 pages.
USPTO U.S. Appl. No. 09/975,104: "Capturing Test/Emulation and Enabling Real-Time Debugging Using FPGA for In-Circuit Emulation," Warren Snyder, filed Oct. 10, 2001; 35 pages.
USPTO U.S. Appl. No. 09/975,105: "Host to FPGA Interface in an In-Circuit Emulation System," Craig Nemecek, filed Oct. 10, 2001; 44 pages.
USPTO U.S. Appl. No. 09/975,338: "Method for Breaking Execution of a Test Code in DUT and Emulator Chip Essentially Simultaneously and Handling Complex Breakpoint Events," Nemecek et al., filed Oct. 10, 2001; 34 pages.
USPTO U.S. Appl. No. 09/977,111: "A Frequency Doubler Circuit with Trimmable Current Control," Shutt et al., filed Oct. 11, 2001; 35 pages.
USPTO U.S. Appl. No. 09/981,448: "Oscillator Tuning Method," Lane T. Hauck, filed Oct. 17, 2001; 28 pages.
USPTO U.S. Appl. No. 09/989,574: "Method and System for using a Graphics user Interface for Programming an Electronic Device," Bartz et al., filed Nov. 19, 2001; 43 pages.
USPTO U.S. Appl. No. 09/989,761: "Storing of global parameter defaults and using them over two or more design projects," Ogami et al., filed Nov. 19, 2001; 37 pages.
USPTO U.S. Appl. No. 09/989,762: "System and Method for Performing Next Placements and Pruning of Disallowed Placements for Programming an Integrated Circuit;" Ogami et al., filed Nov. 19, 2001; 43 pages.
USPTO U.S. Appl. No. 09/989,781: "System and method for decoupling and iterating resources associated with a module," Ogami et al., filed Nov. 19, 2001; 40 pages.
USPTO U.S. Appl. No. 09/989,808: "Automatic generation of application program interfaces, source code, interrupts, and data sheets for microcontroller programming," Bartz et al., filed Nov. 19, 2001; 67 pages.
USPTO U.S. Appl. No. 09/989,815: "A Data Driven Method and System for Monitoring Hardware Resource Usage for Programming an Electric Device," Bartz et al., filed Nov. 19, 2001; 36 pages.
USPTO U.S. Appl. No. 09/989,816: "Datasheet Browsing and Creation with Data-Driven Datasheet Tabs within a Microcontroller Design Tool," Bartz et al., filed Nov. 19, 2001; 55 pages.
USPTO U.S. Appl. No. 09/989,819: "System and method for creating a boot file utilizing a boot template," Ogami et al., filed Nov. 19, 2001; 43 pages.
USPTO U.S. Appl. No. 09/998,834: "A System and a Method for Communication between and Ice and a Production Microcontroller while in a Halt State," Craig Nemecek, filed Nov. 15, 2001; 33 pages.
USPTO U.S. Appl. No. 09/998,859: "A System and a Method for Checking Lock Step Consistency between in Circuit Emulation and a Microcontroller while Debugging Process is in Progress," Craig Nemecek, filed Nov. 15, 2001; 33 pages.
USPTO U.S. Appl. No. 10/000,383: "System and Method of Providing a Programmable Clock Architecture for an Advanced Microcontroller," Sullam et al., filed Oct. 24, 2001; 34 pages.
USPTO U.S. Appl. No. 10/001,477: "Breakpoint Control in an In-Circuit Emulation System," Roe et al., filed Nov. 1, 2001; 43 pages.
USPTO U.S. Appl. No. 10/001,478: "In-Circuit Emulator and POD Synchronized Boot," Nemecek et al., filed Nov. 1, 2001; 44 pages.
USPTO U.S. Appl. No. 10/001,568: "Combined In-Circuit Emulator and Programmer," Nemecek et al., filed Nov. 1, 2001; 47 pages.
USPTO U.S. Appl. No. 10/002,217: "Conditional Branching in an In-Circuit Emulation System," Craig Nemecek, filed Nov. 1, 2001; 43 pages.
USPTO U.S. Appl. No. 10/004,039: "In-Circuit Emulator with Gatekeeper for Watchdog Timer," Nemecek et al., filed Nov. 14, 2001; 46 pages.
USPTO U.S. Appl. No. 10/004,197: "In-Circuit Emulator with Gatekeeper Based Halt Control," Nemecek et al., filed Nov. 14, 2001; 47 pages.
USPTO U.S. Appl. No. 10/011,214: "Method and Circuit for Synchronizing a Write Operation between an On-Chip Microprocessor and an On-Chip Programmable Analog Device Operating at Different Frequencies," Sullam et al., filed Oct. 25, 2001; 49 pages.
USPTO U.S. Appl. No. 10/083,442: "Method/Architecture for a Low Gain PLL with Wide Frequency Range," Meyers et al., filed Feb. 26, 2002; 28 pages.
USPTO U.S. Appl. No. 10/109,979: "Graphical user interface with logic unifying functions," Anderson et al., filed Mar. 29, 2002; 100 pages.
USPTO U.S. Appl. No. 10/113,064: "Method and System for Debugging through Supervisory Operating Codes and Self Modifying Codes," Roe et al., filed Mar. 29, 2002; 36 pages.
USPTO U.S. Appl. No. 10/113,065: "System and Method for Automatically Matching Components in a Debugging System," Nemecek et al., filed Mar. 29, 2002; 32 pages.
USPTO U.S. Appl. No. 10/226,911: "Calibration of Integrated Circuit Time Constants," Gehring et al.; filed Aug. 22, 2002; 32 pages.
USPTO U.S. Appl. No. 10/272,231: "Digital Configurable Macro Architecture," Warren Snyder, filed Oct. 15, 2002; 36 pages.
USPTO U.S. Appl. No. 10/288,003: "Low Voltage Differential Signal Driver Circuit and Method," Roper et al., filed Nov. 4, 2002; 30 pages.
USPTO U.S. Appl. No. 10/293,392: "Low Voltage Receiver Circuit and Method for Shifting the Differential Input Signals of the Receiver Depending on a Common Mode Voltage of the Input Signals," Maher et al., filed Nov. 13, 2002; 23 pages.
USPTO U.S. Appl. No. 10/305,589: "Current Controlled Delay Circuit," Jonathon Stiff, filed Nov. 26, 2002; 24 pages.
USPTO U.S. Appl. No. 10/324,455: "Programmable Oscillator Scheme," Mar et al., filed Dec. 20, 2002; 23 pages.
USPTO U.S. Appl. No. 10/327,217: "Single Ended Clock Signal Generator Having a Differential Output," Richmond et al., filed Dec. 20, 2002; 27 pages.
USPTO Advisory Action for U.S. Appl. No. 09/998,848 dated Sep. 7, 2005; 3 pages.
USPTO Advisory Action for U.S. Appl. No. 10/001,477 dated Oct. 10, 2008; 3 pages.
USPTO Advisory Action for U.S. Appl. No. 09/475,879 dated Mar. 4, 2002; 3 pages.
USPTO Advisory Action for U.S. Appl. No. 09/475,879 dated Dec. 31, 2001; 3 pages.
USPTO Advisory Action for U.S. Appl. No. 09/875,599 dated Jun. 8, 2005; 3 pages.
USPTO Advisory Action for U.S. Appl. No. 09/943,062 dated Mar. 27, 2008; 3 pages.
USPTO Advisory Action for U.S. Appl. No. 09/943,062 dated Sep. 25, 2003; 3 pages.
USPTO Advisory Action for U.S. Appl. No. 09/969,311 dated Jul. 21, 2003; 2 pages.
USPTO Advisory Action for U.S. Appl. No. 09/972,133 dated Aug. 31, 2005; 3 pages.
USPTO Advisory Action for U.S. Appl. No. 09/975,338 dated May 15, 2006; 4 pages.
USPTO Advisory Action for U.S. Appl. No. 09/989,570 dated Aug. 14, 2003; 3 pages.
USPTO Advisory Action for U.S. Appl. No. 09/989,771 dated Feb. 3, 2010; 3 pages.
USPTO Advisory Action for U.S. Appl. No. 09/989,778 dated Jun. 17, 2009; 3 pages.
USPTO Advisory Action for U.S. Appl. No. 09/994,601 dated Mar. 23, 2010; 2 pages.
USPTO Advisory Action for U.S. Appl. No. 09/998,848 dated Feb. 24, 2010; 3 pages.
USPTO Advisory Action for U.S. Appl. No. 10/001,478 dated Jun. 30, 2009; 3 pages.
USPTO Advisory Action for U.S. Appl. No. 11/166,622 dated May 27, 2009; 3 pages.
USPTO Advisory Action for U.S. Appl. No. 11/200,619 dated May 11, 2009; 3 pages.
USPTO Advisory Action for U.S. Appl. No. 11/201,627 dated Aug. 5, 2010; 3 pages.

USPTO Advisory Action for U.S. Appl. No. 11/201,627 dated Sep. 21, 2009; 3 pages.
USPTO Advisory Action for U.S. Appl. No. 11/322,044 dated Nov. 30, 2007; 2 pages.
USPTO Advisory Action for U.S. Appl. No. 11/337,272 dated Apr. 3, 2007; 3 pages.
USPTO Advisory Action for U.S. Appl. No. 11/415,588 dated Jan. 14, 2008; 3 pages.
USPTO Advisory Action for U.S. Appl. No. 11/644,100 dated Feb. 9, 2009; 3 pages.
USPTO Advisory Action for U.S. Appl. No. 11/644,100 dated Jul. 21, 2010; 3 pages.
USPTO Advisory Action for U.S. Appl. No. 11/698,660 dated Jul. 31, 2009; 3 pages.
USPTO Advisory Action for U.S. Appl. No. 11/698,660 dated Nov. 10, 2010; 3 pages.
USPTO Advisory Action for U.S. Appl. No. 11/799,439 dated Mar. 20, 2009; 3 pages.
USPTO Advisory Action for U.S. Appl. No. 11/818,005 dated Jul. 30, 2010; 3 pages.
USPTO Advisory Action for U.S. Appl. No. 11/850,260 dated Nov. 2, 2009; 3 pages.
USPTO Advisory Action for U.S. Appl. No. 12/136,577 dated Oct. 29, 2010; 3 pages.
USPTO Advisory Action for U.S. Appl. No. 09/994,601 dated May 23, 2006; 3 pages.
USPTO U.S. Appl. No. 08/865,342: "Programmable Clock Generator," Mann et al., filed May 29, 1997; 41 pages.
USPTO U.S. Appl. No. 09/047,595: "Roving Range Control to Limit Receive PLL Frequency of Operation," Paul H. Scott, filed Mar. 29, 1998; 35 pages.
USPTO U.S. Appl. No. 09/048,905: "Programmable Clock Generator," Mann et al., filed Mar. 26, 1998; 42 pages.
USPTO U.S. Appl. No. 09/216,460: "Circuit and Method for Controlling an Output of a Ring Oscillator," Abugharbieh et al., filed Dec. 18, 1998; 21 pages.
USPTO U.S. Appl. No. 09/275,336: "Programmable Oscillator Scheme," Mar et al., filed Mar. 24, 1999; 25 pages.
USPTO U.S. Appl. No. 09/398,956: "Frequency Acquisition Rate Control in Phase Lock Loop Circuits," Moyal et al., filed Sep. 17, 1999; 35 pages.
USPTO U.S. Appl. No. 09/404,891: "Method, Architecture and Circuitry for Controlling Pulse Width in a Phase and/or Frequency Detector," Scott et al., filed Sep. 24, 1999; 17 pages.
USPTO U.S. Appl. No. 09/470,665: "Digital Phase/Frequency Detector, and Clock Generator and Data Recovery PLL Containing the Same," Kamal Dalmia, filed Dec. 23, 1999; 26 pages.
USPTO U.S. Appl. No. 09/471,576: "Reference-Free Clock Generation and Data Recovery PLL," Kamal Dalmia, filed Dec. 23, 1999; 30 pages.
USPTO U.S. Appl. No. 09/471,914: "Reference-Free Clock Generator and Data Recovery PLL," Dalmia et al., filed Dec. 23, 1999; 32 pages.
USPTO U.S. Appl. No. 09/475,808: "Configurable Memory for Programmable Logic Circuits," Lacey et al., filed Dec. 30, 1999; 24 pages.
USPTO U.S. Appl. No. 09/475,879: "Programmable Logic Device," Lacey et al.; filed Dec. 30, 1999; 50 pages.
USPTO U.S. Appl. No. 09/538,989: "Memory Based Phase Locked Loop," Rengarajan S. Krishnan, filed Mar. 30, 2000; 27 pages.
USPTO U.S. Appl. No. 09/608,753: "PLL Lockout Watchdog," Wilson et al., filed Aug. 24, 2004; 24 pages.
USPTO U.S. Appl. No. 09/721,316: "Programmable Oscillator Scheme," Mar et al., filed Nov. 22, 2000; 26 pages.
USPTO U.S. Appl. No. 09/826,397: "Method and Circuit for Allowing a Microprocessor to Change its Operating Frequency on-the-Fly," Bert Sullam, filed Apr. 2, 2001; 24 pages.
USPTO U.S. Appl. No. 09/849,164: "Reduced Static Phase Error CMOS PLL Charge Pump," Jonathon Stiff, filed May 4, 2001; 30 pages.
International Search Report for International Application No. PCT/US08/60696 dated Sep. 22, 2008; 2 pages.
International Search Report for International Application No. PCT/US10/33626 mailed Jun. 24, 2010; 3 pages.
International Search Report from the International Search Authority for International Application No. PCT/US08/60680 dated Aug. 15, 2008; 4 pages.
International Search Report of the International Searching Authority for International Application No. PCT/US08/60681 dated Sep. 12, 2008; 2 pages.
International Search Report of the International Searching Authority for International Application No. PCT/US08/60695 dated Jul. 22, 2009; 3 pages.
International Search Report of the International Searching Authority for International Application No. PCT/US08/60698 dated Sep. 5, 2008; 2 pages.
International Written Opinion of the International Searching Authority for International Application No. PCT/US2006/09572 dated Jan. 10, 2008; 7 pages.
Ito et al., "A Comparison of Microcontrollers Targeted to FPGA-Based Embedded Applications", Sep. 2000, Proceedings of 13th Symposium on Integrated Circuits and Systems Design, Sep. 18-24, 2000, pp. 397-402; 6 pages.
John Mangino, "Using DMA with High Performance Peripherals to Maximize System Performance," 2007, Texas Instruments, pp. 1-23; 23 pages.
Jonathan B. Rosenburg, "How Debuggers Work" John Wiley & Sons, Inc. 1996; 259 pages.
Julio Faura et al.; "A Novel Mixed Signal Programmable Device With On-Chip Microprocessor", 1997, IEEE 1997 Custom Integrated Circuits Conference, pp. 103-106; 4 pages.
Jung et al., "A Register File with Transposed Access Mode," 2000, IEEE; 2 pages.
Khan et al.; "FPGA Architectures for Asic Hardware Emulators"; IEEE 1993, pp. 336-340; 5 pages.
Kutz et al., "Novel Method and System for Interaction Between a Processor and a Power on Reset Circuit to Dynamically Control Power States in a Microcontroller", Jun. 22, 2001, U.S. Appl. No. 09/887,923.
Larsson, "A 2-1600-MHz CMOS Clock Recovery PLL with Low-V dd Capability," IEEE Journal of Solid-State Circuits, vol. 34, No. 12, Dec. 1999; 10 pages.
Lee, Mark; "EMC Design Considerations for PSoC CapSense Applications," Cypress Semiconductor Corporation, Application Note AN2318; Sep. 16, 2005; 6 pages.
Lutovac et al. "Symbolic Computation of Digital Filter Transfer Function Using MATLAB," Proceedings of 23rd International Conference on Microelectronics, vol. 2 NIS, Yugoslavia, May 2002, pp. 651-654; 4 pages.
M. Mooris Mano, "Computer System Architecture," 1982, Prentice-Hall, 2nd Edition, pp. 261-264 and 435-440; 14 pages.
Maneatis, "Low-Jitter Process-Independent DLL and PLL Based on Self-Biased Techniques," IEEE Journal of Solid-State Circuits, vol. 31, No. 11, Nov. 1996, pp. 1723-1732; 10 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, vol. 45 No. 3, Feb. 3, 2000, pp. 129-138; 7 pages.
Microsoft Computer Dictionary "ActiveX" 2002; Microsoft Press; 5th Edition; 3 pages.
Microsoft Press Computer User's Dictionary; 1998; 3 pages. (including page 18).
Monte Mar et al., "An architecture for a configurable Mixed-signal device", 2003, IEEE Journal of Solid-State Circuits, vol. 3, pp. 565-568; 4 pages.
Morrison, Gale, "IBM Eyes Merchant Packaging Services," Jul. 13, 2998, Electronic News, available at http://www.findarticles.com; 4 pages.
Nam et al., "Fast Development of Source-Level Debugging System Using Hardware Emulation," IEEE, 2000, pp. 400-404; 4 pages.
Nouta et al. "Design and FPGA—Implementation of Wave Digital Bandpass Filters with Arbitrary Amplitude Transfer Characteristics," Proceedings of IEEE International Symposium on Industrial Electronics; 1998, vol. 2; 5 pages.

Oh et al., Emulator Environment Based on an FPGA Prototyping Board, IEEE, Jun. 21-23, 2000, pp. 72-77; 6 pages.
Papachristou et al., "Microprocessor Based Testing for Core-Based System on a Chip," IEEE, 1999; 6 pages.
PCT International Search Report for PCT/US05/28791, filed Aug. 12, 2005, mailed Mar. 31, 2008; 4 pages.
PCT International Written Opinion for PCT/US05/28791, filed Aug. 12, 2005, mailed Mar. 31, 2008; 8 pages.
PCT Written Opinion of the International Searching Authority for PCT/US2005/028793, filed Aug. 12, 2005, mailed Nov. 19, 2007; 7 pages.
UPTO Final Rejection for U.S. Appl. No. 09/975,338 dated Jan. 31, 2008; 21 pages.
PSoC Designer: Integrated Development Environment, User Guide Revision 1.09, Cypress MicroSystems, Inc., May 30, 2001.
Robert A. Blauschild, "WP 3.5: An Integrated Time Reference," ISSCC94/Session 3, Analog Techniques/Paper WP 3.5, Feb. 1994, pp. 56-58; 4 pages.
Robinson, Gordon D., "Why 1149.1 (JTAG) Really Works", May 1994, Conference Proceedings Electro/94 International, May 10-12, 1994, Combined Volumes, pp. 749-754; 6 pages.
Sedra, Adel S. et al., "Microelectronic Circuits," 3rd Edition, Oxford University Press, pp. xiii-xx and 861-883, 1991; 20 pages.
Seguine, Ryan; "Layout Guidelines for PSoC CapSense," Cypress Semiconductor Corporation, Application Note AN2292; Jul. 22, 2005; 13 pages.
Shahbahrami et al., "Matrix Register File and Extended Subwords: Two Techniques for Embedded Media Processors," ACM, May 2005; 9 pages.
Snyder et al., "Xilinx's A-to-Z Systems Platform" Cahners Microprocessor, The Insider's Guide to Microprocessor Hardware, Feb. 6, 2001; 9 pages.
Song et al., "A 50% Power Reduction Scheme for CMOS Relaxation Oscillator," IEEE, 1999, pp. 154-157; 4 pages.
Specks et al., "A Mixed Digital-Analog 16B Microcontroller with 0.5MB Flash Memory, On-Chip Power Supply, Physical Nework Interface, and 40V I/O for Automotive Single-Chip Mechatronics," IEEE, Feb. 9, 2000; 1 page.
Stallman et al.; "Debugging with the GNU Source-Level Debugger"; Jan. 1994; retrieved on May 2, 2005 from http://www.cs.utah.edu; 4 pages.
Stan Augarten; "The Chip Collection-Introduction—Smithsonian Institute"; "State of the Art"; "The First 256-Bit Static RAM"; retrieved on Nov. 14, 2005 from http://smithsonianchips.si.edu/augarten/p24.htm; 2 pages.
Stephen Walters, "Computer-Aided Prototyping for ASIC-Based Systems," 1991, IEEE Design & Test of Computers, vol. 8, Issue 2, pp. 4-10; 8 pages.
The Provisional Application U.S. Appl. No. 60/243,708: "Advanced Programmable Microcontroller Device," Snyder et al., filed Oct. 26, 2000; 277 pages.
The Written Opinion of the International Search Report for International Application No. PCT/US10/33626 mailed Jun. 24, 2010; 5 pages.
Tran et al., "Fine Pitch and Wirebonding and Reliability of Aluminum Capped Copper Bond Pads," May 2000, IEEE Electronic Components and Technology Conference, pp. 1674-1680; 7 pages.
USPTO Advisory Action for U.S. Appl. No. 09/989,778 dated May 15, 2006; 4 pages.
U.S. Appl. No. 12/356,468: "System and Method for Dynamically Generating a Configuration Datasheet," Anderson et al.; filed Jan. 20, 2009; 27 pages.
U.S. Appl. No. 12/765,400: "Autonomous Control in a Programmable System," Sullam et al., filed Apr. 22, 2010; 30 pages.
Ashok Bindra, "Programmable SoC Delivers A New Level of System Flexibility"; Electronic Design; Nov. 6, 2000; 11 pages.
Atmel Corporation: AT90SC Summary: "Secure Microcontrollers for Smart Cards," Oct. 1999; 7 pages.
Azim et al., "A Custom DSP Chip to Implement a Robot Motion Controller Proceedings of the IEEE Custom Integrated Circuits Conference," May 1988, pp. 8.7.1-8.7.5; 6 pages.
Bakker et al., "Micropower CMOS Temperature Sensor with Digital Output," IEEE Journal of Solid-State Circuits, Jul. 1996; 3 pages.

Balough et al., "White Paper: Comparing IP Integration Approaches for FPGA Implementation," Feb. 2007, Version 1.1, Altera, pp. 1-7; 7 pages.
Bauer et al.; "A Reconfigurable Logic Machine for Fast Event-Driven Simulation"; Jun. 1998; Design Automation Conference Proceedings; 8 pages.
Burogs et al., "Power Converter Analysis and Design using Matlab: A Transfer Function Approach," Proceedings of IEEE International Symposium on Industrial Electronics 1998, vol. 2, pp. 552-557; 6 pages.
Bursky, "FPGA Combines Multiple Interfaces and Logic," Electronic Design, vol. 48 No. 20, Oct. 2, 2000, pp. 74-78; 5 pages.
Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
Chapweske, Adam; "The PS/2 Mouse Interface," PS/2 Mouse Interfacing, 2001, retrieved on May 18, 2006; 11 pages.
Charles Melear, "Using Background Modes for Testing, Debugging and Emulation of Microcontrollers," IEEE, 1997, pp. 90-97; 8 pages.
Charles, Jr. et al., "Wirebonding: Reinventing the Process for MCMs," Apr. 1998, IEEE 7th International Conference on Multichip Modules and High Density Packaging, pp. 300-302; 3 pages.
Ching et al., "An In-Curcuit-Emulator for TMS320C25," IEEE, 1994, pp. 51-56; 6 pages.
Cover Pages Technology Reports; XML and Electronic Design Automation (EDA); Aug. 2000; retrieved from http://xml.coverpages.org on Mar. 23, 2005; 5 pages.
Cypress MicroSystem, Inc. "Cypress Customer Forums" retrieved from <http://www.cypress.com/forums/messageview>; Nov. 30, 2004; 1 page.
Cypress MicroSystem, Inc. "PsoC Designer: Integrated Development Environment User Guide"; Rev. 1.18; Sep. 8, 2003; 193 pages.
Cypress MicroSystems, Inc. "Cypress MicroSystems Unveils Programmable System-On-A-Chip for Embedded Internet, Communications, and Consumer Systems" Nov. 13, 2000; 3 pages.
Cypress Semiconductor Corporation, "CY8C21x34 Data Sheet," CSR User Module, CSR V.1.0; Oct. 6, 2005; 36 pages.
Cypress Semiconductor Corporation, "Cypress Introduces PSoC(TM)—Based Capacitive Touch Sensor Solution," Cypress Press Release; May 31, 2005; <http://www.cypress.com/portal/server>; retrieved on Feb. 5, 2007; 4 pages.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC CY8C20x34 Technical Reference Manual (TRM)," PSoC CY8C20x34 TRM, Version 1.0, 2006; 218 pages.
Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "Release Notes srn017," Jan. 24, 2007; 3 pages.
Dahl et al., "Emulation of the Sparcle Microprocessor with the MIT Virtual Wires Emulation System," 1994, IEEE, pp. 14-22; 9 pages.
Daniel B. Sedory, "A Guide to DEBUG," 2004, retrieved on May 20, 2005 from http://www.geocites.com/thestarman3/asm/debug/debug2.htm, pp. 1-11; 7 pages.
Dick Pasternak, "In-Circuit-Emulation in ASIC Architecture Cor Designs," IEEE, 1989, pp. P6-4.1-P6-44; 4 pages.
Dirk Killat, "A One-Chip Solution for Electronic Ballasts in Fluorescent Lamps," Power Electronics, http://powerelectronics.com/mag/power_onechip_solution_electronic/, dated Mar. 1, 2004, accessed Sep. 13, 2005; 4 pages.
Durham et al., "Circuit Architectures for High Linearity Monolithic Continuous-Time Filtering," IEEE, 1992; 7 pages.
Durham et al., "High-Linearity Conitnuous-Time Filter in 5-V VLSI CMOS," IEEE, 1992; 8 pages.
Durham et al., "Integrated Continuous-Time Balanced Filters for 16-bit DSP Interfaces," IEEE, 1993; 6 pages.
Duvvuru et al., "Evaluation of a Branch Target Address Cache," 1995, IEEE, pp. 173-180; 8 pages.

Efstathiou, "Analog Electronics: Basic Circuits of Operational Amplifiers," <http://web.archive.org/web/20021231045232> Dec. 31, 2002, version, retrieved from the Internet Archives; 10 pages.
Electronic Tools Company; E-Studio User Manuel; 2000; retrieved from http://web.archive.org for site http://e-tools.com on Mar. 23, 2005; 77 pages.
Fred Eady, "PSoC 101," Circuit Cellar, Aug. 2004, accessed Sep. 13, 2005, http://www.circuitcellar.com/library/print/0804/eady169/2.htm; 4 pages.
Ganapathy et al., "Hardware Emulation for Functional Verification of K5", Jun. 1996, 33rd Design Automation Conference Proceedings, Jun. 3-7, 1996, pp. 315-318; 4 pages.
Ghosh et al., "A Low Overhead Design for Testability and Test Generation Technique for Core-based Systems," IEEE, 1997; 10 pages.
Haberl et al., "Self Testable Boards with Standard IEEE 1149.5 Module Test and Maintenance (MTM) Bus Interface," IEEE, 1994; 6 pages.
Hamblen, "Rapid Prototyping Using Field-Programmable Logic Devices" Jun. 2000, IEEE; 9 pages.
Harrison et al.; "Xilinx FPGA Design in a Group Environment Using VHDS and Synthesis Tools"; Colloquium on Digital System Design Using Synthesis Techniques; Feb. 15, 1996; 4 pages.
Hintz et al., "Microcontrollers," 1992, McGraw-Hill, pp. 29-37; 11 pages.
Hong et al., "An FPGA-Based Hardware Emulator for Fast Fault Emulation," IEEE, 1997, pp. 345-348; 4 pages.
Hong et al., "Hierarchial System Test by an IEEE 1149.5 MTM-Bus Slave-Module Interface Core," IEEE, 2000; 14 pages.
Hsieh et al., "Modeling Micro-Controller Peripherals for High-Level Co-Simulation and Synthesis," IEEE, 1997, pp. 127-130; 4 pages.
Huang et al., "Iceberg: An Embedded In-Circuit Emulator Synthesizer for Microcontrollers", Proceedings of the 36th Design Automation Conference, Jun. 1999, pp. 580-585; 6 pages.
Hwang et al., "Integrated circuit for automatically varying resistance in computer system, has pair of transistors connected in parallel with respective resistors such that resistors are bypassed when corresponding transistors are enabled," Derwent information Ltd; 2002; 2 pages.
International Search Report and Written Opinion of the International Searching Authority for PCT/US05/28898, filed Aug. 12, 2005, mailed Mar. 6, 2007; 6 pages.
International Search Report for International Application No. PCT/US2006/09572 dated Jan. 10, 2008; 2 pages.
International Search Report for International Application No. PCT/US05/28793 mailed Dec. 6, 2007; 8 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Feb. 11, 2005; 86 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Jul. 31, 2007; 28 pages.
USPTO Non-Final Rejection for U.S. Appl. No. 09/975,115 dated Oct. 9, 2008; 34 pages.
USPTO Non-Final Rejection for U.S. Appl. No. 09/975,115 dated Oct. 31, 2006; 19 pages.
USPTO Non-Final Rejection for U.S. Appl. No. 09/989,765 dated Sep. 19, 2007; 14 pages.
USPTO Non-Final Rejection for U.S. Appl. No. 09/989,765 dated Sep. 26, 2008; 17 pages.
USPTO Non-Final Rejection for U.S. Appl. No. 09/989,765 dated Oct. 2, 2006; 13 pages.
USPTO Non-Final Rejection for U.S. Appl. No. 09/989,765 dated Oct. 5, 2005; 9 pages.
USPTO Non-Final Rejection for U.S. Appl. No. 09/989,767 dated Jul. 2, 2007; 22 pages.
USPTO Non-Final Rejection for U.S. Appl. No. 09/989,767 dated Jul. 17, 2006; 12 pages.
USPTO Non-Final Rejection for U.S. Appl. No. 09/989,767 dated Jul. 24, 2008; 21 pages.
USPTO Non-Final Rejection for U.S. Appl. No. 09/989,771 dated May. 28, 2008; 14 pages.
USPTO Non-Final Rejection for U.S. Appl. No. 09/989,771 dated Jul. 16, 2007; 14 pages.
USPTO Non-Final Rejection for U.S. Appl. No. 09/989,771 dated Aug. 23, 2006; 7 pages.
USPTO Non-Final Rejection for U.S. Appl. No. 09/989,771 dated Sep. 12, 2005; 7 pages.
USPTO Non-Final Rejection for U.S. Appl. No. 09/989,771 dated Sep. 22, 2004; 7 pages.
USPTO Non-Final Rejection for U.S. Appl. No. 09/989,777 dated Apr. 11, 2006; 21 pages.
USPTO Non-Final Rejection for U.S. Appl. No. 09/989,777 dated Jul. 5, 2005; 36 pages.
USPTO Non-Final Rejection for U.S. Appl. No. 09/989,777 dated Sep. 11, 2007; 18 pages.
USPTO Non-Final Rejection for U.S. Appl. No. 09/989,777 dated Sep. 13, 2006; 18 pages.
USPTO Non-Final Rejection for U.S. Appl. No. 09/989,778 dated Mar. 29, 2005; 14 pages.
USPTO Non-Final Rejection for U.S. Appl. No. 09/989,778 dated Jul. 14, 2008; 24 pages.
USPTO Non-Final Rejection for U.S. Appl. No. 09/989,778 dated Jul. 19, 2007; 18 pages.
USPTO Non-Final Rejection for U.S. Appl. No. 09/989,778 dated Sep. 1, 2005; 10 pages.
USPTO Non-Final Rejection for U.S. Appl. No. 09/989,778 dated Sep. 18, 2006; 11 pages.
USPTO Non-Final Rejection for U.S. Appl. No. 09/989,782 dated Jan. 29, 2007; 9 pages.
USPTO Non-Final Rejection for U.S. Appl. No. 09/989,782 dated Mar. 28, 2006; 8 pages.
USPTO Non-Final Rejection for U.S. Appl. No. 09/989,782 dated Apr. 29, 2005; 11 pages.
USPTO Non-Final Rejection for U.S. Appl. No. 09/989,782 dated Oct. 6, 2004; 11 pages.
USPTO Non-Final Rejection for U.S. Appl. No. 09/989,782 dated Nov. 26, 2008; 10 pages.
USPTO Non-Final Rejection for U.S. Appl. No. 09/989,782 dated Dec. 14, 2007; 8 pages.
USPTO Non-Final Rejection for U.S. Appl. No. 09/992,076 dated Jun. 1, 2005; 20 pages.
USPTO Non-Final Rejection for U.S. Appl. No. 09/992,076 dated Aug. 10, 2006; 19 pages.
USPTO Non-Final Rejection for U.S. Appl. No. 09/992,076 dated Nov. 21, 2005; 29 pages.
USPTO Non-Final Rejection for U.S. Appl. No. 09/994,600 dated May 15, 2007; 14 pages.
USPTO Non-Final Rejection for U.S. Appl. No. 09/994,600 dated Jul. 17, 2006; 14 pages.
USPTO Non-Final Rejection for U.S. Appl. No. 09/994,600 dated Aug. 23, 2005; 13 pages.
USPTO Non-Final Rejection for U.S. Appl. No. 09/994,600 dated Oct. 21, 2004; 37 pages.
USPTO Non-Final Rejection for U.S. Appl. No. 09/994,601 dated Oct. 4, 2007; 20 pages.
USPTO Non-Final Rejection for U.S. Appl. No. 09/994,601 dated Sep. 21, 2005; 12 pages.
USPTO Non-Final Rejection for U.S. Appl. No. 09/994,601 dated Nov. 14, 2006; 15 pages.
USPTO Non-Final Rejection for U.S. Appl. No. 09/994,601 dated Jul. 29, 2004; 10 pages.
USPTO Non-Final Rejection for U.S. Appl. No. 09/998,834 dated Sep. 20, 2004; 11 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated Dec. 21, 2004; 14 pages.

USPTO Non-Final Rejection for U.S. Appl. No. 09/998,859 dated May. 15, 2003; 8 pages.
USPTO Non-Final Rejection for U.S. Appl. No. 10/327,207 dated Sep. 20, 2005; 11 pages.
USPTO Non-Final Rejection for U.S. Appl. No. 10/327,217 dated Apr. 30, 2004; 5 pages.
USPTO Non-Final Rejection for U.S. Appl. No. 10/653,050 dated Apr. 6, 2004; 7 pages.
USPTO Non-Final Rejection for U.S. Appl. No. 10/803,030 dated Jun. 8, 2005; 4 pages.
USPTO Non-Final Rejection for U.S. Appl. No. 10/871,582 dated Sep. 7, 2005; 7 pages.
USPTO Non-Final Rejection for U.S. Appl. No. 11/088,028 dated Jun. 16, 2006; 8 pages.
USPTO Non-Final Rejection for U.S. Appl. No. 11/125,554 dated Dec. 11, 2006; 9 pages.
USPTO Non-Final Rejection for U.S. Appl. No. 11/132,894 dated Dec. 19, 2006; 12 pages.
USPTO Non-Final Rejection for U.S. Appl. No. 11/166,622 dated Jun. 22, 2010; 11 pages.
USPTO Non-Final Rejection for U.S. Appl. No. 11/166,622 dated Sep. 29, 2009; 11 pages.
USPTO Non-Final Rejection for U.S. Appl. No. 11/200,619 dated Jun. 17, 2009; 12 pages.
USPTO Non-Final Rejection for U.S. Appl. No. 11/200,619 dated Jun. 27, 2008; 13 pages.
USPTO Non-Final Rejection for U.S. Appl. No. 11/201,627 dated Sep. 30, 2010; 6 pages.
USPTO Non-Final Rejection for U.S. Appl. No. 11/201,627 dated Nov. 16, 2007; 16 pages.
USPTO Non-Final Rejection for U.S. Appl. No. 11/201,627 dated Dec. 12, 2008; 17 pages.
USPTO Non-Final Rejection for U.S. Appl. No. 11/201,627 dated Dec. 24, 2009; 22 pages.
USPTO Non-Final Rejection for U.S. Appl. No. 11/201,922 dated Jun. 11, 2010; 12 pages.
USPTO Non-Final Rejection for U.S. Appl. No. 11/201,922 dated Oct. 15, 2007; 10 pages.
USPTO Non-Final Rejection for U.S. Appl. No. 11/201,922 dated Oct. 21, 2008; 12 pages.
USPTO Non-Final Rejection for U.S. Appl. No. 11/273,708 dated Mar. 19, 2007; 16 pages.
USPTO Non-Final Rejection for U.S. Appl. No. 11/322,044 dated Apr. 11, 2008; 11 pages.
USPTO Non-Final Rejection for U.S. Appl. No. 11/322,044 dated Apr. 24, 2007; 13 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/337,272 dated May 17, 2007; 11 pages.
USPTO Non-Final Rejection for U.S. Appl. No. 11/337,272 dated Oct. 24, 2006; 9 pages.
USPTO Non-Final Rejection for U.S. Appl. No. 11/415,588 dated Jun. 13, 2007; 8 pages.
USPTO Non-Final Rejection for U.S. Appl. No. 11/644,100 dated Mar. 9, 2009; 11 pages.
USPTO Non-Final Rejection for U.S. Appl. No. 11/644,100 dated Apr. 14, 2008; 10 pages.
USPTO Non-Final Rejection for U.S. Appl. No. 11/644,100 dated Sep. 15, 2010; 10 pages.
USPTO Non-Final Rejection for U.S. Appl. No. 11/644,100 dated Dec. 16, 2009; 13 pages.
USPTO Non-Final Rejection for U.S. Appl. No. 11/698,860 dated May 21, 2010; 15 pages.
USPTO Non-Final Rejection for U.S. Appl. No. 11/698,660 dated Oct. 7, 2009; 12 pages.
USPTO Non-Final Rejection for U.S. Appl. No. 11/698,660 dated Dec. 2, 2008; 12 pages.
USPTO Non-Final Rejection for U.S. Appl. No. 11/709,866 dated Nov. 7, 2008; 14 pages.
USPTO Non-Final Rejection for U.S. Appl. No. 11/799,439 dated May 29, 2008; 8 pages.
USPTO Non-Final Rejection for U.S. Appl. No. 11/799,439 dated Nov. 2, 2007; 7 pages.
USPTO Non-Final Rejection for U.S. Appl. No. 11/818,005 dated Oct. 26, 2010; 10 pages.
USPTO Non-Final Rejection for U.S. Appl. No. 11/818,005 dated Nov. 23, 2009; 8 pages.
USPTO Non-Final Rejection for U.S. Appl. No. 11/850,260 dated Jan. 14, 2010; 8 pages.
USPTO Non-Final Rejection for U.S. Appl. No. 11/850,260 dated Mar. 6, 2009; 7 pages.
USPTO Non-Final Rejection for U.S. Appl. No. 11/857,947 dated Feb. 3, 2010; 23 pages.
USPTO Non-Final Rejection for U.S. Appl. No. 11/857,947 dated Mar. 30, 2009; 18 pages.
USPTO Non-Final Rejection for U.S. Appl. No. 11/857,947 dated Jul. 21, 2010; 15 pages.
USPTO Non-Final Rejection for U.S. Appl. No. 11/859,547 dated Oct. 1, 2009; 9 pages.
USPTO Non-Final Rejection for U.S. Appl. No. 11/865, 672 dated Jul. 17, 2009; 6 pages.
USPTO Non-Final Rejection for U.S. Appl. No. 11/965,291 dated Dec. 17, 2008; 8 pages.
USPTO Non-Final Rejection for U.S. Appl. No. 11/965,677 dated Mar. 10, 2009; 10 pages.
USPTO Non-Final Rejection for U.S. Appl. No. 11/967,240 dated Jun. 10, 2009; 7 pages.
USPTO Non-Final Rejection for U.S. Appl. No. 11/967,243 dated Sep. 17, 2009; 9 pages.
USPTO Non-Final Rejection for U.S. Appl. No. 11/968,145 dated Mar. 4, 2010; 11 pages.
USPTO Non-Final Rejection for U.S. Appl. No. 11/983,291 dated Mar. 9, 2009; 9 pages.
USPTO Non-Final Rejection for U.S. Appl. No. 12/058,569 dated Aug. 2, 2010; 9 pages.
USPTO Non-Final Rejection for U.S. Appl. No. 12/060,126 dated Apr. 29, 2009; 11 pages.
USPTO Non-Final Rejection for U.S. Appl. No. 12/060,176 dated Mar. 30, 2010; 22 pages.
USPTO Non-Final Rejection for U.S. Appl. No. 12/104,672 dated Aug. 26, 2009; 11 pages.
USPTO Non-Final Rejection for U.S. Appl. No. 12/104,678 dated Jul. 2, 2010; 8 pages.
USPTO Non-Final Rejection for U.S. Appl. No. 12/132,527 dated Apr. 29, 2010; 7 pages.
USPTO Non-Final Rejection for U.S. Appl. No. 12/136,557 dated Mar. 15, 2010; 10 pages.
USPTO Non-Final Rejection for U.S. Appl. No. 12/218,404 dated Sep. 30, 2008; 8 pages.
USPTO Non-Final Rejection for U.S. Appl. No. 09/975,338 dated Apr. 5, 2005; 13 pages.
USPTO Non-Final Rejection for U.S. Appl. No. 10/288,003 dated Apr. 7, 2004; 9 pages.
USPTO Notice of Allowance for U.S. Appl. No. 09/975,105 dated Dec. 4, 2006; 4 pages.
USPTO Notice of Allowance for U.S. Appl. No. 09/989,777 dated Jul. 7, 2008; 23 pages.
USPTO Notice of Allowance for U.S. Appl. No. 09/989,777 dated Sep. 15, 2008; 28 pages.
USPTO Notice of Allowance for U.S. Appl. No. 09/989,777 dated Nov. 4, 2008; 3 pages.
USPTO Notice of Allowance for U.S. Appl. No. 09/992,076 dated Nov. 13, 2008; 15 pages.
USPTO Notice of Allowance for U.S. Appl. No. 09/992,076 dated Nov. 29, 2007; 8 pages.
USPTO Notice of Allowance for U.S. Appl. No. 09/992,076 dated Mar. 26, 2008; 23 pages.
USPTO Notice of Allowance for U.S. Appl. No. 09/992,076 dated Jul. 29, 2008; 6 pages.
USPTO Notice of Allowance for U.S. Appl. No. 09/994,601 dated Dec. 22, 2008; 15 pages.

USPTO Notice of Allowance for U.S. Appl. No. 09/998,834 dated May 19, 2005; 7 pages.
USPTO Notice of Allowance for U.S. Appl. No. 09/998,859 dated Mar. 14, 2005; 6 pages.
USPTO Notice of Allowance for U.S. Appl. No. 10/001,477 dated Nov. 10, 2008; 7 pages.
USPTO Notice of Allowance for U.S. Appl. No. 10/002,217 dated Jan. 28, 2009; 4 pages.
USPTO Notice of Allowance for U.S. Appl. No. 10/002,217 dated Jun. 6, 2008; 7 pages.
USPTO Notice of Allowance for U.S. Appl. No. 10/008,096 dated Dec. 22, 2008; 24 pages.
USPTO Notice of Allowance for U.S. Appl. No. 10/033,027 dated Mar. 31, 2009; 7 pages.
USPTO Notice of Allowance for U.S. Appl. No. 10/113,065 dated Apr. 6, 2006; 8 pages.
USPTO Notice of Allowance for U.S. Appl. No. 10/238,966 dated Jan. 27, 2009; 4 pages.
USPTO Notice of Allowance for U.S. Appl. No. 09/404,891 dated Mar. 4, 2005; 6 pages.
USPTO Notice of Allowance for U.S. Appl. No. 09/475,808 dated Nov. 6, 2001; 8 pages.
USPTO Notice of Allowance for U.S. Appl. No. 09/475,879 dated Oct. 22, 2004; 7 pages.
USPTO Notice of Allowance for U.S. Appl. No. 09/826,397 dated Oct. 7, 2004; 8 pages.
USPTO Notice of Allowance for U.S. Appl. No. 09/855,868 dated Apr. 25, 2005; 6 pages.
USPTO Notice of Allowance for U.S. Appl. No. 09/875,599 dated Oct. 17, 2006; 4 pages.
USPTO Notice of Allowance for U.S. Appl. No. 09/887,923 dated Sep. 27, 2004; 5 pages.
USPTO Notice of Allowance for U.S. Appl. No. 09/887,955 dated Oct. 12, 2004; 5 pages.
USPTO Notice of Allowance for U.S. Appl. No. 09/893,048 dated Jul. 25, 2006; 4 pages.
USPTO Notice of Allowance for U.S. Appl. No. 09/893,050 dated Jul. 5, 2005; 6 pages.
USPTO Notice of Allowance for U.S. Appl. No. 09/909,047 dated Feb. 15, 2005; 6 pages.
USPTO Notice of Allowance for U.S. Appl. No. 09/909,047 dated May 11, 2005; 25 pages.
USPTO Notice of Allowance for U.S. Appl. No. 10/002,217 dated Oct. 14, 2008.
USPTO Final Rejection for U.S. Appl. No. 09/972,133 dated Mar. 30, 2006; 8 pages.
USPTO Final Rejection for U.S. Appl. No. 09/972,133 dated Jun. 29, 2005; 10 pages.
USPTO Final Rejection for U.S. Appl. No. 09/975,104 dated Feb. 15, 2006; 7 pages.
USPTO Final Rejection for U.S. Appl. No. 09/975,338 dated Jan. 18, 2006; 12 pages.
USPTO Final Rejection for U.S. Appl. No. 09/975,338 dated Jan. 31, 2008; 21 pages.
USPTO Final Rejection for U.S. Appl. No. 09/975,338 dated Feb. 27, 2007; 23 pages.
USPTO Final Rejection for U.S. Appl. No. 09/989,570 dated May 30, 2003; 9 pages.
USPTO Final Rejection for U.S. Appl. No. 09/989,571 dated Jan. 26, 2005; 11 pages.
USPTO Final Rejection for U.S. Appl. No. 09/989,761 dated Aug. 26, 2004; 7 pages.
USPTO Final Rejection for U.S. Appl. No. 09/989,761 dated Oct. 3, 2003; 7 pages.
USPTO Final Rejection for U.S. Appl. No. 09/989,762 dated Jan. 26, 2007; 13 pages.
USPTO Final Rejection for U.S. Appl. No. 09/989,762 dated Mar. 14, 2006; 19 pages.
USPTO Final Rejection for U.S. Appl. No. 09/989,767 dated Dec. 7, 2009; 22 pages.
USPTO Final Rejection for U.S. Appl. No. 09/989,771 dated Nov. 25, 2009; 12 pages.
USPTO Final Rejection for U.S. Appl. No. 09/989,782 dated May 15, 2009; 10 pages.
USPTO Final Rejection for U.S. Appl. No. 09/994,601 dated Jan. 5, 2010; 13 pages.
USPTO Final Rejection for U.S. Appl. No. 09/998,848 dated Dec. 10, 2009; 6 pages.
USPTO Final Rejection for U.S. Appl. No. 10/001,478 dated Apr. 20, 2009; 16 pages.
USPTO Final Rejection for U.S. Appl. No. 10/001,478 dated Jun. 4, 2008; 18 pages.
USPTO Final Rejection for U.S. Appl. No. 10/001,478 dated Sep. 5, 2006; 19 pages.
USPTO Final Rejection for U.S. Appl. No. 10/001,478 dated Sep. 17, 2007; 15 pages.
USPTO Final Rejection for U.S. Appl. No. 10/001,568 dated Oct. 26, 2005; 16 pages.
USPTO Final Rejection for U.S. Appl. No. 10/002,726 dated Mar. 27, 2006; 8 pages.
USPTO Final Rejection for U.S. Appl. No. 10/002,726 dated Nov. 30, 2005; 10 pages.
USPTO Final Rejection for U.S. Appl. No. 10/004,039 dated Nov. 22, 2005; 19 pages.
USPTO Final Rejection for U.S. Appl. No. 10/004,197 dated Nov. 23, 2005; 17 pages.
USPTO Final Rejection for U.S. Appl. No. 10/011,214 dated Jan. 21, 2005; 8 pages.
USPTO Final Rejection for U.S. Appl. No. 10/113,064 dated Oct. 18, 2005; 22 pages.
USPTO Final Rejection for U.S. Appl. No. 10/113,581 dated May 11, 2009; 21 pages.
USPTO Final Rejection for U.S. Appl. No. 10/113,581 dated Jun. 11, 2008; 14 pages.
USPTO Final Rejection for U.S. Appl. No. 10/113,581 dated Jul. 13, 2007; 15 pages.
USPTO Final Rejection for U.S. Appl. No. 10/113,581 dated Aug. 10, 2006; 13 pages.
USPTO Final Rejection for U.S. Appl. No. 10/133,581 dated May 11, 2009; 21 pages.
USPTO Final Rejection for U.S. Appl. No. 10/133,581 dated Jun. 11, 2008; 14 pages.
USPTO Final Rejection for U.S. Appl. No. 10/133,581 dated Jul. 13, 2007; 15 pages.
USPTO Final Rejection for U.S. Appl. No. 10/133,581 dated Aug. 10, 2006; 13 pages.
USPTO Final Rejection for U.S. Appl. No. 10/137,497 dated Mar. 13, 2006; 15 pages.
USPTO Final Rejection for U.S. Appl. No. 10/256,829 dated Jan. 27, 2006; 24 pages.
USPTO Final Rejection for U.S. Appl. No. 10/256,829 dated Jun. 1, 2007; 16 pages.
USPTO Final Rejection for U.S. Appl. No. 10/256,829 dated Jun. 23, 2009; 8 pages.
USPTO Final Rejection for U.S. Appl. No. 10/272,231 dated Nov. 5, 2003; 5 pages.
USPTO Final Rejection for U.S. Appl. No. 10/288,003 dated Oct. 6, 2004; 6 pages.
USPTO Final Rejection for U.S. Appl. No. 10/305,589 dated Oct. 21, 2004; 7 pages.
USPTO Final Rejection for U.S. Appl. No. 10/327,207 dated Mar. 2, 2006; 13 pages.
USPTO Final Rejection for U.S. Appl. No. 10/871,582 dated Feb. 1, 2006; 5 pages.
USPTO Final Rejection for U.S. Appl. No. 11/166,622 dated Mar. 10, 2009; 11 pages.
USPTO Final Rejection for U.S. Appl. No. 11/166,622 dated Mar. 18, 2010; 12 pages.
USPTO Final Rejection for U.S. Appl. No. 11/200,619 dated Jan. 4, 2010; 18 pages.
USPTO Final Rejection for U.S. Appl. No. 11/200,619 dated Mar. 3, 2009; 14 pages.
"An Analog PPL-Based Clock and Data Recovery Circuit with High Input Jitter Tolerance:" Sun; Reprinted from IEEE Journal of Solid-State Circuits, 1989; 4 pages.

"Electronic Circuit Protector-Circuit Breaker;" IBM Technical Disclosure Bulietin; vol. 36, Issue 8, Aug. 1, 1993, 1 page.

"In-Curcuit Emulators—descriptions of the major ICEs around," retrieved on Nov. 14, 2005 from http://11www.algonet.se/~staffann/developer/emulator.htm; 6 pages.

"Microsoft Files Summary Judgement Motions"; Feb. 1999; Microsoft PressPass; retrieved on May 20, 2005 from http://www.microsoft.com/presspass/press/1999/feb99/Feb99/Calderapr.asp; 3 pages.

"New Object Domain R3 Beta Now Available (Build 134)!" Mar. 13, 2001, http://webarchive.org/web/200100331202805/www.object-domain.com/domain3O/index.html; 2 pages.

"OMG XML Metadata Interchange (XMI) Specifications" 2000; 17 pages.

"POD—Piece of Data, Plain Old Documentation, Plain Old Dos . . .", retrieved on Nov. 14, 2005 from hltp://www.auditmypc.com/acronym/POD.asp; 2 pages.

"PSoC Designer: Integrated Development Environment User Guide"; Jul. 17, 2001; Cypress MicroSystems; Revision 1.11; all pages.

"PSoC designer: Integrated development environment, getting started 25-minute tutorial, version 1.0," Cypress Microsystems., Cypress Microsystems, Inc. CMS10006A, Jul. 3, 2001; 25 pages.

"PSoC technology complete changes 8-bit MCU system design", Cypress Microsystems, Inc. retrieved from <http>://www.archive.org/web/20010219005250/http://cypressmicro.com-/t . . . >, Feb. 19, 2001; 21 pages.

"VHDL Samples" retrieved on Jan. 29, 2007 from http://www.csee.umbc.edu/help/VHDL/samples/samples.shtml; 10 pages.

"Webster's Third New International Dictionary," 1996, G. & C. Merriam Company; 3 pages (including pp. 1328-1329).

A.F. Harvey, "DMA Fundamentals on Various PC Platforms," 2001, 2004, National Instruments Corporation, pp. 1-19; 19 pages.

Adham et al., "Preliminary Outline of the IEEE P1500 Scalable Architecture for Testing Embedded Cores," 1999, IEEE; 6 pages.

Andrew S. Tanenbaum with contributions from James R. Goodman, "Structured Computer Organization," 1999, Prentice Hall, Fourth Edition; 32 pages.

Andrews, "Roadmap for Extending IEEE 1149.1 for Hierarchical Control of Locally-Stored, Standardized command Set, Test Programs," IEEE, 1994; 7 pages.

Anonymous, "F/Port:Fast Parallel Pon for the PC" Installation Manual Release 7.1. circa 1997, available for download from http://www.fapo.com/fport.htm; 25 pages.

Anonymous, "JEEN JTAG Embedded Ice Ethernet Interface," Aug. 1999, Embedded Performance, Inc.; 3 pages.

Anonymous, "Lotus Notes FAQ—How do you generate unique document numbers?" Sep. 19, 1999; retrieved from www.keysolutions.com on Jul. 9, 2008; 1 page.

Anonymous, "Warp Nine Engineering—The IEEE 1284 Experts-F/Port Product Sheet," undated web page found at http://www.fapo.com/fport.htm; printed on Apr. 12, 2005; 2 pages.

Anonymous; "Using Debug"; 1999; Prentice-Hall Publishing; 20 pages.

U.S. Appl. No. 09/207,912: "Circuit(s), Architecture and Method(s) for Operating and/or Tuning a Ring Oscillator," Monte Mar, filed Dec. 9, 1998; 23 pages.

U.S. Appl. No. 09/847,281: "Linearized Digital Phase-Locked Loop Method," Witliams et al.; filed Dec. 21, 2000; 29 pages.

U.S. Appl. No. 09/842,968: "Precision Crystal Oscillator Circuit Used in Microcontroller," Monte Mar, filed Apr. 25, 2001; 28 pages.

U.S. Appl. No. 09/943,062: "Apparatus and Method for Programmabie Power Management in a Programmable Analog Circuit Block," Monte Mar, filed Aug. 29, 2001; 46 pages.

U.S. Appl. No. 09/964,991: "A Novel Band-Gap Circuit for Providing an Accurate Reference Voltage Compensated for Process State, Process Variations and Temperature," Kutz et al., filed Sep. 26, 2001; 26 pages.

U.S. Appl. No. 09/989,775: "User defined names for registers in memory banks derived from configurations," Ogami et al., filed Nov. 19, 2001; 29 pages.

U.S. Appl. No. 10/002,726: "Method and Apparatus for Generating Microcontroller Configuration Information," Ogami et al., filed Oct. 24, 2001; 54 pages.

U.S. Appl. No. 10/024,093: "Configurable Memory for Programmable Logic Circuits," Lacey et al., filed Dec. 18, 2001; 25 pages.

U.S. Appl. No. 10/137,497: "Reconfigurable Testing System and Method," Pleis et al.; filed May 1, 2002; 40 pages.

U.S. Appl. No. 10/172,670: "Method and System for Programming a Memory Device," Snyder et al., filed Jun. 13, 2002; 66 pages.

U.S. Appl. No. 10/238,966: "Method for Parameterizing a User Module," Perrin et al., filed Sep. 9, 2002; 41 pages.

U.S. Appl. No. 10/653,050:"Method and System for Programming a Memory Device,"Snyder et al.; filed Aug. 29, 2003; 69 pages.

U.S. Appl. No. 11/088,028: "Method and Circuit for Rapid Alignment of Signals," Moyal et al., filed Nov. 13, 2007; 34 pages.

U.S. Appl. No. 11/168,622: "Touch Wake for Electronic Devices," Beard et al., filed Jun. 23, 2005; 22 pages.

U.S. Appl. No. 11/200,619: "Providing hardware independence to automate code generation of processing device firmware," Snyder et al.; filed Aug. 10, 2005; 41 pages.

U.S. Appl. No. 11/201,627: "Method and an apparatus to design a processing system using a graphical user interface," Ogami et al.; filed Aug. 10, 2005; 37 pages.

U.S. Appl. No. 11/818,005: "Techniques for Generating Microcontroller Configuration Information," Ogami et al., filed Jun. 12, 2007; 61 pages.

U.S. Appl. No. 11/965,291: "Universal Digital Block Interconnection and Channel Routing," Snyder et al., filed Dec. 27, 2007; 31 pages.

U.S. Appl. No. 11/985,340: "Method and Circuit for Rapid Alignment of Signals," Moyal et al., filed Nov. 13, 2007; 34 pages.

U.S. Appl. No. 11/986,338: Reconfigurable Testing System and Method, Pleis et al., filed Nov. 20, 2007; 41 pages.

U.S. Appl. No. 12/004,833: "Systems and Methods for Dynamically Reconfiguring A Programmable System on a Chip," Memula, Suresh et al., filed Dec. 21, 2007; 50 pages.

U.S. Appl. No. 12/057,149: "Power Management Architecture, Method and Configuration System," Kenneth Ogami, filed Mar. 27, 2008; 41 pages.

U.S. Appl. No. 12/058,534:"System And Method for Controlling A Target Device," Kenneth Ogami et al., filed Mar. 28, 2008; 55 pages.

U.S. Appl. No. 12/058,569: "Configuration of Programmable IC Design Eletnents," Best et al., filed Mar. 28, 2008; 19 pages.

U.S. Appl. No. 12/058,586: "System and Method for Monitoring a Target Device," Kenneth Ogami et al., filed Mar. 28, 2008; 56 pages.

USPTO U.S. Appl. No. 09/957,084: "A Crystal-Less Oscillator with Trimmable Analog Current Control for Increased Stability," Mar et al., filed on Sep. 19, 2001; 28 pages.

USPTO U.S. Appl. No. 10/033,027: "Microcontrollable Programmable System on a Chip," Warren Snyder; filed Oct. 22, 2001; 117 pages.

* cited by examiner

SYSTEM AND METHOD FOR PERFORMING NEXT PLACEMENTS AND PRUNING OF DISALLOWED PLACEMENTS FOR PROGRAMMING AN INTEGRATED CIRCUIT

RELATED U.S. PATENT APPLICATION

This Continuation Application claims the benefit and priority to the co-pending, commonly-owned U.S. patent application Ser. No. 09/989,762, filed on Nov. 19, 2001 by Ogami et al., and titled "A system and method for performing next placements and pruning of disallowed placements for programming an integrated circuit," which is incorporated herein by reference.

FIELD OF INVENTION

The invention relates generally to the field of chip design software applications, more particularly to a system and method for placing resources within a chip.

BACKGROUND OF THE INVENTION

It is often useful to utilize chip design application software to layout and plan new chips. This chip design application software is typically configured to aide the user in keeping track of resource requirements of particular modules. Furthermore, chip design application software also allows users to assign chip resources to particular modules.

However, chip design software applications typically have minimal graphical support. They usually are not capable of supplying the user with a graphical display representing a current status of the layout of the resources on a chip. Chip designers are typically required to manually and textually track their layout decisions with minimal graphical support. Further, typical software packages do not give graphical representations of possible placement of resources for unplaced user modules. Additionally, typical software packages also do not provide automated possible placements for user module resources.

Using the conventional art, a chip designer examines the vacant hardware resources and manually determines which hardware resources can be used for which user modules. This task involves manually determining the set of resources available in a hardware block and comparing them to the resources needed for a user module. This manual test is very technically complex and user-prone. Further, because possible placements require a great deal of manual effort, optimization through iteration trial and error is typically never accomplished.

SUMMARY OF THE INVENTION

It is useful to provide a chip designer with a chip design application software that provides the chip designer with an automated placement of user module resource onto the chip given constraints of the chip resources and the requirements of the user module resources. For example, having a placement of resources for a user module automatically be performed without low level programming by a user would be useful. Further, being able offer alternate placement possibilities for resources of user modules would also be beneficial.

A system and method are described for graphically displaying modules and resources within a chip design software application. The system and method provide a data driven model for matching the hardware resource requirements for an associated user module and the available hardware resources on an underlying chip. In this way, possible placements of a user module can be inferred from the data descriptions of the hardware resources and the user modules. In one embodiment, the data descriptions are formatted using XML data. Databases are utilized to describe the hardware resource requirements which are dictated by the particular user module and the available hardware resources of a particular chip. The user module descriptive database can be updated in response to additional user modules being added or changes to the hardware resource requirements of existing user modules. The hardware description database can be updated in response to additional chips being added. Further, the graphical interface relates both a user module and the possible hardware resource. This graphical interface utilizes highlights of both the module and the associated resource in patterns, grayscales, or colors to graphically illustrate the relationship between the module and the associated resource.

User modules may require multiple hardware blocks to implement. In some cases, user modules may require special ports or hardware which will limit the number of hardware blocks that can be used for their implementation. The process of mapping hardware blocks to a user module, such that the user module is realized within the microcontroller, is called "user module placement."

Embodiments of the present invention relate to an automatic process that determines the possible placements of a user module based on (1) its XML user module description and (2) the hardware description of the underlying chip. The potential placement positions are automatically inferred based on the XML input data. Therefore, the placement process of the present invention is data driven from this viewpoint.

In one example, when the next placement icon is selected, a potential placement position is computed based on the XML input data The placement is shown in a graphical hardware layout diagram by highlighting the hardware blocks involved. By clicking the next placement icon, a new placement is then computed and displayed. Placements that are incompatible with the user module requirements are automatically pruned out. In one embodiment, all positions are shown to the user, sequentially, each time the next placement icon is selected. However, if a potential placement involves a hardware block that has already been used (e.g., by another placed user module), then in these cases the placement icon is grayed out indicating that this placement is only valid if the resources were vacant This allows the user to see all possible placements.

An advantage is that the placement process is data driven based on the XML descriptions of the user modules and hardware. The placements that are computed are inferred based on these descriptions.

More specifically, an embodiment of the present invention is drawn to a computer implemented method of determining hardware resources for an electronic design comprising: a) selecting an electronic design represented as a user module; b) accessing a data description of resources required for the user module; c) accessing data descriptions of a plurality of programmable resources of an electronic device; and d) comparing the data description of the user module with the data descriptions of the plurality of programmable resources to automatically determine potential placement options of the user module among the plurality of programmable resources.

Embodiments are also directed to a method as described above and further comprising: displaying on a graphical user interface, a first potential placement of the potential placement options; and in response to a user selecting a next placement icon, displaying on the graphical user interface, a second potential placement of the potential placement options, wherein potential placement options are displayed using visual attributes and wherein the electronic device is a programmable microcontroller device.

Embodiments include the above and wherein the user module requires one or more programmable resource to place and wherein the plurality of programmable resources comprise a plurality of analog programmable resources and a plurality of digital programmable resources.

Embodiments also include the above and wherein the data descriptions are created in XML.

Other aspects and advantages of the invention will become apparent from the following detailed description, taken in conjunction with the accompanying drawings, and illustrated by way of example of the principles of the invention.

DESCRIPTION OF THE INVENTION

Specific reference is made in detail to the embodiments of the invention, examples of which are illustrated in the accompanying drawings. While the invention is described in conjunction with the embodiments, it will be understood that the embodiments are not intended to limit the scope of the invention. The various embodiments are intended to illustrate the invention in different applications. Further, specific details are set forth in the embodiments for exemplary purposes and are not intended to limit the scope of the invention In other instances, well-known methods, procedures, and components have not been described in detail as not to unnecessarily obscure aspects of the invention.

Figure 1:
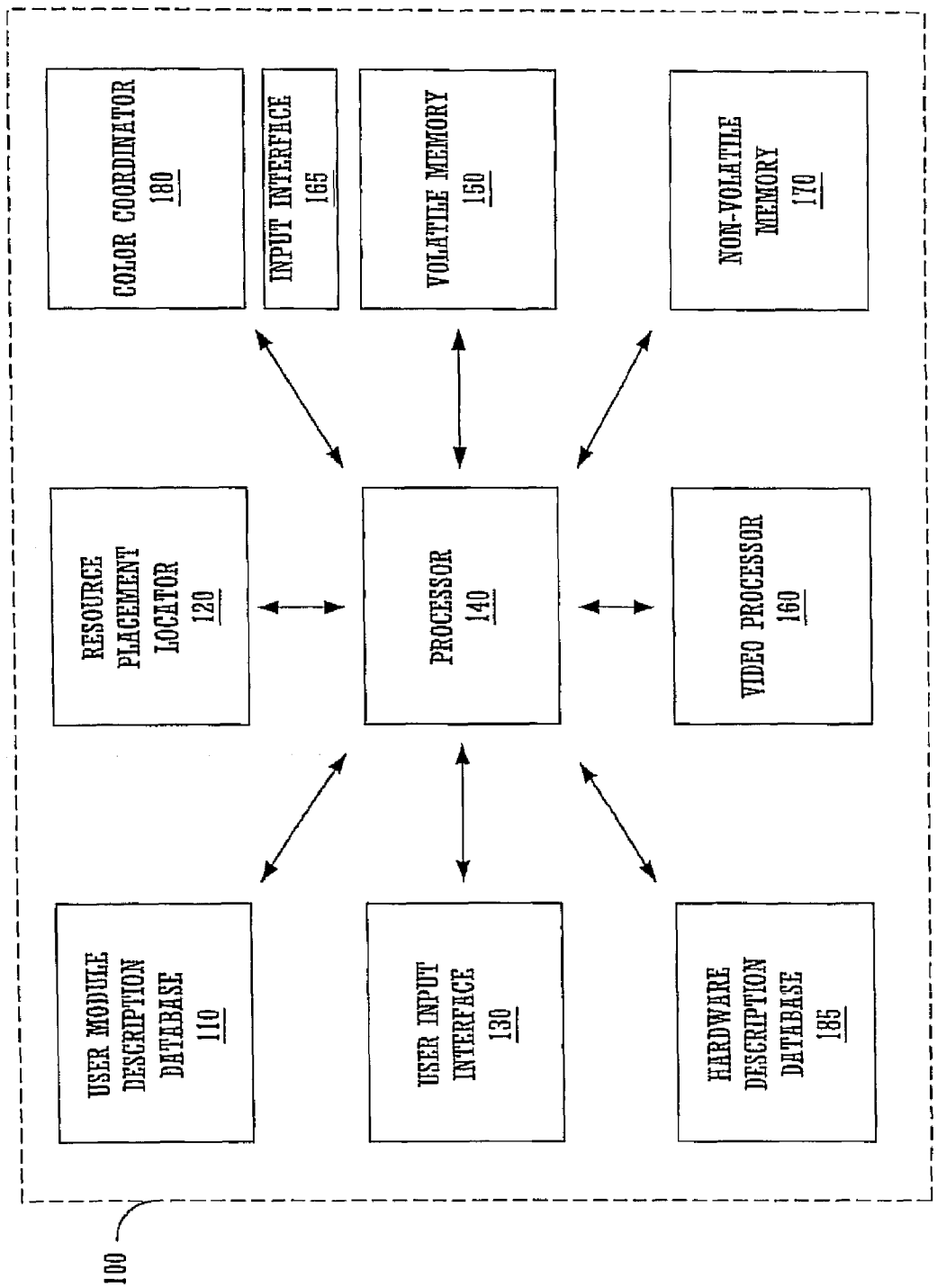
FIG. 1 illustrates a system for coding modules and associated resource(s) in accordance with the invention.

With reference to FIG. 1, a system 100 for utilizing a data driven model for matching the hardware resource requirements for an associated user module and the available hardware resources on an underlying chip is shown. Further, the system 100 graphically illustrates alternative possible placements for user module resources and automatically generates alternative placements for user module resources based on the requirements of the user module and the resource availability on the underlying chip. The system 100 operates within a chip design application to automatically generate possible placements for user module resources based on the requirements of the user module and the resource availability on the chip. Further, the system 100 also operates to graphically display the correlation between an unplaced module and multiple alternate possible resources associated with the unpLaced module. In one embodiment, the graphical correlation between the unplaced module and the possible resources associated with the unplaced module are displayed by use of a corresponding color within the design application.

The system 100 includes a processor 140, a user input interface 130 (e.g., cursor control device and keyboard), volatile memory 150, a video processor 160, and non-volatile memory 170. The input interface 130, the volatile memory 150, the video processor 160, and the non-volatile memory 170 are connected to the processor 140. The input interface 130, the processor 140, the volatile memory 150, the video processor 160, and the non-volatile memory 170 are components that are readily found in personal computer systems.

The system 100 further includes a user module description database 110, a resource placement locator 120, a color coordinator 180, and a hardware description database 185, which are also connected to the processor 140. The components 110, 120, 180, and 185 are merely illustrated in FIG. 1 as one embodiment of the system 100. Although the components 110, 120, 180, and 185 are illustrated in FIG. 1 as separate components of the system 100, two or more of these components may be integrated, thus decreasing the number of components in the system 100. Similarly, the components 110, 120, 180, and 185 may also be separated, thus increasing the number of components within the system 100. The components 110, 120, 180, and 185 may be implemented in any combination of hardware, firmware and software.

In one embodiment, the system 100 helps users more accurately and efficiently design chip layouts. The system 100 automatically finds potential placements of resources which fulfill the requirements of the associated user module.

The system 100 can iterate through multiple potential placement possibilities for resources, thus giving the user of the system 100 multiple choices for resource placement.

Further, the system 100 also graphically displays relationships between the user module and the potential placement locations for the resources. The system 100 can also graphically display locations that are currently occupied by another user module but otherwise could have been a potential placement location.

In one embodiment, the system 100 is configured to support microcontroller design. In another embodiment, the system 100 is configured to support programmable system on a chip design. In yet another embodiment, the system 100 supports general chip design.

The input interface 165 provides a means for the system 100 to receive user input which may include selection of various user module and resources and command sequences. The input interface 165 may be a USB port, a serial port, Ethernet port, or any other interface port configured to transmit electronic data to the system 100.

The video processor 160 provides graphical output from the system 100. The video processor 160 is configured to display color coded user modules and corresponding resources.

The user module description database 110 contains descriptions of the required hardware resources needed by a particular user module. This information may be stored using XML data. In addition to a list of hardware resources that are needed, the user module description database 110 also stores the specific configuration requirements of the needed hardware resources. Some of the description of the required hardware resources contains detailed configuration parameters such as pin restrictions, resource dependencies, speed requirements, and the like. For example, due to communication requirements between hardware resources, these hardware resources may need to be located in close proximity to each other. Another example, due to performance requirements, certain hardware resources may need to be located in close proximity to each other.

In one embodiment, the user module description database 110 contains descriptions of hardware resources within a user module. The user module description database 110 can include the hardware resource requirements of many different user modules. In this embodiment, the user module description database 110 would be applicable across a plurality of underlying chips. The contents of the user module description database 110 can be updated based on changes to the resource requirements of the user module or the introduction of new user modules not currently contained within the user module description database 110. In one embodiment, the user module description database 110 is updated from an outside source. The updated data can be routed through the input interface 130. In one embodiment, the information within the user module description database 110 can also be stored within the volatile memory 150 and/or the non-volatile memory 170.

In one embodiment, the user module description database 110 is implemented in XML. In another embodiment, the user module description database 110 is implemented in any other mark-up language.

The hardware description database 185 contains descriptions of hardware resources within the underlying chip. These descriptions includes various attributes of the hardware resources such as the functionality of the resources, the interconnectivity between these resources, the operating parameters of the resources, the pin layouts of the resources, and the like.

In one embodiment, the hardware description database 185 contains descriptions of hardware resources for multiple underlying chips. In this embodiment, the hardware description database 185 would be applicable across a plurality of underlying chips. The contents of the hardware description database 185 can be updated based on changes to the resources within the underlying chip or the introduction of new chips not currently contained within the hardware description database 185. In one embodiment, the hardware description database 185 is updated from an outside source. The updated data can be routed through the input interface 130. In one embodiment, the information within the hardware description database 185 can also be stored within the volatile memory 150 and/or the non-volatile memory 170.

In one embodiment, each instance of a change in utilized resources within the underlying chip triggers an update within the hardware description database 185. For example, when a hardware resource changes from being utilized to being available because the associated placed user module become "unplaced", then the hardware description database 185 is updated with the newly available hardware resources. Likewise, when a hardware resource changes from being available to being utilized because the associated user module is "placed", then the hardware description database 185 is updated with the newly unavailable hardware resources.

In one embodiment, the hardware description database 185 is implemented in XML. In another embodiment, the hardware description database 185 is implemented in any general database format which is compatible with the database engine used.

The resource placement locator 120 locates available hardware resources on an underlying chip that would be suitable for realizing an unplaced module. The module, or user module is a circuit design. In one embodiment, the resource placement locator 120 is configured to accept the hardware resource requirements for the unplaced module from the user module description database 110 and to search for a resource from the available resources that would satisfy these requirements from the hardware description database 185. The resource placement locator 120 can utilize the information describing the hardware resource requirements of a user module and find a suitable match based on that information. Hardware resources on the underlying chip which are incompatible with the user module are automatically disregarded and pruned out from the selection of suitable resources.

In one embodiment, the hardware resources that are currently utilized by another user module which would otherwise be suitable for a current user module are grayed out indicating that placement of these resources would only be valid if the resources were vacant, in another embodiment, occupied hardware resources would not be highlighted and would be disregarded and pruned.

In another embodiment, the resource placement locator 120 sequentially searches for possible resource configurations from the available resources. For example, the resource placement locator 120 can be configured to find a first set of resources which fulfill the requirements for the unplaced module. Next, the resource placement locator 120 can be configured to sequentially find a second set of resources that are different from the first set of resources which also fulfill the requirements for the unplaced module.

The color coordinator 180 graphically matches the module and the associated corresponding resources. In one embodiment, the color coordinator 180 color codes the module and the associated corresponding resources. In one embodiment, the color coordinator 180 is configured to select a unique color to display both an unplaced module and a possible set of available resources corresponding to the requirements of the unplaced module. In another embodiment, the color coordinator 180 is configured to select a unique color to display an unplaced module and another unique color to display a fixed resource and another unique color to display a next placement resource.

In one embodiment, matching colors can be utilized. In another embodiment, matching grayscales also can be utilized. In yet another embodiment, matching patterns can also be utilized.

Figure 2A:
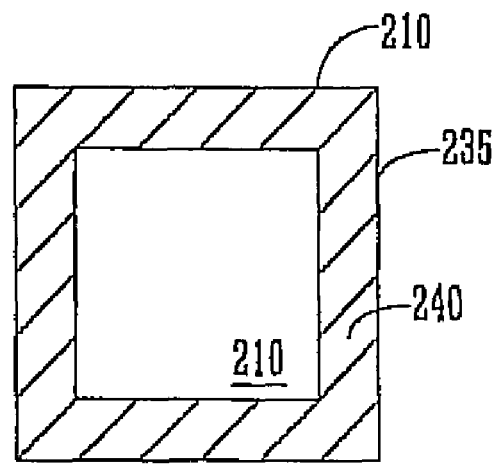
FIGS. 2A, 2B, and 2C illustrate various embodiments for color coding modules and associated resources in accordance with the invention.
Figure 2A:
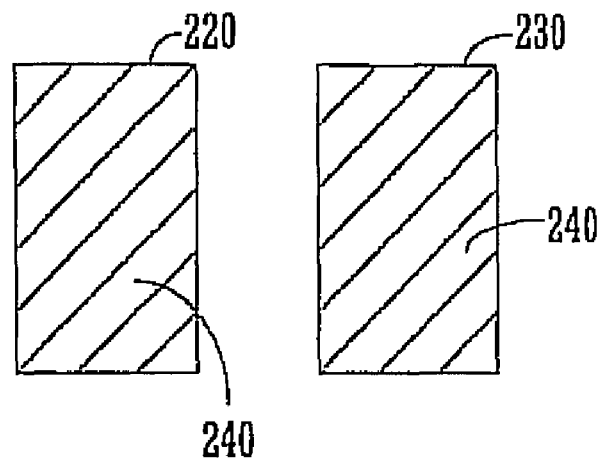
Figure 2B:
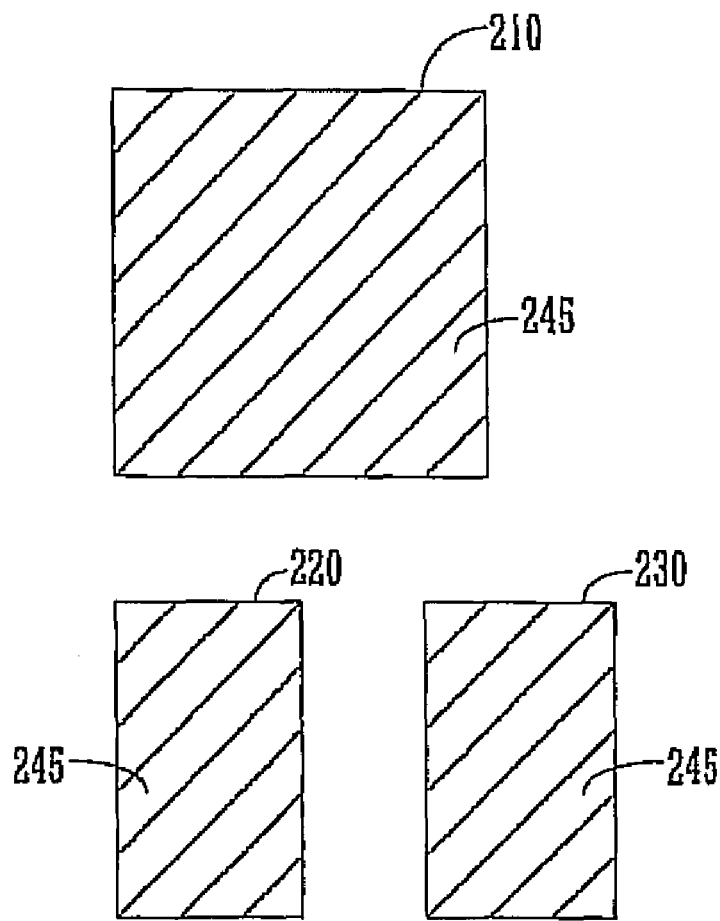
Figure 2C:
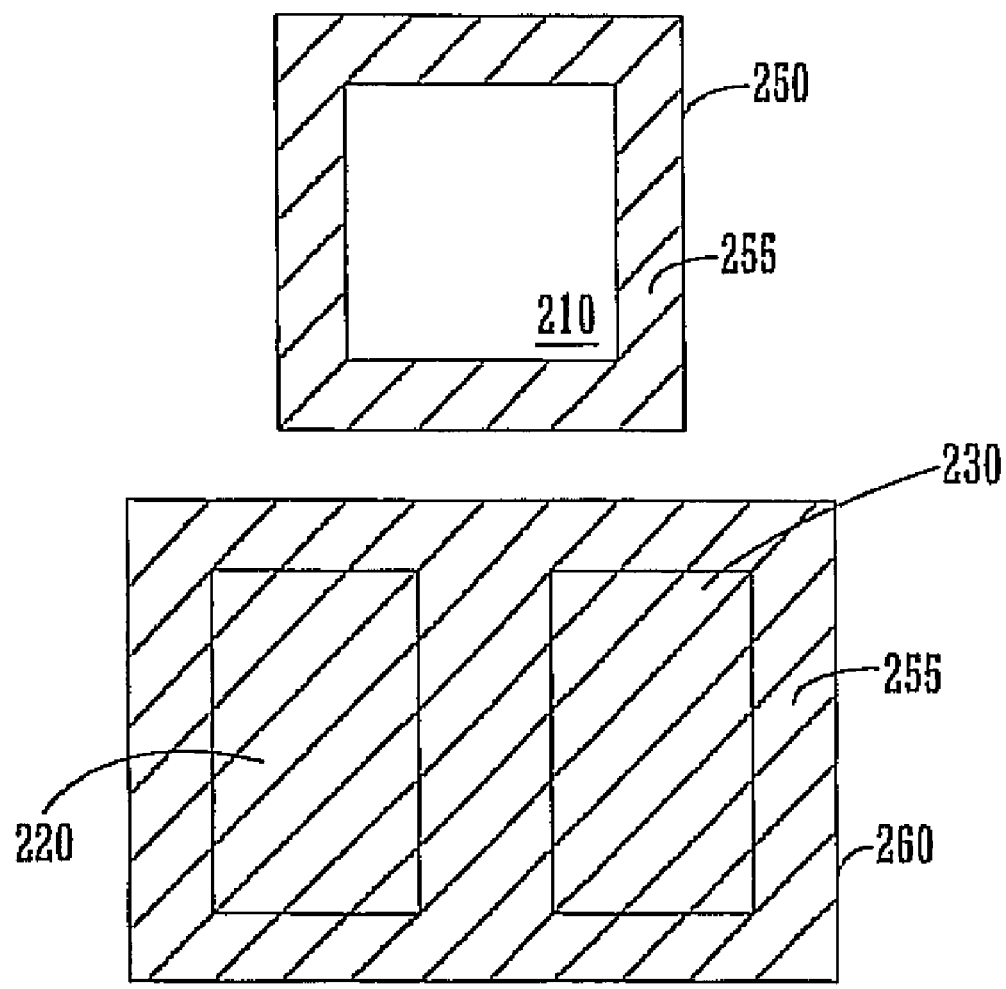

FIGS. 2A, 2B, and 2C each illustrate one embodiment of the color coordinator 180 displaying a unique color that corresponds with a module and resources which correspond with the module. For the sake of clarity, common element numbers are utilized to represent similar items to avoid unnecessary confusion. For example, a module 210 and the corresponding resources 220 and 230 are utilized in FIGS. 2A, 2B, and 2C to merely illustrate the different embodiments of color coding the module 210 with the corresponding resources 220 and 230. Additional modules and resources can be displayed simultaneously.

In FIG. 2A, a ring 235 appears around an icon representation of the module 210. In one embodiment, the ring 235 is displayed filled in with a cross-hatched pattern 240 to represent a unique color. However, in other embodiments, different shading techniques may be utilized. The resources 220 and 230 are also filled in with the cross-hatched pattern 240. The same cross-hatched pattern 240 within the ring 235 and within the corresponding resources 220 and 230 visually indicate that the module 210 corresponds to the resources 220 and 230.

In FIG. 2B, the module icon 210 is displayed filled in with a cross-hatched pattern 245 to represent a unique color. However, in other embodiments, different shading techniques may be utilized. The resources 220 and 230 are also filled in with the cross-hatched pattern 245. The same cross-hatched pattern 245 within the module 210 and within the corresponding resources 220 and 230 visually indicate that the module 210 corresponds to the resources 220 and 230.

In FIG. 2C, a ring 250 appears around the module icon 210. In one embodiment, the ring 250 is displayed filled in with a cross-hatched pattern 255 to represent a unique color. However, in other embodiments, different shading techniques may be utilized. An area 260 is also filled in with the cross-hatched pattern 255. The area 260 includes the resources 220 and 230. The same cross-hatched pattern 255 within the ring 250 and within the area 260 visually indicate that the module 210 corresponds to the resources 220 and 230.

Figure 3:
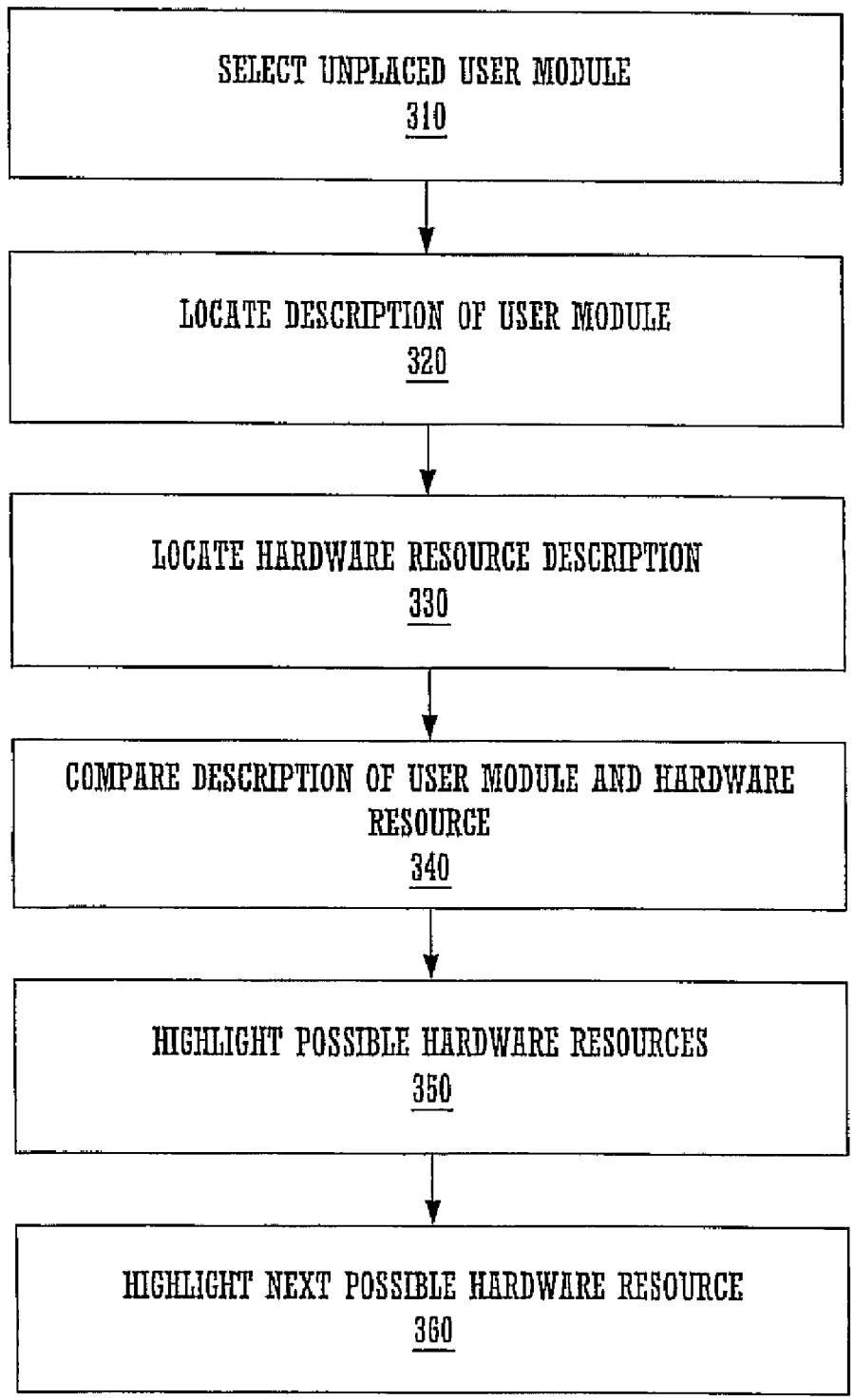
FIG. 3 illustrates a process flow diagram of one embodiment of the invention.

FIG. 3 illustrates a process flow diagram in accordance with one embodiment of the invention. The functional blocks are not to be construed as limiting the number of functional blocks within the process flow diagrams nor to be construed as a requirement for every functional block. The blocks may be performed in a different sequence without departing from the spirit of the invention. Further, blocks may be deleted, added or combined without departing from the spirit of the invention.

FIG. 3 illustrates one embodiment showing the selection of an unplaced module and the viable options of possible resources which meet the requirement of the unplaced module. In Block 310, an unplaced module is selected.

In Block 320, a description of the required hardware resources associated with the selected unplaced module are located. In one embodiment, the function within the Block 320 can be performed by the user module description database 110 (FIG. 1).

In Block 330, a description of the underlying hardware resources within the underlying chip are located. In one embodiment, the function within the Block 330 can be performed by the hardware description database 185 (FIG. 1)

In Block 340, a comparison between the description of the required hardware resources associated with the selected unplaced module and the description of the hardware resources belonging to the underlying chip occur The result of this comparison is a group of possible hardware resources that satisfy the requirements of the selected unplaced module. In one embodiment, the function within the Block 340 can be performed by the resource placement locator 120 (FIG. 1).

For instance, if a user module requires a special port, then any hardware resource block not having the port is automatically pruned out of the list by performing the database comparison function of Step 340. Furthermore, if a user module requires multiple hardware resources that need to be adjacent, then any set of hardware resources not meeting this requirement will be automatically pruned out of consideration. In one embodiment, occupied hardware resources are also pruned out. In another embodiment, they are left in to give the user maximum potential placement information. The pruning process is data driven according to the XML databases which are compared to determine the list of possible placement options.

By automatically selecting the possible placements, and automatically pruning the disallowed placements, the user need only click the next placement icon to view the potential placements available to select the optimal placement location for a user module.

In Block 350, the hardware resources of the underlying chip which satisfy the requirements of the selected unplaced module are highlighted. In one embodiment, the hardware resources that are currently utilized by another user module which would otherwise be suitable for a current user module are grayed out indicating that placement of these resources would only be valid if the resources were vacant, in Block 360, the next set of hardware resources of the underlying chip which satisfy the requirements of the selected unplaced module are highlighted.

Figure 4:
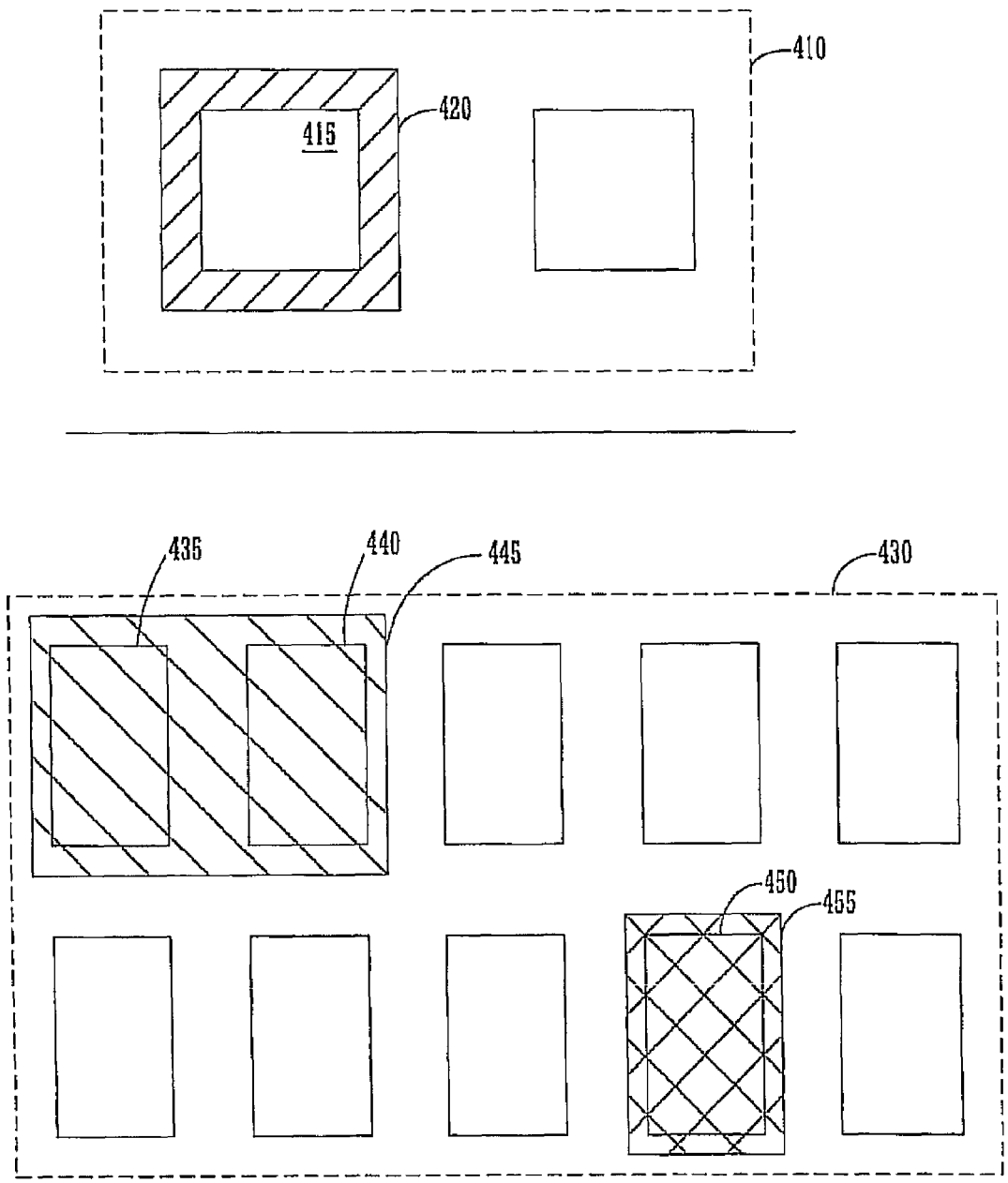
FIG. 4 illustrates a display screen from one embodiment of the invention.

FIG. 4 illustrates one embodiment of a display screen showing a group of modules and a group of resources. For example, a module grouping 410 and a resource grouping 430 are utilized in FIG. 4 to merely illustrate a graphical representation of the general layout of the plurality of modules and resources. Additional modules and resources can be displayed simultaneously.

In one embodiment, FIG. 4 illustrates a highlighted module 415 within the module grouping 410. The highlighted module 415 is shown with a ring 420 surrounding the module 415. The ring 420 is shown with a first cross-hatched pattern. The highlighted module 415 graphically illustrates that this particular module is selected from the module grouping 410.

Resources 435, 440, and 450 are shown highlighted and correspond to the module 415. The resources 435, 440, and 450 are shown within the resource grouping 430. The resources 435 and 440 are also shown highlighted with a second cross-hatched pattern 445. The resource 450 is shown highlighted with a third cross-hatched pattern 455.

In one embodiment, the resources 435 and 440 are decoupled from the resource 450 as illustrated by the second cross-hatched pattern 445 and the third cross-hatched pattern 455, respectively. In one embodiment, the resources 435 and 440 are coupled together and placed as a group.

In one embodiment, the second cross-hatched pattern 445 graphically represent the area covered by the unfixed resources, and the third cross-hatched pattern 455 graphically represents the area covered by the fixed resources. Accordingly, in this embodiment, the resources 435 and 440 are initially unfixed, and the resource 450 is initially fixed. However, the resources 435 and 440 can become fixed resources at any time by finalizing placement of the resources 435, 440, and 450 of the module 415 or by selecting the resource 450 as the unfixed resource.

In operation, as a next placement is requested, the resources 435 and 440 are iterated to a next available position for placement. The second cross-hatched pattern 445 follows the resources 435 and 440 to their next location. If a next placement is requested again, the resources 435 and 440 would be iterated again to the next available position as long as the resources 435 and 440 are unfixed. At any time during this process, the resources 435 and 440 can have their placements finalized by either finalizing placement for the resources 435, 440, and 450 or by selecting the resource 450 as the unfixed resource.

In another embodiment, there can be more or fewer resources associated with the second and third cross-hatched patterns 445 and 455. There can also be more than one group of fixed resources. The second and third cross-hatched patterns 445 and 455 and their associated resources are shown for exemplary purposes.

Next Placement Iterator Example

Figure 5A:
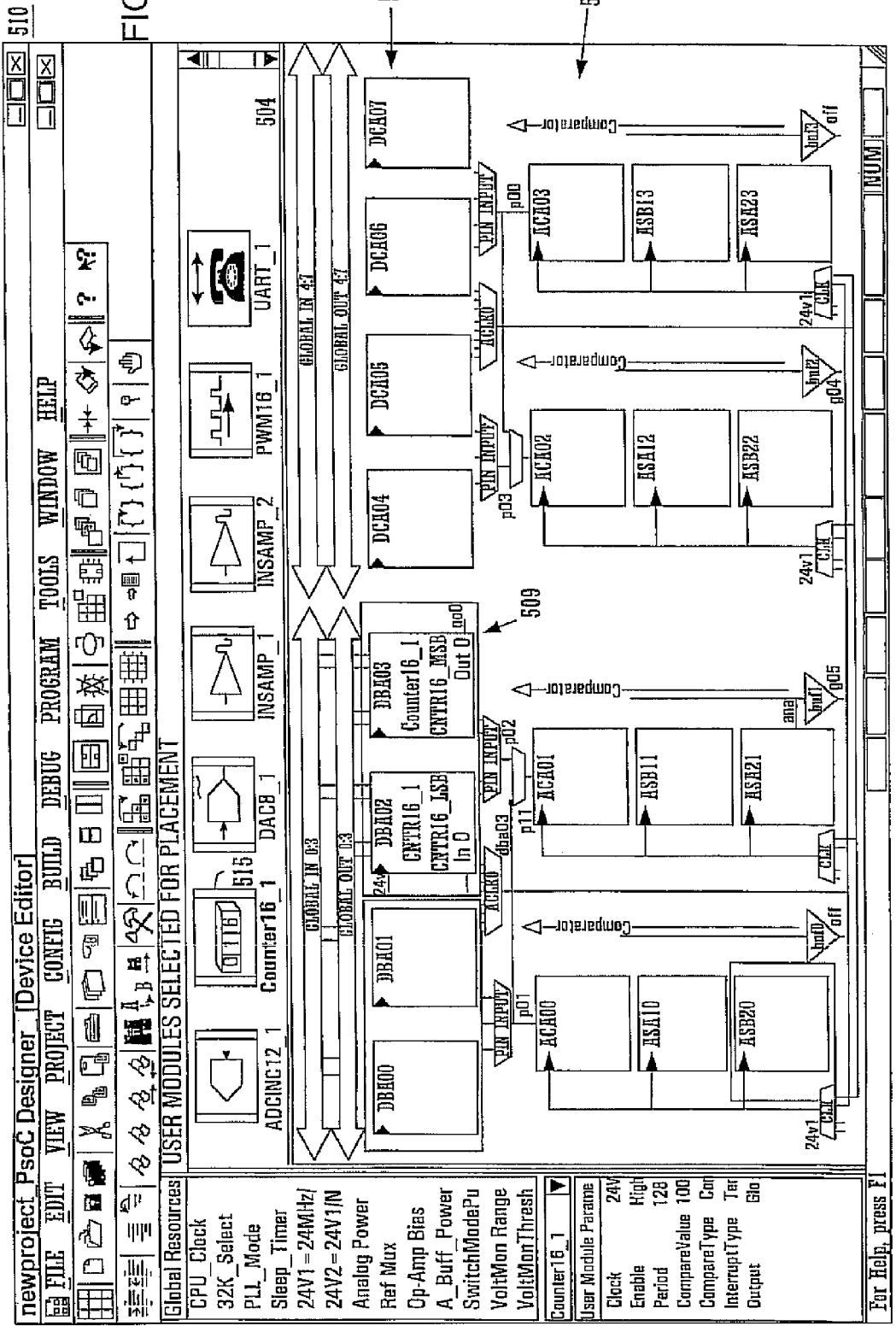
FIG. 5A illustrates an exemplary screen diagram of a next placement iteration procedure of an embodiment of the present invention where one user module is placed.

FIG. 5A illustrates an example computer screen diagram 510 of a next placement iterator process in accordance with one embodiment of the present invention. In accordance with the graphical user interface, the digital resources (here, eight) are shown in an upper horizontal row 505 and the analog resources (here, twelve) are shown in a lower situated matrix 507. A selection bar 505 comprises user module icons that can be selected. The user module icon 515 ("counter") is currently selected. The allocated resources 509 that are designated to implement user module 515 are also highlighted. In this embodiment, the color ring that surrounds user module icon 515 is color coded to the allocated resources 509. Therefore, this user module 515 is currently placed. The remaining user module icons of the selection bar 504 remain unplaced.

Figure 5B:
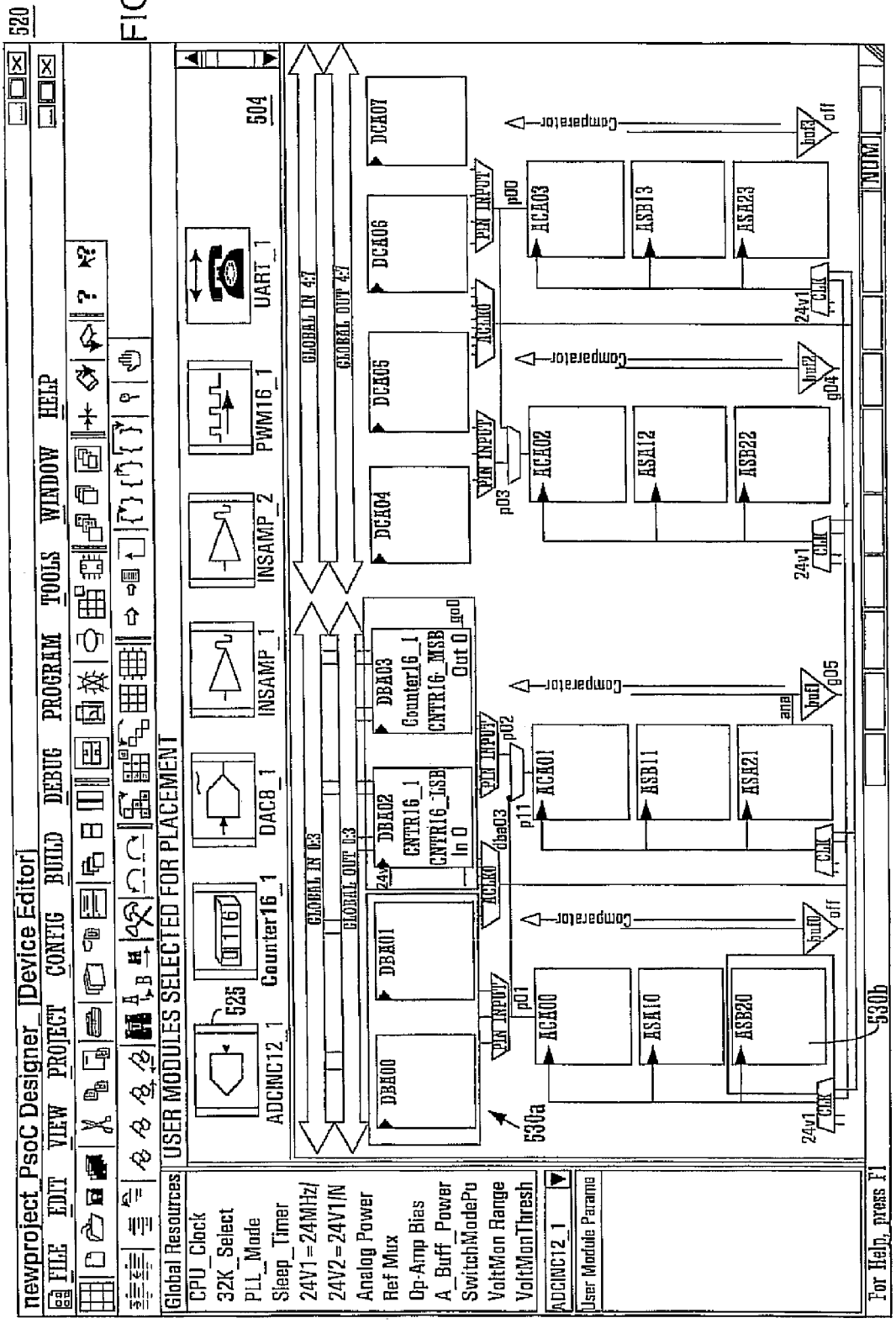
FIG. 5B illustrates an exemplary screen diagram of a next placement iteration procedure of an embodiment of the present invention where a subject user module is selected and showing an initial possible placement designation for the subject user module.

FIG. 5B illustrates an example computer screen diagram 520 of the next placement iterator process in accordance with one embodiment of the present invention where the user selects an unplaced user module icon 525 (the "ADCINC"). Since the module 525 is unplaced, it does not have an associated color ring. Upon selection of the user module icon 525, an initial possible placement for this design is displayed. The initial possible placement includes two digital resources (blocks) 530a and one analog resource 530b. In the embodiment shown, only vacant blocks were selected as the initial placement, however, in another embodiment, the computer could also designate a used block as a potential placement option for user module 525. Of course, a block would have to be made vacant before it could be used for user module 525.

Figure 5C:
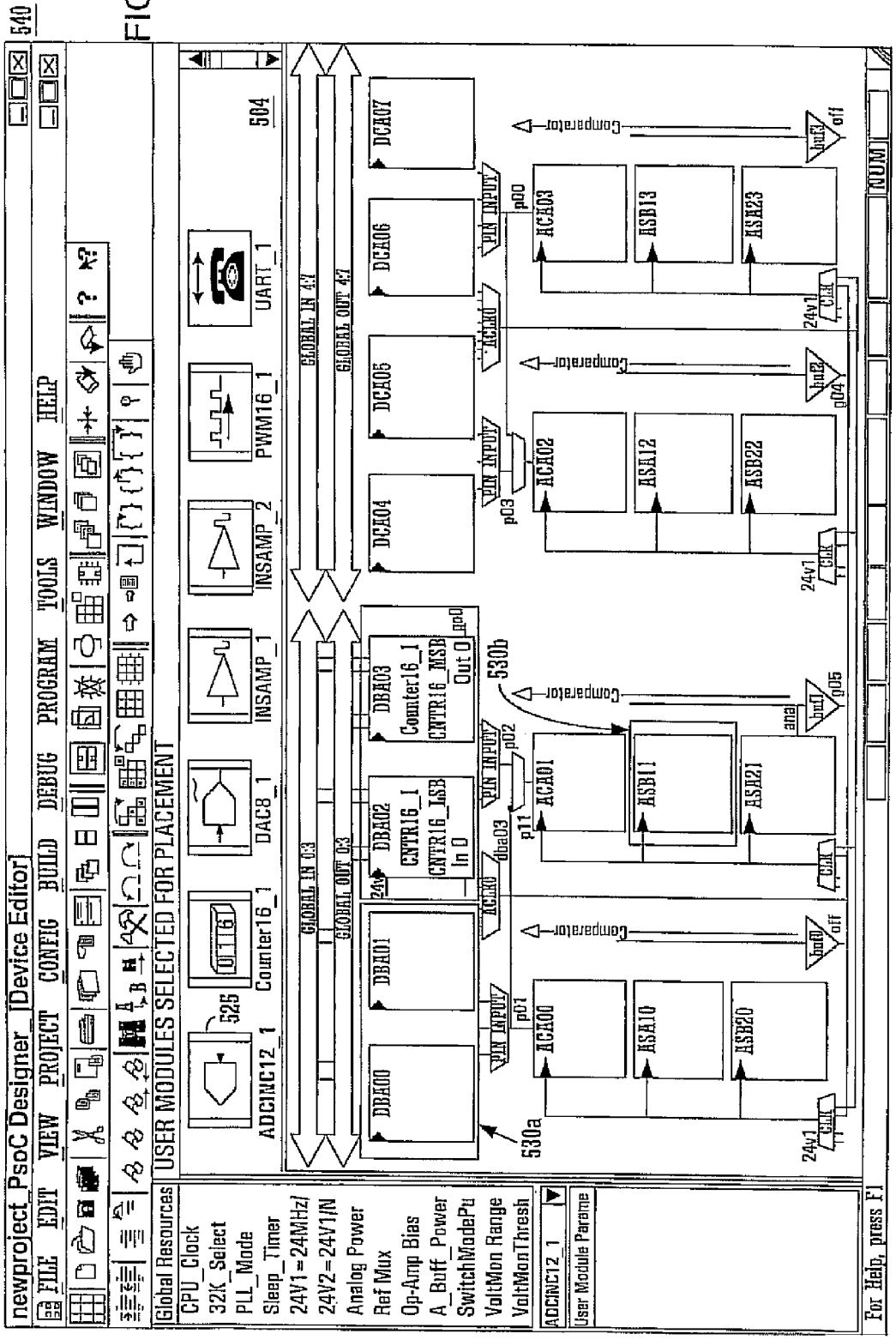
FIG. 5C illustrates an exemplary screen diagram of a next placement iteration procedure of an embodiment of the present invention where a subject user module is selected and the digital portion of the initial placement is maintained while the analog portion is iterated to a next placement (second).

FIG. 5C illustrates an example computer screen diagram 530 of the next placement iterator process in accordance with one embodiment of the present invention where the user invokes a next placement iteration for module icon 525 (the "ADCINC"). In particular, the user uses the cursor control device to select resource 530b. This causes the cross hatching behind the analog resource 530b to change colors from the cross hatching behind the digital resources 520a. Once selected, the user clicks the "next placement" icon 590, this causes the analog resource to move from its initial location in FIG. 5B to its new location in FIG. 5C. FIG. 5C therefore illustrates a second possible placement for the selected user module 525. By selecting the analog resource 530b before pressing the next placement icon 590, the user decoupled the placement of the digital versus analog resources. In other words, the digital resources 530a remained fixed from FIG. 5B to FIG. 5C.

Figure 5D:
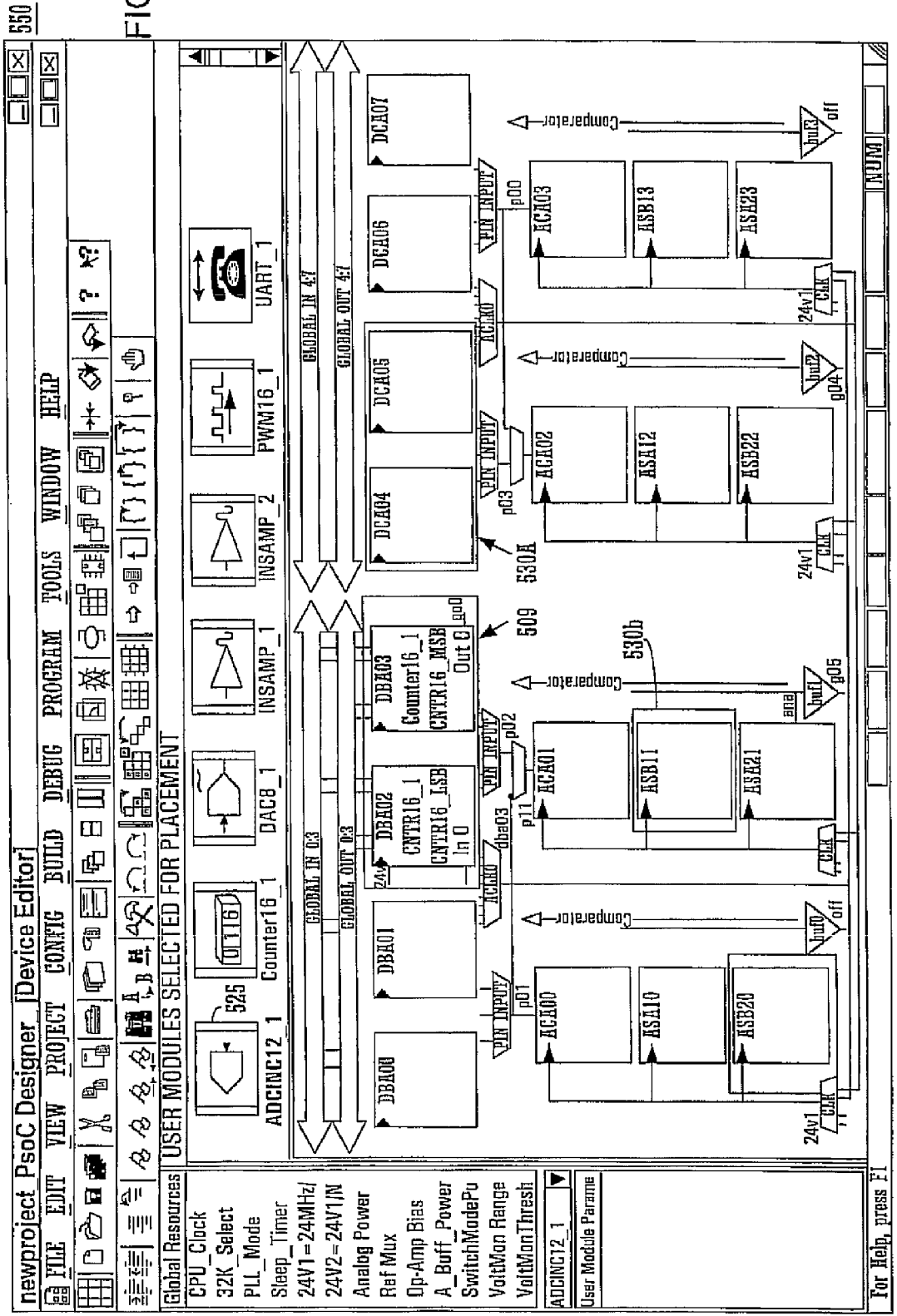
FIG. 5D illustrates an exemplary screen diagram of a next placement iteration procedure of an embodiment of the present invention where a
subject user module is selected and the analog portion of the second placement is maintained while the digital portion is iterated to a next placement (third).

FIG. 5D illustrates an example computer screen diagram 540 of the next placement iterator process in accordance with one embodiment of the present invention where the user invokes a next placement iteration for module icon 525 (the "ADCINC"). In particular, the user uses the cursor control device to select digital resource 530a. This causes the cross hatching behind the digital resources 530a to change colors from the cross hatching behind the analog resource 520b. Once selected, the user clicks the "next placement" icon 590, this causes the digital resource 530a to move from its initial location in FIG. 5B to position 509 (an occupied position). The user clicks the icon 590 again thereby causing the digital resource 530a to appear in its position as shown in FIG. 5D.

FIG. 5D therefore illustrates a third possible placement for the selected user module 525. By selecting the digital resource 530a before pressing the next placement icon 590, the user decoupled the placement of the digital versus analog resources. In other words, the analog resource 530b remained fixed from FIG. 5C to FIG. 5D.

Figure 5E:
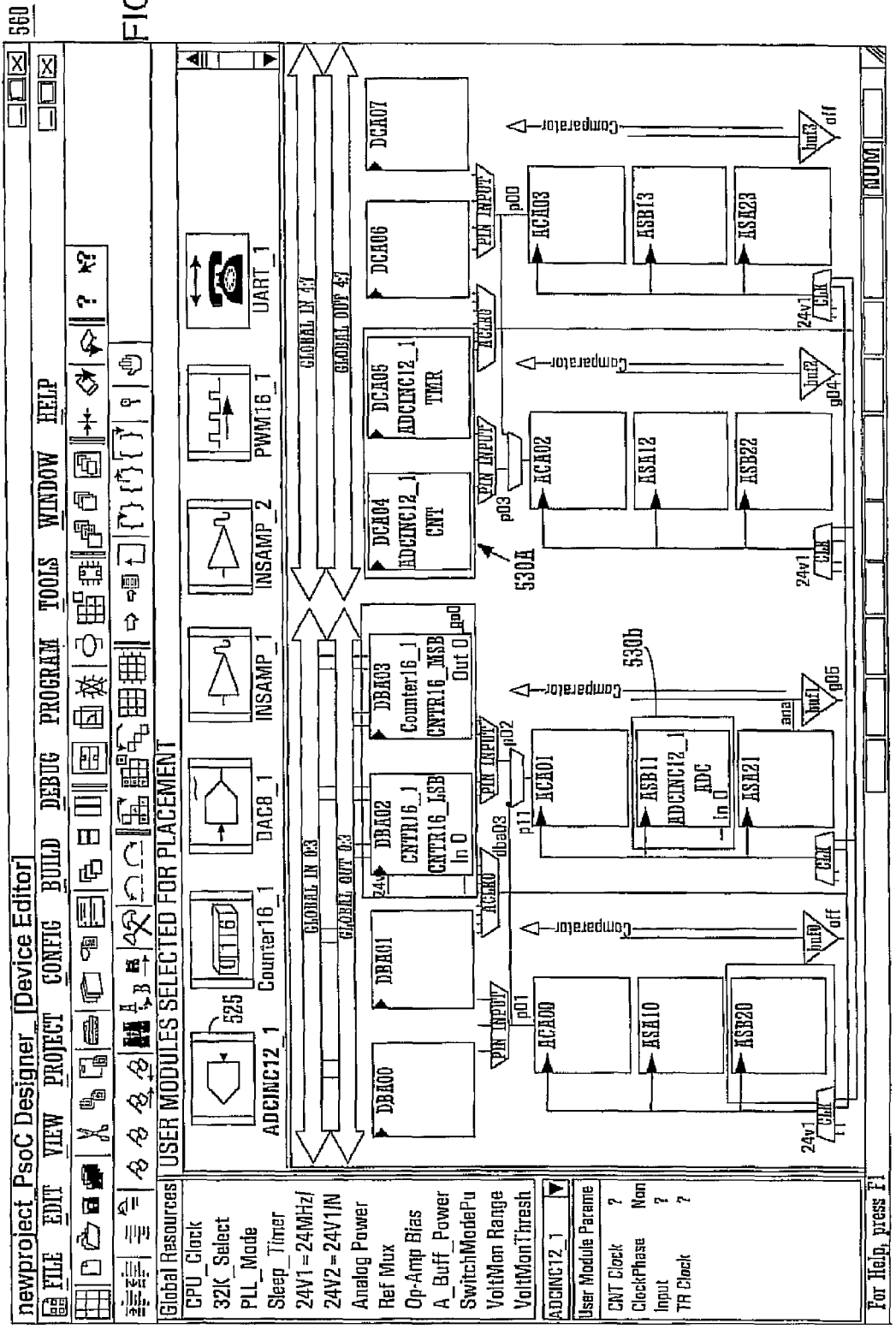
FIG. 5E illustrates an exemplary screen diagram of a next placement iteration procedure of an embodiment of the present invention where a subject user module is placed using the third placement of FIG. 5D.

FIG. 5E illustrates an example computer screen diagram 560 of the next placement iterator process in accordance with one embodiment of the present invention where the user then places the user module 525. In accordance with the graphical user interface, the user then selects the "place user module" icon~ and the user module 525 becomes placed using the last possible placement. In accordance with placing, a color ring appears around the module icon 525. Further, the hardware resources 530 appear in a matching color and they now have labels ("ADCINC . . . ") that correspond to the placed icon 525.

By decoupling the digital from the analog resources during the next placement iteration process, the present invention reduces the number of possible placements that have to be cycled through by the user before the desired placement is found.

The foregoing descriptions of specific embodiments of the invention have been presented for purposes of illustration and description. They are not intended to be exhaustive or to limit the invention to the precise embodiments disclosed, and naturally many modifications and variations are possible in light of the above teaching. The embodiments were chosen and described in order to explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for designing an integrated circuit, the method comprising:
    displaying a graphical representation of a plurality of available user modules by an electronic device;
    identifying a selection of an unplaced user module of the plurality of available user modules by the electronic device;
    automatically determining one or more groups of resources of a programmable integrated circuit that are compatible with implementation of said unplaced user module on said one or more groups of resources of said programmable integrated circuit according one or more hardware resource requirements of said unplaced user module; and
    outputting a visualization of a first group of said one or more groups of resources of said programmable integrated circuit in combination with a visual depiction of all hardware resources available within said programmable integrated circuit compatible with hardware resource requirements of said unplaced user module.

2. The method as described in claim 1, wherein the one or more groups of resources of said programmable integrated circuit comprises two groups, the method further comprising:
    outputting a visualization of a second group of said two groups of resources of said programmable integrated circuit compatible with hardware resource requirements of said unplaced user module.

3. The method as described in claim 1, wherein the one or more groups of resources of said programmable integrated circuit comprises two groups, the method further comprising:

outputting a visualization of a second group of resources of said programmable integrated circuit compatible with hardware resource requirements of said unplaced user module which are currently used by a placed user module.

4. The method as described in claim 1 wherein said outputting a visualization of said first group of resources of a programmable integrated circuit compatible with hardware resource requirements of said unplaced module compromises highlighting a graphical depiction of said first group and highlighting a graphical depiction of said unplaced user module.

5. The method as described in claim 1 wherein said hardware resource requirements of said unplaced module comprise analog hardware resources.

6. The method as described in claim 5 wherein said hardware resource requirements of said unplaced module further comprise digital hardware resources.

7. An apparatus comprising:
a user module description module for storing one or more resource requirements associated with a plurality of user modules, wherein each user module describes an integrated circuit design, wherein the plurality of user modules are graphically displayed;
a programmable integrated circuit module for storing one or more resources associated with one or more programmable integrated circuits; and
a resource placement module for automatically determining resources of a programmable integrated circuit compatible with implementation of an unplaced user module on said resources of said programmable integrated circuit according to one or more resource requirements associated with said unplaced user module.

8. The system as described in claim 7 further comprising:
a graphical user interface module for displaying a first set of resources of a programmable integrated circuit compatible with resource requirements of an unplaced user module as described by said resource placement module.

9. The system as described in claim 8 wherein said graphical user interface module displays a first icon operable to invoke said graphical user interface to display of second set of resources of said programmable integrated circuit compatible with the one or more resources associated with an unplaced user module.

10. The system as described in claim 8 wherein said graphical user interface module is operable to display a second icon for placing said user module utilizing the last displayed set of programmable hardware resources compatible with resource requirements of said unplaced user module.

11. The system as described in claim 8 wherein said graphical user interface module is operable to facilitate fixing allocation of one or more resources of a programmable integrated circuit compatible with the one or more resource requirements associated with said user module prior to display of another set of resources of said programmable integrated circuit compatible with the one or more resources associated with an unplaced user module.

12. The system as described in claim 8 wherein said graphical interface module graphically depicts said one or more programmable resources compatible with requirements of said unplaced user module that are occupied by a placed user module.

13. The system as described in claim 8 wherein said graphical interface module facilitates final placement of one programmable hardware resource compatible with a resource requirement of said unplaced user module.

14. The system as described in claim 8 wherein said graphical interface module facilitates decoupling of a possible placement of analog resources from a possible placement of digital resources compatible with resource requirements of said unplaced user module.

15. The system as described in claim 7 wherein said resource placement module determines programmable hardware resources compatible with resource requirements of said unplaced user module based on proximity of said programmable hardware resources to a port of said programmable integrated circuit.

16. The system as described in claim 7 wherein said resource placement module determines one or more programmable resources compatible with requirements of said unplaced user module that are occupied by a placed user module.

17. A computer readable non-transitory storage media comprising instructions therein that when executed by a processor implement a method of depicting resources of a programmable integrated circuit comprising:
displaying a graphical representation of a plurality of available user modules;
selecting an unplaced user module of the plurality of available user modules:
accessing a resource requirement of the selected unplaced user module;
automatically determining a resource of said programmable integrated circuit compatible with implementation of said unplaced user module on said resource of said programmable integrated circuit according to said resource requirement of said unplaced user module; and
displaying said resource of said programmable integrated circuit compatible with said resource requirement of said unplaced user module.

18. The computer readable media as recited in claim 17 wherein said method further comprises:
displaying another resource of said programmable integrated circuit compatible with said resource requirement of said unplaced user module.

19. The computer readable media as recited in claim 17 wherein said method further comprises:
displaying another resource of said programmable integrated circuit compatible with said resource requirement of said unplaced user module which is occupied by a placed user module.

20. The computer readable media as recited in claim 17 wherein said method further comprises:
receiving a selection of a resource of said programmable integrated circuit to be fixed for determining a next placement of a programmable resource compatible with requirements of said unplaced user module.

* * * * *